United States Patent
Martin et al.

(10) Patent No.: US 9,716,203 B2
(45) Date of Patent: Jul. 25, 2017

(54) METAL NANOPARTICLES GROWN ON AN INNER SURFACE OF OPEN VOLUME DEFECTS WITHIN A SUBSTRATE

(71) Applicant: THE TEXAS A&M UNIVERSITY SYSTEM, College Station, TX (US)

(72) Inventors: Michael S. Martin, College Station, TX (US); Lin Shao, College Station, TX (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 212 days.

(21) Appl. No.: 14/484,327

(22) Filed: Sep. 12, 2014

(65) Prior Publication Data

US 2015/0069611 A1   Mar. 12, 2015

Related U.S. Application Data

(60) Provisional application No. 61/877,095, filed on Sep. 12, 2013.

(51) Int. Cl.
    *C30B 29/60*  (2006.01)
    *H01L 31/18*  (2006.01)
    *C30B 23/04*  (2006.01)

(52) U.S. Cl.
    CPC .......... *H01L 31/1804* (2013.01); *C30B 23/04* (2013.01); *C30B 29/60* (2013.01); *Y02E 10/547* (2013.01)

(58) Field of Classification Search
    CPC .......... C30B 23/04; C30B 29/02; C30B 29/60
    See application file for complete search history.

(56) References Cited

U.S. PATENT DOCUMENTS

| | | | |
|---|---|---|---|
| 2005/0082598 A1* | 4/2005 | Liao | ........................ B82Y 10/00 257/316 |
| 2006/0086986 A1* | 4/2006 | Liao | ........................ B82Y 10/00 257/367 |

OTHER PUBLICATIONS

Alatalo, et al. "First-principles study of He in Si" Physical Review B, 46:806-809, Nov. 15, 1992.
Allen, William R. "Lattice Site of Helium implanted in Si and Diamond" MRS Proceedings, 279:433-438, 1992.
Atwater, et al. "Plasmonics for improved photovoltaic devices" Nature Materials, 9(3):205-213, published online Feb. 19, 2010.
Beck, et al. "Plasmonic light-trapping for Si solar cells using self-assembled, Ag nanoparticles" Progress in Photovoltaics: Research and Applications, 18(7):500-504, Published Online Jul. 15, 2010.

(Continued)

*Primary Examiner* — Robert M Kunemund
(74) *Attorney, Agent, or Firm* — Edwin S. Flores; Daniel J. Chalker; Chalker Flores, LLP

(57) ABSTRACT

The present invention provides a method for forming metal nanoparticle(s) onto an inner surface of one or more open volume defects within a substrate by providing the substrate containing the one or more open volume defects, depositing an immiscible metal on a surface of the substrate, and forming the metal nanoparticle(s) by diffusing the immiscible metal from the surface onto the inner surface of each open volume defect using a heat treatment. The method can be used to produce a substrate having at least one open volume defect with a metal nanoparticle formed onto an inner surface of the open volume defect, a solar cell, an optical switch, a radiation detector, or other similar device.

31 Claims, 28 Drawing Sheets

(56) References Cited

OTHER PUBLICATIONS

Brongersma, et al. "The Case for Plasmonics" Science, 328(5977):440-441, Apr. 23, 2010.
Buehler. "50 Years Progress in Crystal Growth: A Reprint Collection, chapter The first Czochralski silicon" pp. 105-106. Elsevier, Amsterdam, The Netherlands, 2004.
Chen, et al. "Geometrical Factors in Enhanced Photoyield from Small Metal Particles" Phys. Rev. Lett., 57:2737-2740, Nov. 24, 1986.
Chen, et al. "Silver diffusion and defect formation in Si (111) substrate at elevated temperature" Mater. Chem. Phys., 76:224-227, Sep. 2002.
Corni, et al. "Helium-implanted silicon: A study of bubble precursors" Journal of Applied Physics, 85(3):1401, Feb. 1, 1999.
Deweerd, et al. "Mössbauer study of the proximity gettering of cobalt atoms to He-induced nanosized voids in c-Si" Physical review. B, Condensed matter, 53(24):16637-16643, Jun. 15, 1996.
Deweerd, et al. "Trapping of ion-implanted 57Co to cavities in c-Si : a qualitative study" Nuclear Instruments and Methods in Physics Research Section B: Beam Interactions with Materials and Atoms, 127/128:307-310, 1997.
Donnelly, et al. "The effects of radiation damage and impurities on void dynamics in silicon" Nuclear Instruments and Methods in Physics Research Section B: Beam Interactions with Materials and Atoms, 177:132-139, 2001.
Eaglesham, et al. "Quantitative TEM of point defects in Si" Journal of Electron Microscopy, 49(2):293-8, Jan. 2000.
Eaglesham, et al. "Equilibrium Shape of Si" Phys. Rev. Lett., 70(11):1643-1647, Mar. 15, 1993.
Estreicher, et al. "Noble gas-related defects in Si and the origin of the 1018 meV photoluminescence line" Physical Review B, 55(8):5037-5044, Feb. 15, 1997.
Evans, et al. "The Annealing of Helium-induced Cavities in Silicon and the Inhibiting Role of Oxygen" Nuclear Instruments and Methods in Physics Research Section B: Beam Interactions with Materials and Atoms, 28:360-363, 1987.
Faraci, et al. "Photoemission from small particles of ag and au" Phys. Rev. B, 37:10542-10546, Jun. 15, 1988.
Faraci, et al. "Mechanism of photoelectron yield enhancement from ag clusters" Phys. Rev. B, 40:4209-4211, Aug. 15, 1989.
Fedina, et al. "In situ HREM irradiation study of point-defect clustering in MBE-grown strained Si1-x Gex/(001)Si structures" Phys. Rev. B, 61(15):10336-10345, Apr. 15, 2000.
Fichtner, et al. "Overpressurized bubbles versus voids formed in helium implanted and annealed silicon" Applied Physics Lett., 70:732-734, Feb. 10, 1997.
Follstaedt. "Relative free energies of Si surfaces" Applied Physics Lett., 62(10):1116-1118, Mar. 8, 1993.
Fowler, R.H. "The Analysis of Photoelectric Sensitivity Curves for Clean Metals at Various Temperatures" Phys. Rev., 38:45-56, Jul. 1, 1931.
Gaiduk, et al. "Nanovoids in MBE-grown SiGe alloys implanted in situ with Ge+ ions" Phys. Rev. B, 67(23):235310, Jun. 2003.
Gibbons. "Ion Implantation in Semiconductors Part II: Damage Production and Annealing" Proceedings of the IEEE, 60(9):1062-1096, Sep. 1972.
Griffioen, et al. "Helium Desorption/Permeation from Bubbles in Silicon: a Novel Method for Void Production" Nuclear Instruments and Methods in Physics Research Section B: Beam Interactions with Materials and Atoms, 27:417-420, Mar. 1987.
Guillat, et al. "Light absorption enhancement in thin silicon film by embedded metallic nanoshells" Optics Lett., 35:1139, Apr. 15, 2010.
Haarahiltunen, et al. "Experimental and theoretical study of heterogeneous iron precipitation in silicon" Journal of Applied Physics, 101(4):043507, 2007.
Holmström, et al. "Threshold defect production in silicon determined by density functional theory molecular dynamics simulations" Phys. Rev. B, 78:045202, Jul. 2008.
Hu, S.M. "Nonequilibrium point defects and diffusion in silicon" Mat. Sci. Engr. Reports, 13:105-192, Jan. 1994.
Kildishev, et al. "Planar Photonics with Metasurfaces" Science, 339(6125), Mar. 15, 2013.
Kinomura, et al. "Microstructural difference between platinum and silver trapped in hydrogen induced cavities in silicon" Applied Physics Lett., 72(21):2713, May 25, 1998.
Kinomura, et al. "Platinum atom location on the internal walls of nanocavities investigated by ion channeling analysis" Nuclear Instruments and Methods in Physics Research Section B: Beam Interactions with Materials and Atoms, 190(1-4):606-610, May 2002.
Kogler, et al. "Cu gettering in ion implanted and annealed silicon in regions before and beyond the mean projected ion range" Journal of Applied Physics, 94(6):3834, Sep. 15, 2003.
Kotai. "Computer methods for analysis and simulation of RBS and ERDA spectra" Nuclear Instruments and Methods in Physics Research Section B: Beam Interactions with Materials and Atoms, 85(1-4):588-596, 1994.
Kurnosikov, et al. "Internal Electron Diffraction from Atomically Ordered Subsurface Nanostructures in Metals" Phys. Rev. Lett., 106:196803, May 13, 2011.
Kuznetsov, et al. "Quantum yield of luminescence of Ag nanoclusters dispersed within transparent bulk glass vs. glass composition and temperature" Applied Physics Lett., 101:251106, Dec. 2012.
Li, et al. "The development of epitaxy of nanoclusters on lattice-mismatched substrates: Ag on H—Si(111) surfaces" Surface Science, 520:7, 2002.
Lindhard, et al. "Range concepts and heavy ion ranges (notes on atomic collisions, ii)" Mat. Fys. Medd. Dan. Vid. Selsk., 33(14), 1963.
Lindquist, et al. "Engineering metallic nanostructures for plasmonics and photonics" Rep. Prog. Phys., 75:036501, published Feb. 13, 2012.
McCaffrey, et al. "Transmitted Color and Interference Fringes for TEM Sample Preparation of Silicon" Micron, 29:139-144, 1998.
Myers, et al. "Transport and reactions of gold in silicon containing cavities" Phys. Rev. B, 57(12):7015, Mar. 15, 1998.
Myers, et al. "Forces between cavities and dislocations and their influence on semiconductor microstructures" Journal of Applied Physics, 86(6):3048-3063, Sep. 15, 1999.
Myers, et al. "Mechanisms of transition-metal gettering in silicon" Journal of Applied Physics, 88(7):3795, Oct. 1, 2000.
Nason, et al. "Study of silver diffusion into Si(111) and SiO2 at moderate temperatures" J. Appl. Phys., 70:1392, Aug. 1, 1991.
Nastasi, et al. "Nucleation and growth of platelets in hydrogen-ion-implanted silicon" Applied Physics Lett., 86 (15):154102, published online Apr. 5, 2005.
Pfann. "50 Years Progress in Crystal Growth: A Reprint Collection, chapter How zone melting was invented" pp. 107-108. Elsevier, Amsterdam, The Netherlands, 2004.
Raineri. "Gettering by Voids in Silicon: A Comparison with other Techniques" Solid State Phenomena, 57-58:43-52, 1997.
Sayed, et al. "Heteroepitaxial Growth of Gold Nanostructures on Silicon by Galvanic Displacement" ACS Nano, 3 (9):2809, published online Aug. 31, 2009.
Schiettekatte, et al. "Influence of curvature on impurity gettering by nanocavities in Si" Applied Physics Lett., 74 (13):1857-1859, Mar. 29, 1999.
Schmidt-Ott, et al. "Enormous Yield of Photoelectrons from Small Particles" Phys. Rev. Lett., 45:1284-1287, Oct. 13, 1980.
Seltzer. "Calculation of Photon Mass Energy-Transfer and Mass Energy-Absorption Coefficients" Radiation Research, 136(2):147-170, Nov. 1993.
Sun, et al. "Ambient-stable tetragonal phase in silver nanostructures" Nat Commun, 3:971, Jul. 24, 2012.
Tonini, et al. "High-dose helium-implanted single-crystal silicon: Annealing behavior" Journal of Applied Physics, 84 (9):4802, Nov. 1, 1998.
Venezia, et al. "Depth profiling of vacancy clusters in MeV-implanted Si using Au labeling" Applied Physics Lett., 73 (20):2980-2982, Nov. 16, 1998.

(56) References Cited

OTHER PUBLICATIONS

West, et al. "Searching for Better Pasmonic Materials" Laser Phot. Rev., 4:795, Mar. 2010.
Williams, et al. "The role of oxygen on the stability of gettering of metals to cavities in silicon" Applied Physics Lett., 75(16):2424, Oct. 18, 1999.
Wong-Leung, et al. "Diffusion and trapping of Au to cavities induced by H-implantation in Si" Nuclear Instruments and Methods in Physics Research Section B: Beam Interactions with Materials and Atoms, 106(1-4):424-428, Dec. 1995.
Wong-Leung, et al. "Gettering of copper to hydrogen-induced cavities in silicon" Applied Physics Lett., 66:1231-1233, Mar. 6, 1995.
Wong-Leung, et al. "Rutherford backscattering and channeling study of Au trapped at cavities in silicon" Nuclear Instruments and Methods in Physics Research Section B: Beam Interactions with Materials and Atoms, 118(95):34-38, 1996.
Wong-Leung, et al. "Diffusion and transient trapping of metals in silicon" Phys. Rev. B, 59:7990-7998, Mar. 15, 1999.
Zhu, et al. "Defect characterization in boron implanted silicon after flash annealing" Nuclear Instruments and Methods in Physics Research Section B: Beam Interactions with Materials and Atoms, 266(10):2479-2482, May 2008.
Zur, et al. "Lattice match: An application to heteroepitaxy" Journal of Applied Physics, 55:378, 1984.

* cited by examiner

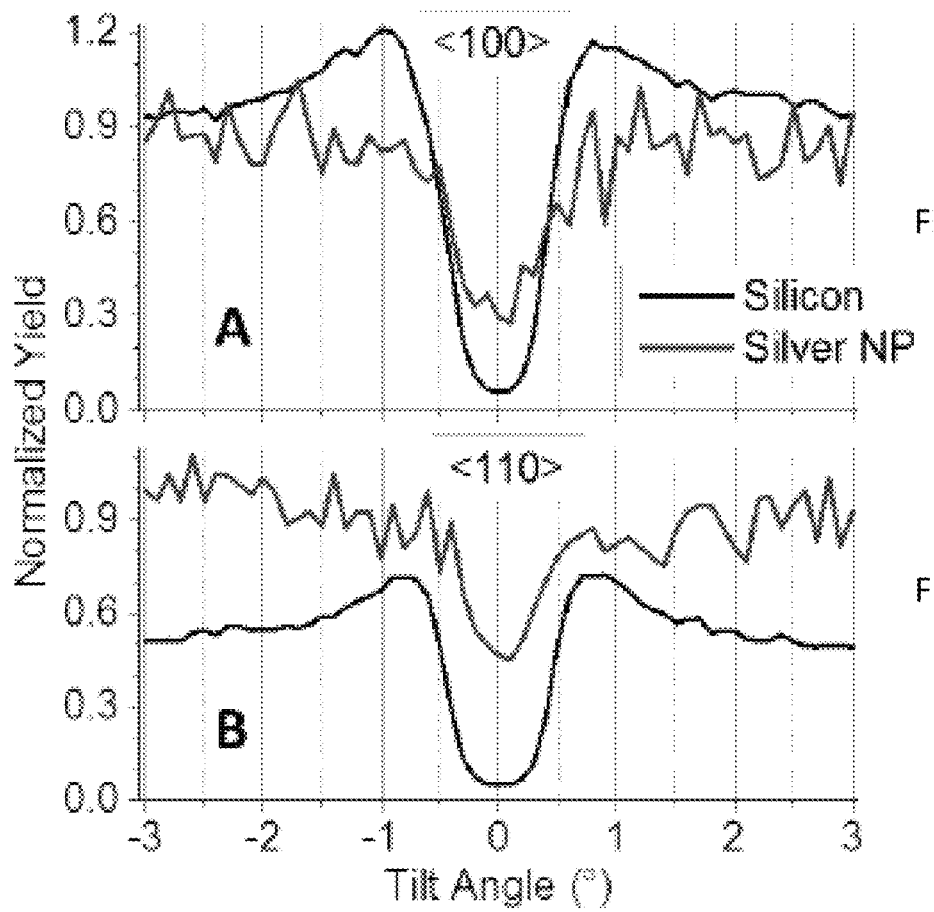
FIG. 53A
FIG. 53B
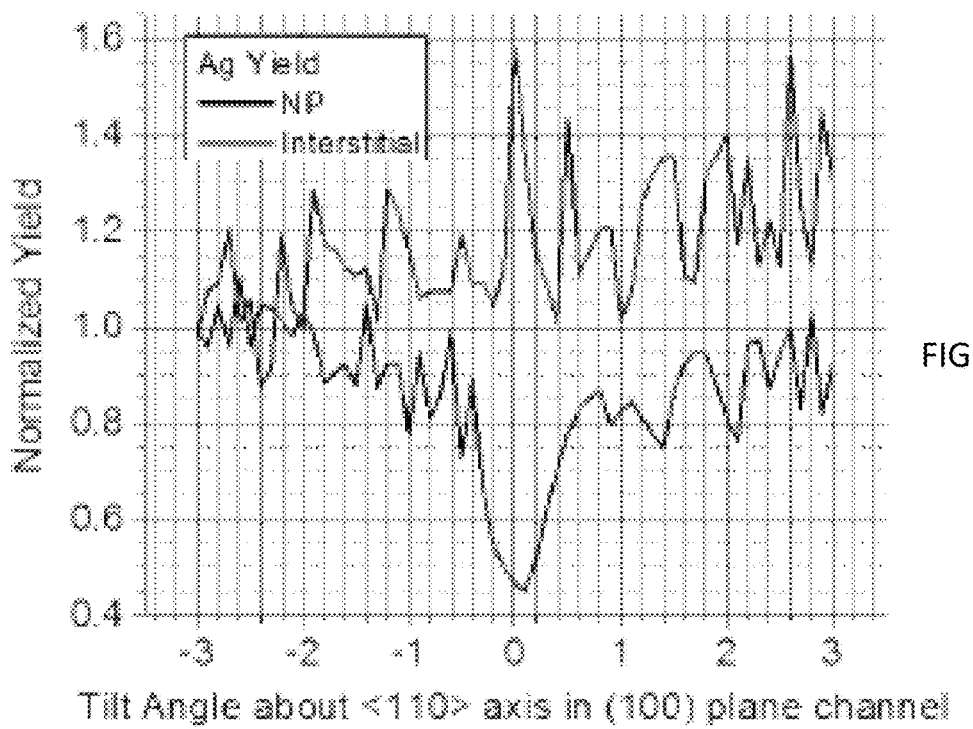
FIG. 54

1

METAL NANOPARTICLES GROWN ON AN INNER SURFACE OF OPEN VOLUME DEFECTS WITHIN A SUBSTRATE

CROSS-REFERENCE TO RELATED APPLICATIONS

This application claims benefit of U.S. Provisional Application Ser. No. 61/877,095 filed Sep. 12, 2013 which is incorporated herein by reference in its entirety.

INCORPORATION-BY-REFERENCE OF MATERIALS FILED ON COMPACT DISC

Not Applicable.

TECHNICAL FIELD OF THE INVENTION

The present invention relates in general to the field of materials science, and more specifically to growing metal nanoparticles on an inner surface of open volume defects (e.g., voids, bubbles, cavities, platelets, etc.) within a substrate.

STATEMENT OF FEDERALLY FUNDED RESEARCH

Not Applicable.

BACKGROUND OF THE INVENTION

Without limiting the scope of the invention, its background is described in connection with implanting metals in silicon substrates. The diversity of nanometallic plasmonics and dielectric nanophotonics for trapping and shaping light is remarkable, but the integration of these discoveries with existing semiconductor processes is in doubt (Lindquist 2012, Brongersma 2010). Metamaterials, rationally designed materials to modify electronic properties, are a possible avenue to unite these divergent technologies (Kildishev 2013). For photovoltaics, the promise of nanoparticles at the surface or in the bulk, or nano-textured metal films on the back of the solar cell material to excite localized surface plasmon resonances (LSPR) which increase solar light trapping efficiency and decrease average dimensions has been shown (Atwater 2010, Pillai 2010).

Voids are utilized to getter wide variety of metal impurities, which agglomerate in sensitive insulating regions of devices and adversely effect performance (Myers 2000). The formation of nanoparticles by direct ion implantation of a metal species, such as Au, and annealing has been investigated in Si which had cavities induced by hydrogen or silicon ion implantation and annealing (Wong-Leung 1995, Venezia 1998). Silver and platinum nanoparticles have been trapped in voids in silicon due to metal ion implantation and diffusion heat treatment (Kinomura 1998). It has been shown that crystalline damage caused by these multiple implantation methods can be eliminated for small amount of implanted metal, Au, Ag or Pt, only sufficient for monolayer coverage of voids (Wong-Leung 1996, Kinomura 2002). Multiple groups have also reported that Au monolayers on the inner surface of voids possess ordered structure (Wong-Leung 1996, Myers 1998). Cylindrical core/shell Ag/Si or Ag/SiO$_2$ structures have been determined theoretically to have increased visible light absorption over pure Si, and voids with monolayer metal coverage may have similar plasmonic properties (Guillat 2010).

The yield of photoemission of small Ag particles, diameter 2 nm, is more than two orders of magnitude greater than that of bulk silver (SSS 1980). The combined effects of increased emission probability from a small particle and decrease in the photoelectric work function because of the small size lead to this large increase in photoelectric quantum yield (Chen and Bates 1986). Silver is the most suitable pure metal for plasmonics in the visible and NIR wavelength range because it has lowest electronic losses (West 2010).

Data on diffusion of Ag in Si is limited to high temperature (Rollert 1987), or only a few data points at temperatures deemed to be technologically important (Nason 1991, Chen 2002). High temperature study suggests that equilibrium concentration of Ag in Si is very low, 60× lower than that of Au, and is dominated by interstitial Ag that diffuses primarily by the dissociative mechanism (Rollert 1987). Substitutional Ag concentration is less than the measurement threshold at high temperature. Low temperature data, below the eutectic point of 830 C, shows that diffusivities obtained from high temperature cannot be extrapolated (Chen 2002, Nason 1991). Point defects in Si mediate Ag diffusion by the kick-out and dissociative mechanisms, involving vacancies and interstitial respectively, to increase the solubility above equilibrium. For monovalent group 11 metals Au and Cu in crystalline Si, chemisorption on the inner surface of a void decreases the Gibbs free energy more than formation of a silicide compound, whereas silicidation is more energetically favorable for multivalent Co and Fe (Petersen 1997).

Coincident site lattice heteroepitaxy of Ag on Si has 4:3 Ag:Si periodicity for (111) and (110) orientations, and 2:3 Ag:Si for (100) orientations. The different heteroepitaxial relationship for (100) is caused by smaller number of atomic planes in Ag fcc unit cell, three, compared to five in Si diamondlike unit cell. Heteroepitaxial Ag films on Si utilizing 4:3 and 2:3 coincident lattice have been observed (LeGoues 1988). Islands of Ag grown on H-terminated Si(111) are heteroepitaxial with Ag(110)//Si(110) strained −0.32% when Ag island diameter exceeds 12 nm, and Ag/Si (110) planes are misoriented up to 9° at smaller diameters (Li 2002).

Although films have been grown on surfaces for research and commercial purposes for a very long time as described above, growth on a created inner surface has not been demonstrated.

SUMMARY OF THE INVENTION

The present invention provides a method for growing a precipitate, crystalline nanoparticle on the inner surface of a open volume defect within a substrate. Embedding metal nanoparticles inside monocrystalline silicon has numerous applications for Si-based photonic lattices, integrated-optic super-chips for high speed computing and radiation detection having high spatial resolution. Directly introducing metal nanoparticles into a crystalline semiconductor matrix, however, cannot be achieved by metal ion implantation due to disordering and impurity-forbidden recrystallization. In one embodiment, silver nanoparticles are grown on the inner surfaces of voids in monocrystalline silicon, with voids introduced by helium ion implantation. The Ag growth is hetero-epitaxial through coincident site lattice, so all Ag nanoparticles are self-aligned within Si matrix.

More specifically, the present invention provides a method for forming metal nanoparticle(s) onto an inner surface of one or more open volume defects within a substrate by providing the substrate containing the one or more open volume defects, depositing an immiscible metal on a surface of the substrate, and forming the metal nanoparticle(s) by diffusing the immiscible metal from the surface onto the inner surface of each open volume defect using a heat treatment.

The method can be used to produce a substrate having at least one open volume defect with a metal nanoparticle formed onto an inner surface of the open volume defect, a solar cell, an optical switch, a radiation detector, or other similar device. For example, the present invention provides an apparatus that includes a substrate containing an open volume defect and having minimal residual crystalline damage, and a metal nanoparticle formed of an immiscible metal onto an inner surface of the open volume defect and the atomic planes of the immiscible metal are substantially parallel to the atomic planes of the substrate.

In addition, the present invention provides a method for forming gold or silver nanoparticle(s) onto an inner surface of one or more open volume defects within a monocrystalline silicon substrate by providing the monocrystalline silicon substrate, implanting high-energy ions into the monocrystalline silicon substrate where the one or more open volume defects are to be created, growing the one or more open volume defects by defect annealing, depositing the gold or silver on the surface of the monocrystalline silicon substrate, and forming the gold or silver nanoparticle(s) by diffusing the gold or silver from the surface onto the inner surface of each open volume defect using a heat treatment. Note that the ion implantation step and the growing step can be performed at the same time. The method can be used to produce a substrate having at least one open volume defect with a metal nanoparticle formed onto an inner surface of the open volume defect, a solar cell, an optical switch, a radiation detector, or other similar device.

BRIEF DESCRIPTION OF THE DRAWINGS

For a more complete understanding of the features and advantages of the present invention, reference is now made to the detailed description of the invention along with the accompanying figures and in which:

FIGS. 53A-53B are graphs of RBS angular scans of pure Si near the surface and from Ag nanoparticles in sample Ag3 with the ion beam aligned with [100] axis (FIG. 53A) and [110] axis (FIG. 53B) and (100) plane; and FIG. 54 is a graph of RBS angular scans of Ag backscattering signal from sample Ag3 scanned across [110] axis in (100) plane from two depth intervals. The interstitials are closer to the surface than nanoparticles.

DETAILED DESCRIPTION OF THE INVENTION

Figure 1:
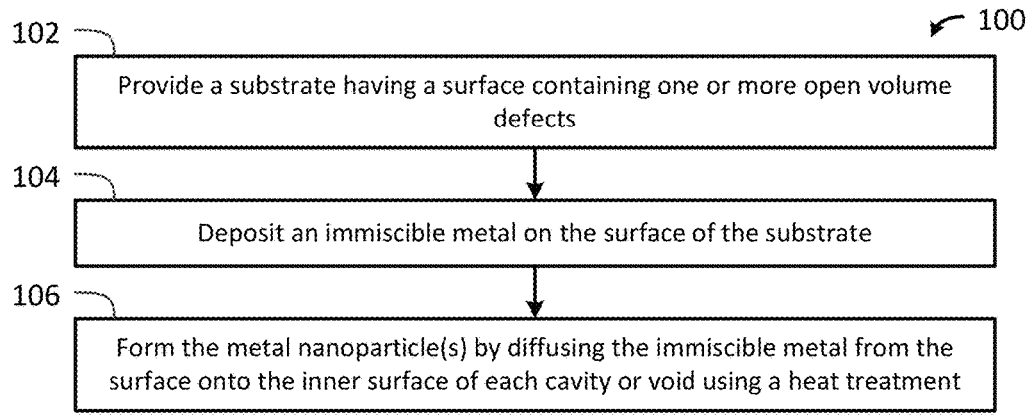
FIG. 1 is a flow chart of a method for forming metal nanoparticle(s) onto an inner surface of one or more open volume defects within a substrate in accordance with one embodiment of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. As used herein, open volume defects, include but are not limited to, voids (empty), bubbles (filled with gas), cavities (voids or bubbles), platelets (flat, sheet-like open volume defects with high aspect ratio), etc. Note that these terms may be used interchangeable without limiting the scope of the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

If nanoparticles can be formed in a monocrystalline defect-free Si substrate, numerous applications can be realized. When metal particles have radii less than the typical diffusion length of photo-excited electrons, electrons will reflect from boundary or emit into the neighboring medium. If the particle size is extremely small, the chance for an electron to hit multiple boundaries will be significantly enhanced, thus the chance for electrons to diffuse into the neighboring medium will be significantly enhanced. Early modeling studies have suggested orders of magnitude higher photoemission of electrons from Ag particle embedded Si. Such structures can be used as solar cells, transistors, or high sensitivity radiation detectors.

Currently, monocrystalline silicon solar cells must be 180-300 um thick. The addition of nanometallic plasmonic features integrated inside silicon with thin (~10 nm) metal films coating the front or back surface could trap sunlight into thickness much smaller (<10 um). Partially filled nanoparticle/void complexes may be much more efficient at confining visible light than fully dense nanoparticles. Another possible application for metal nanoparticles in silicon are as an optical switch, where light is absorbed by the nanoparticle and an electron is emitted into the silicon, switching a p-type substrate to n-type. This could create a field-effect transistor that is gated by light instead of electrical current, possibly reducing the size and thermal load and increasing the speed of current computing cores. Different from traditional transistors, switching could be controlled by photons transported through optical fibers. Another application is as a radiation detector of X- and gamma-rays, where the nanoparticle absorbs the incoming radiation and emits an electronic signal. If these nanoparticles are placed in the depletion zone (the volume where radiation is actually detected) of a surface barrier detector, the likelihood of interaction of incident photons will increase dramatically. A fully dense nanoparticle will be more suitable than a partially filled nanoparticle in this instance.

The expected enhanced photoemission from buried metal nanoparticles in silicon matrix, however, has never been utilized, because the synthesis of metal nanoparticles inside semiconducting crystalline solids is very challenging. The formation of metal clusters inside of insulating, amorphous substrates (such as silicon dioxide) can be achieved by the technique of ion implantation plus annealing. The formation of metal clusters inside of crystalline Si, however, cannot be achieved by the same strategy. By introducing large amounts of metal impurity into Si via ion implantation, the top Si layer easily becomes amorphized. Post-implantation annealing, even with temperatures above 1000° C., is unable to recrystallize the structure. Solid phase epitaxial re-growth at low temperatures is also prohibited by the presence of supersaturated metal impurities.

The present invention can be used to create nanoparticles or nanoplatelets at a chosen depth in immiscible systems. As will be described below in more detail, the method synthesizes self-assembled metal nanoparticles in crystalline silicon. Not only the particle size, depth, and density can be controlled, the crystal orientations of all particles are found to be aligned. In addition to impact on device applications mentioned above, the synthesized structures further open doors for a wide range of fundamental studies. For example, Schottky barrier height of idealized interfaces and angle dependence of photoemission can be systematically investigated. Such information is not possible for randomly oriented metal nanoparticles.

The open volume defects are made inside device-quality monocrystalline silicon and filled, at least partially, with metal (e.g., silver or gold). The filling is performed by diffusion of the metal from the surface. Other metals can be used. The fabrication of nanoparticles leaves the surrounding silicon as pristine as possible. Nanometer sized metal features interact strongly with light, enhancing scattering on a length scale smaller than the wavelength of incident light. Cavities are created by medium energy helium ion implantation and high temperature annealing. Similar methods for fabricating voids are utilized to control metal contamination in current semiconductor chip technologies, though the implantation and annealing parameters differ. The shape of the nanoparticles could be changed by changing the implantation species and defect annealing temperature, say from helium ions and defect annealing at 950° C. to hydrogen ions and defect annealing at 400° C. The depth can also be changed by changing the energy of the implanted ions. This method could be performed in elemental or compound semiconductors using an immiscible metal, or multiple metals, to form nanometallic plasmonic features. The combination of materials (nanoparticle of x material in y material) would determine the specific application. This method could even be extended to form nanoparticles of one metal inside another immiscible metal, such as cobalt nanoparticles in copper, which are the compounds traditionally used for giant magneto-resistance applications.

Now referring to FIG. 1, a flow chart of a method 100 for forming metal nanoparticle(s) onto an inner surface of one or more open volume defects within a substrate is shown. The substrate having a surface containing the one or more open volume defects is provided in block 102. The substrate can be a semiconductor (e.g., monocrystalline silicon, etc.) or a metal. An immiscible metal (e.g., gold, silver, platinum, copper, ruthenium, rhodium, palladium, osmium, iridium, mercury, cobalt or a combination thereof) is deposited on the surface of the substrate in block 104. The metal nanoparticle(s) are formed by diffusing the immiscible metal from the surface onto the inner surface of each open volume defect using a heat treatment in block 106. The metal nanoparticle can partially fill, substantially fill or completely fill the open volume defect. The method results in the atomic planes of the metal being substantially parallel to the atomic planes of the substrate. Moreover, the method produces minimal residual crystalline damage in the substrate.

The method can be used to produce a substrate having at least one open volume defect with a metal nanoparticle formed onto an inner surface of the open volume defect, a solar cell, an optical switch, a radiation detector, or other similar device. For example, the present invention provides an apparatus that includes a substrate containing an open volume defect and having minimal residual crystalline damage, and a metal nanoparticle formed of an immiscible metal onto an inner surface of the open volume defect and the atomic planes of the immiscible metal are substantially parallel to the atomic planes of the substrate (see e.g., FIGS. 3A-3D, 6A-6F and 7A-7D).

The step of providing the substrate having the surface containing the one or more open volume defects may include the steps of providing the substrate and creating the one or more open volume defects within the surface of the substrate. The step of creating the one or more open volume defects within the surface of the substrate can be performed prior to or simultaneously with growing the one or more open volume defects by defect annealing. The one or more open volume defects can be created by implanting high-energy ions (e.g., helium, hydrogen, etc.) into the surface of the substrate where the one or more open volume defects are to be created. The high-energy ions can have an energy of approximately 100 keV and a fluence of approximately $1 \times 10^{16}$ cm$^{-2}$. Ion implantation and defect annealing in the same step is commonly referred to as heating the substrate during ion implantation. The defect annealing can be performed at a temperature of approximately 950° C. for approximately one to two hours. Note that lower temperatures typically can be used when ion implantation and defect annealing are performed in the same step. The desired type, size and depth of open volume defect determines the implanted ion species, time and temperature of defect annealing and the possible co-execution of ion implantation and defect annealing. Established methods and quantities available in open literature are utilized for this purpose.

The step of depositing an immiscible metal on the surface of the substrate can be preformed using a low energy ion implantation process or a physical vapor deposition process. The heat treatment used to diffuse the immiscible metal from the surface onto the inner surface of each open volume defect can be performed at a temperature of at least approximately 750° C. for at least approximately 30 minutes. Other fabrication parameters can be used as detailed below. Moreover, the fabrication parameters will vary somewhat depending on the type of substrate and immiscible metal used. More specifically and as will be appreciated by those skilled in the art, the time and temperature for the heat treatment are chosen such that two important considerations are balanced according to requirements of desired application: the amount of immiscible metal trapped in open volume defects, and the residual defect concentration left in substrate after fabrication process. The eutectic point of immiscible materials is not a limitation on temperature for diffusion heat treatment.

Figure 2:
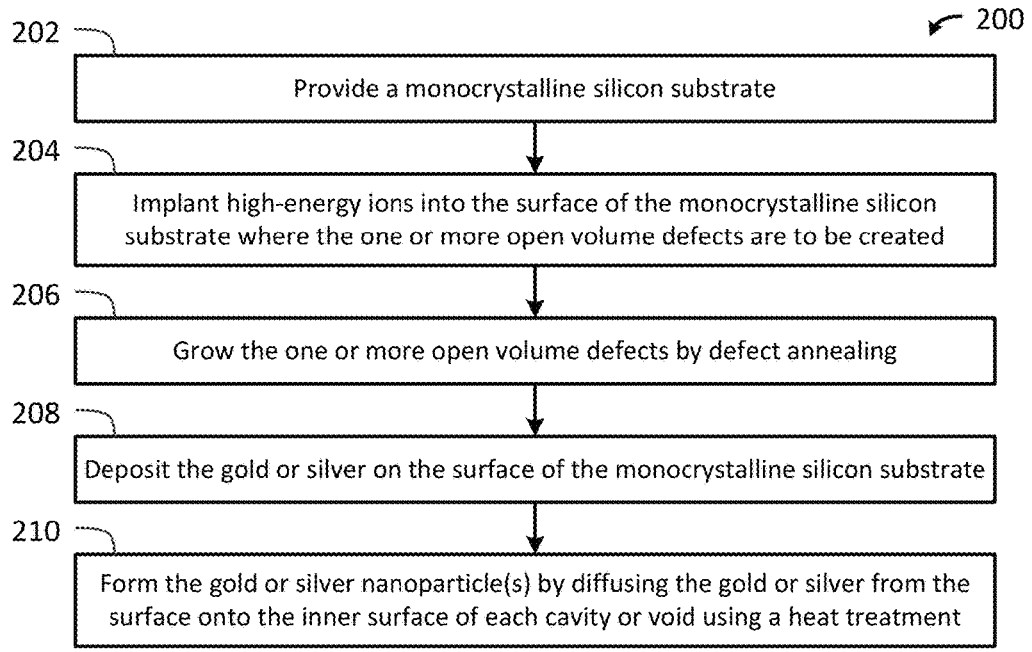
FIG. 2 is a flow chart of a method for forming gold or silver nanoparticle(s) onto an inner surface of one or more open volume defects within a monocrystalline silicon substrate in accordance with one embodiment of the present invention.

Referring now to FIG. 2, a flow chart of a method 200 for forming gold or silver nanoparticle(s) onto an inner surface of one or more open volume defects within a monocrystalline silicon substrate is shown. The monocrystalline silicon substrate is provided in block 202. High-energy ions (e.g., helium, hydrogen, etc.) are implanted into the surface of the monocrystalline silicon substrate where the one or more open volume defects are to be created in block 204. The high-energy ions can have an energy of approximately 100 keV and a fluence of approximately $1\times10^{16}$ cm$^{-2}$. The one or more open volume defects are grown by defect annealing in block 206. The defect annealing can be performed at a temperature of approximately 950° C. for approximately one to two hours. As previously stated with respect to FIG. 1, the ion implantation step 204 and the growing step 206 can be performed at the same time in which case a lower annealing temperature is typically used. Likewise, the desired type, size and depth of open volume defect determines the implanted ion species, time and temperature of defect annealing and the possible co-execution of ion implantation and defect annealing. Established methods and quantities available in open literature are utilized for this purpose.

The gold or silver is deposited on the surface of the monocrystalline silicon substrate in block 208. The step of depositing the gold or can be preformed using a low energy ion implantation process or a physical vapor deposition process. The gold or silver nanoparticle(s) are formed by diffusing the gold or silver from the surface onto the inner surface of each open volume defect using a heat treatment in block 210. The heat treatment can be performed at a temperature of at least approximately 750° C. for at least approximately 30 minutes. The gold or silver nanoparticle can partially fill, substantially fill or completely fill the open volume defect. The method results in the atomic planes of the metal being substantially parallel to the atomic planes of the monocrystalline silicon substrate. Moreover, the method produces minimal residual crystalline damage in the monocrystalline silicon substrate. Other fabrication parameters can be used as detailed below. As previously stated, the time and temperature for the heat treatment are chosen such that two important considerations are balanced according to requirements of desired application: the amount of immiscible metal trapped in open volume defects, and the residual defect concentration left in substrate after fabrication process. The eutectic point of immiscible materials is not a limitation on temperature for diffusion heat treatment.

The method can be used to produce a monocrystalline silicon substrate having at least one open volume defect with a gold or silver nanoparticle formed onto an inner surface of the open volume defect, a solar cell, an optical switch, a radiation detector, or other similar device. For example, the present invention provides an apparatus that includes a monocrystalline silicon substrate containing a open volume defect and having minimal residual crystalline damage, and a gold or silver nanoparticle formed onto an inner surface of the open volume defect and the atomic planes of the gold or silver are substantially parallel to the atomic planes of the monocrystalline silicon substrate (see e.g., FIGS. 3A-3D, 6A-6F and 7A-7D).

Figures 3A, 3B, 3C, 3D:
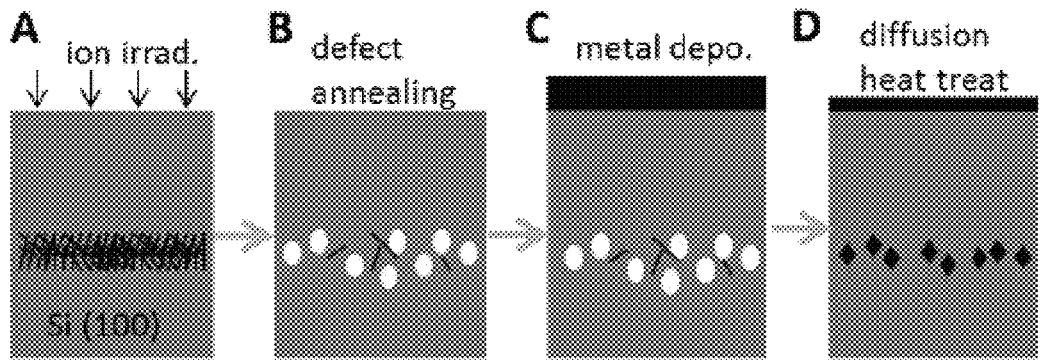
FIGS. 3A-3D are a series of cross-sectional views of a substrate illustrating a method for forming nanoparticles onto an inner surface of one or more open volume defects within a substrate in accordance with one embodiment of the present invention.

Now referring to FIGS. 3A-3D, a series of cross-sectional views of a substrate illustrating a method for forming nanoparticles onto an inner surface of one or more open volume defects within a substrate in accordance with one embodiment of the present invention are shown. First, nanovoids are introduced by low fluence helium ion irradiation to minimize disordering (FIG. 3A). Second, subsequent annealing is used to relax voids so spherical voids grown and transit into equilibrium shape of Si crystals (FIG. 3B). Third, a noble metal is vapor-deposited (FIG. 3C). Fourth, atoms diffuse from Si surface while their diffusion is dominated by kick-out mechanism thus open volume defects act as diffusion ending sites (FIG. 3D). Void/cavity induced metal gettering is well known in semiconductor industry and has been used to either purify near surface substrate region or to detect voids. Different from previous studies, the present invention seeks to provide a structure which (a) forms pure metal nanoparticles instead of metal silicide for maximized photoemission; (b) has minimized defects, i.e. dislocations, to avoid leakage current; (c) has well-ordered metal-silicon interface to minimize electron trapping. Selection of Ag as diffusing metal is made since it has high electron density and is immiscible in silicon, thus chemisorption on the inner surface of a Si void decreases the Gibbs free energy more than formation of a silicide compound. A relatively higher temperature is used for void formation/relaxation to minimize dislocation growth and to facet voids. Lowest energy surface of Si is (111), which is a good match for heteroepitaxial growth by 4:3 Ag:Si coincident site lattice. A relatively lower temperature is used for Ag drive-in diffusion since the temperature is lower than eutectic temperature of Ag—Si system (830° C.) but high enough for sufficient diffusivity and epitaxial growth. Other types of substrates and metals can be used.

Figure 4:
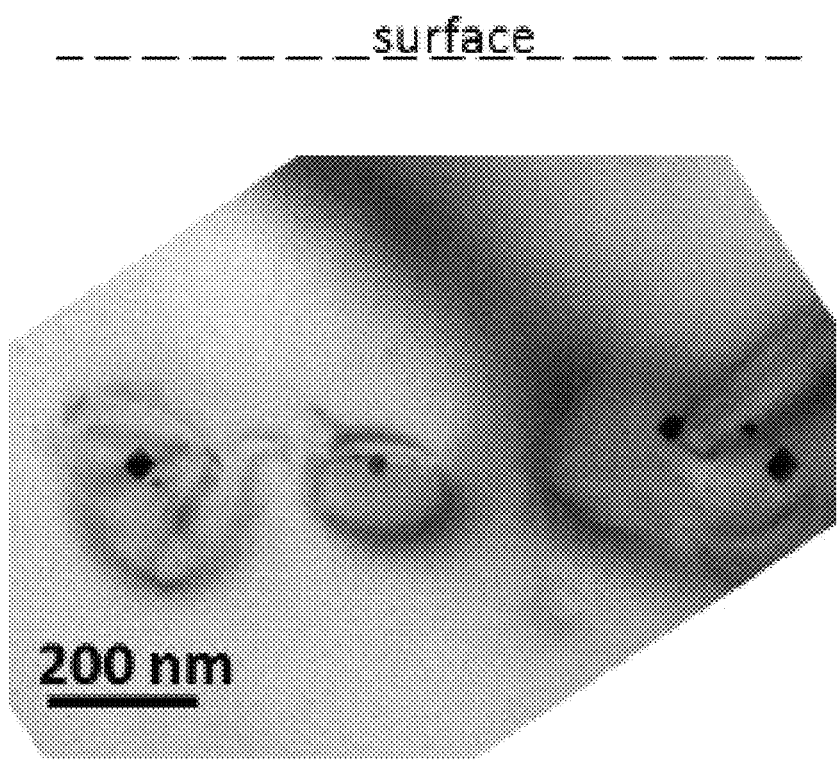
FIG. 4 is a transmission electron micrograph of the resulting structures (silver nanoparticles in silicon) from the method of FIGS. 3A-3D.
Figure 5:
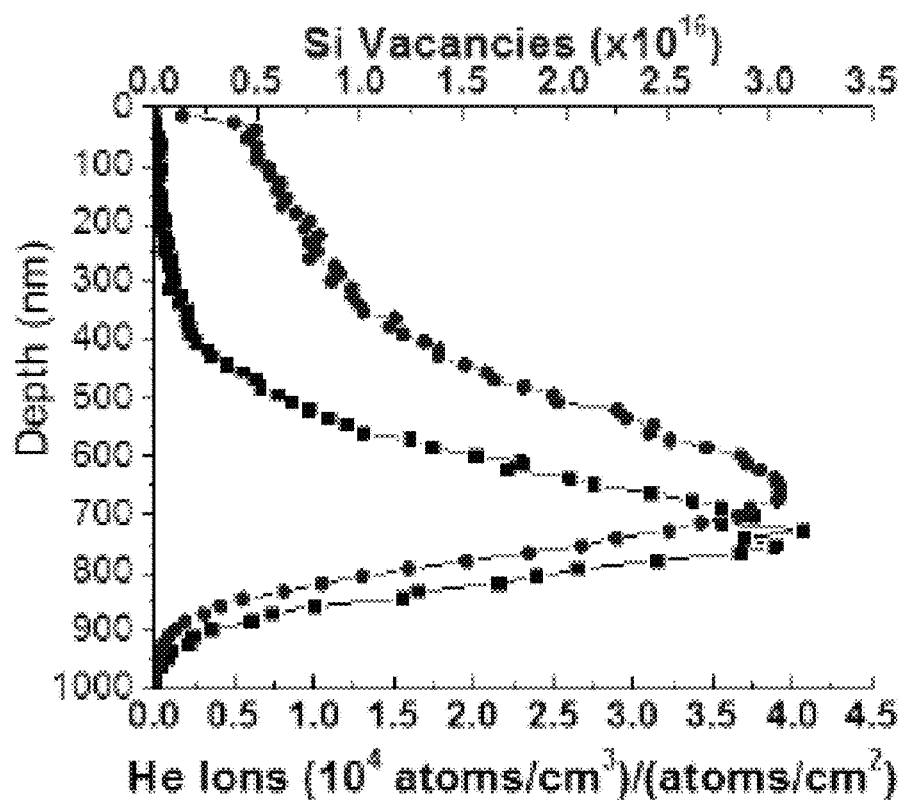
FIG. 5 is a graph plotting the vacancy profile and helium ion distribution calculated by binary collision approximation codes SRIM.

In one example, $5\times10^{15}$ cm$^{-2}$ 100 keV He ion implantation and a post-implantation annealing at 950° C. for 3.5 hour is used to form low density voids of desired sizes in Si. Then Ag deposition and additional annealing at 750° C. for one hour is used to induce Ag-void decoration. Transmission electron micrograph shown in FIG. 4 shows the resulting structures. Ag nanoparticles of diameters up to 40 nm are found in a band more than 100 nm thick. Some voids are fully decorated by Ag metal leaving no free volume, but the usual case is for some free volume to remain. FIG. 5 plots the vacancy profile and helium ion distribution, predicted from Monte Carlo simulation code SRIM. Due to low solid solubility of helium in Si, the implanted helium diffuses back to vacancy peak region to induce and stabilize void formation. Upon annealing, a significant portion of helium atoms diffuse to surface out of void region, which lead to void relaxation with their shape changes following Wulff construction. Note that other fabrication parameters can be used as detailed below. Moreover, the fabrication parameters will vary somewhat depending on the type of substrate and immiscible metal used.

Figures 6A, 6B, 6C, 6D, 6E, 6F:
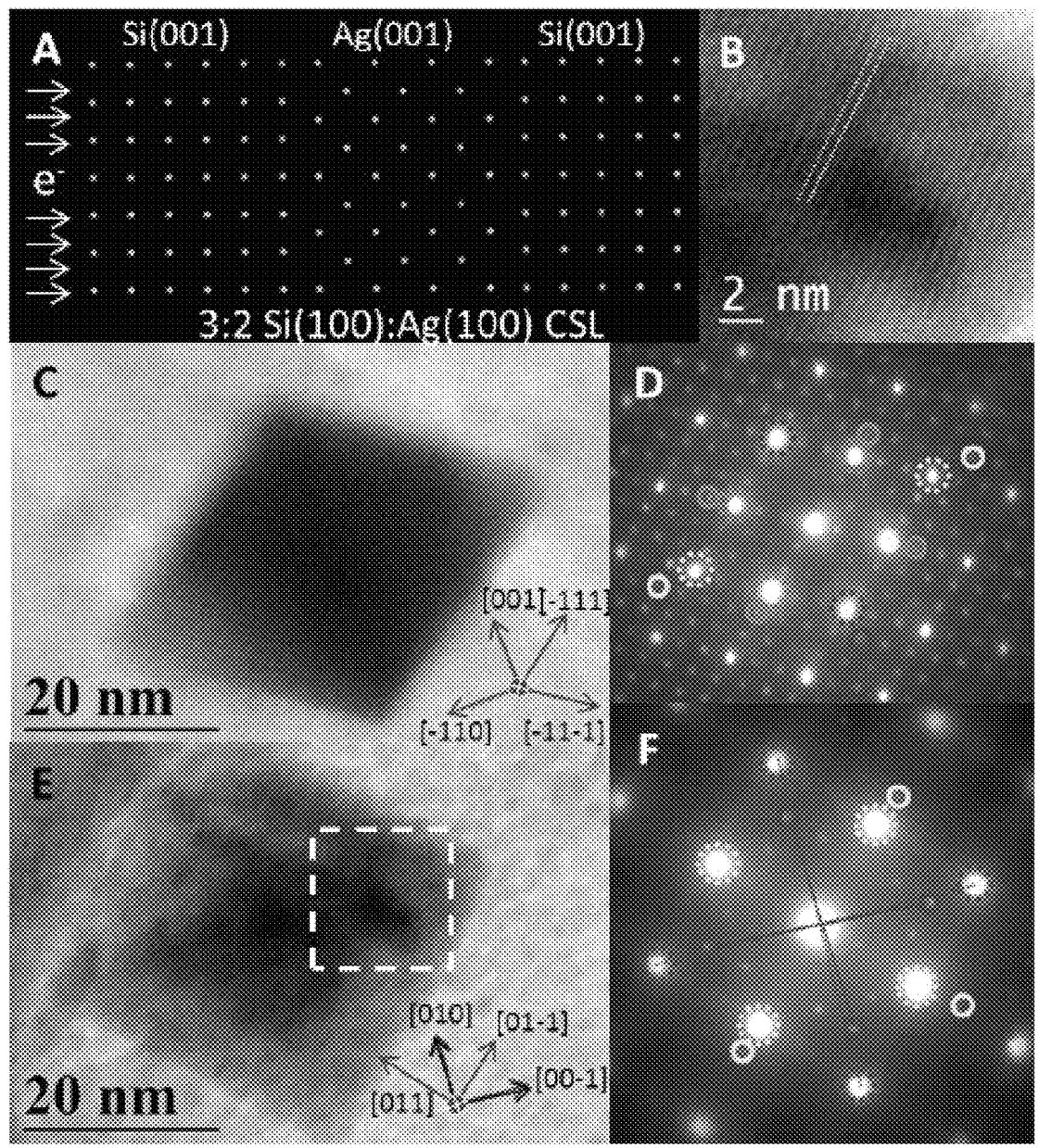
FIGS. 6A-6F show a detailed study of heteroepitaxial growth of Ag on the inner surface of a Si void.

A summary of the studies performed with the present invention will now be described in reference to FIGS. 6A-6F and 7A-7D. Early studies have shown that epitaxial growth of Ag film on a free Si surface can be realized through forming the coincidence site lattice (CSL). It is believed that similar CSL structure develops at the interface which further determines Ag nanocrystal orientation within voids. FIG. 6A illustrates Si/Ag/Si heterostructure with arrows referring to the electron beam direction in transmission electron microscopy (TEM) analysis. As shown in FIG. 6B, high resolution TE micrograph analysis of Ag nanoparticle (Fourier filtering of portion of FIG. 6E) results in interference of Si and Ag (110) planes, with spacing 5.6 Å. Micrographs in FIGS. 6C and 6E are imaged along the [110] and [100] zone axes, respectively, and corresponding diffraction patterns are shown in FIGS. 6D and 6F, respectively. Another nanoparticle from this specimen with large amount of free volume is analyzed by HR-TEM in FIGS. 8A-8B. Dashed circles indicate diffraction from Si atomic planes and solid circles from Ag, and atomic plane families (100), (110) and (111) are indicated by red, yellow and blue, respectively in FIGS. 6D and 6F. Crystallographic directions displayed on FIGS. 6C and 6E are extracted from diffraction patterns in FIGS. 6D and 6F. In the [100] projection, Ag and Si (100) planes are misaligned by approximately 3°, represented by solid and dashed lines in FIG. 6F and by black and red lines in FIG. 6C. The spacings of Ag atomic planes measured in FIG. 6D are within 0.5% of bulk values, normalized to bulk Si atomic plane spacings. The Ag (001) plane measured in FIG. 6F is within 0.3% of tabulated value, but Ag (010) and both Ag (011) planes deviate from tabulated values by 3.5%.

The Si (002) reflections shown in the diffraction pattern in FIG. 6D, in dashed yellow circles, are forbidden reflections, but appear because of double diffraction from multiple planes. The interference pattern caused by penetration of electron beam through different atomic planes was described by Moire, where spacing of interference fringes created by two parallel atomic planes with different spacing, for instance the Si (111) and Ag (111) planes, are determined by Equation 1:

$$L_{111} = \frac{d_{Si(111)} \times d_{Ag(111)}}{d_{Si(111)} - d_{Ag(111)}} = \frac{3.135\text{Å} \times 2.358\text{Å}}{3.135\text{Å} - 2.358\text{Å}} = 9.51\text{Å} \quad (1)$$

where $d_{A(xyz)}$ is the spacing of plane (xyz) of element A (Hirsch 1965). Close alignment of the Ag and Si atomic planes and the location inside the Si matrix renders the independent determination of planar spacing of Ag nanoparticles impossible without interference. This phenomenon also hinders exact observation of the size of nanoparticles using these micrographs. The measured interference fringe spacing in FIG. 6B is 5.6 Å, and calculated value for interference fringe of Si (220) and Ag (220) planes with spacings 1.919 and 1.444 Å, respectively, using Equation 1 is 5.8 Å. Additional Moire interference patterns, with and without application of Fourier filtering method, are reported in FIGS. 8A-8B and 9.

Careful examination of the micrographs in FIGS. 6C and 6E suggests that the nanoparticle has an octahedral shape bounded by (111) planes with an aspect ratio near unity, calculated by comparing the length of nanoparticle measured along the (110) and (100) directions. The [110] projection, FIG. 6C, of the nanoparticle shows that the sides are (111) planes, the base is rotated 3° from (001) plane, and the apices are bisected by (110) plane. The four sides of the [100] projection, FIG. 6E, are rotated 3° from (011) directions indicated on micrograph. Thinner portions of the nanoparticle in FIG. 6C projection are at apices and the base and surrounding Si is too thick for 200 kV electrons to penetrate. The contrast in [100] projection shows the nanoparticle is thinner at edges than in center. The size of the nanoparticle in FIG. 6C is 29.1 nm in the [111] direction and 27.7 nm in the [11-1] direction, and it is approximately square in FIG. 6E with side lengths 33 and 35 nm. Reported lengths are conservative due to uncertainty caused by electron interference. The uncertainty caused by fuzzy boundaries could account for the observed misalignment.

Figures 7A, 7B, 7C, 7D:
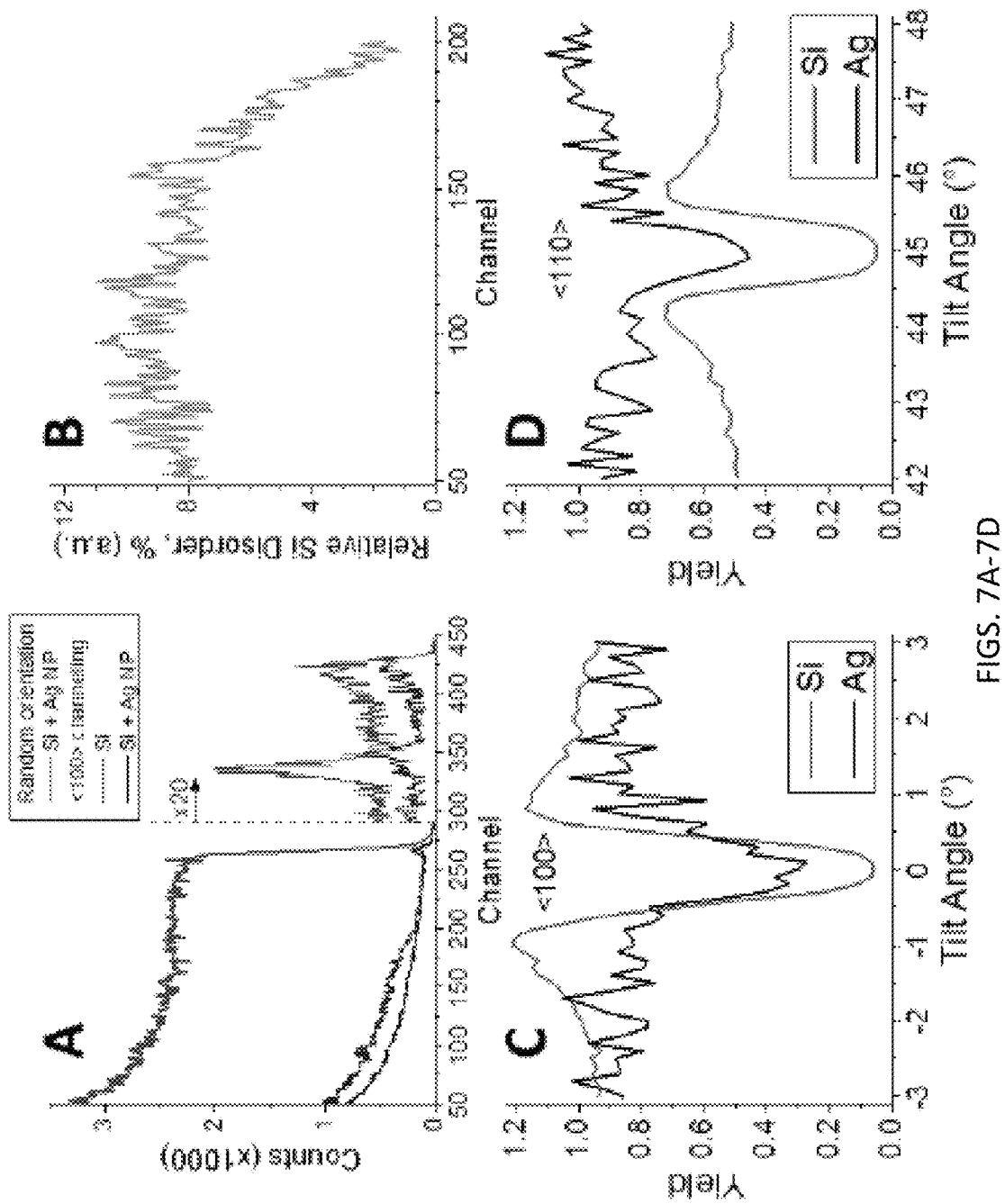
FIGS. 7A-7D show RBS channeling data, relative disorder and angular scans of Ag in Si fabricated with 950° C. defect annealing time for 0.5 hours and 750° C. diffusion heat treatment time for one hour.

Rutherford backscattering spectrometry (RBS) analysis shows effect of nanoparticle fabrication on crystallinity of Si substrate and provides direct evidence of Ag nanoparticle alignment along one direction. Channeling and random spectra obtained with the 2 MeV helium analysis beam around Si <100> axial channel direction are shown in FIG. 7A, obtained from sample with 950° C. defect annealing for 30 minutes and 750° C. diffusion heat treatment for one hour, a thermal budget significantly reduced from sample shown in FIGS. 4 and 6A-6F. The spectra for channel number <290 corresponds to backscattering from Si, while that for channel number >290 corresponds to yields from Ag (yields are enlarged by factor of 20 for better visualization). The "Si+Ag NP" surface peak (channel ~265) shows that the Si surface has not reconstructed or formed a compound layer when compared with pure Si surface peak. The sharp peaks close to channel 330 in random spectrum (345 in channeling spectrum) correspond to Ag nanoparticles. FIG. 7B shows the extracted profile of Si atomic disorder relative to unadulterated Si in the Ag nanoparticle region. The defect concentration normalized to atomic density is less than 11%, which suggests good control of defect densities. Systematic study of effects of defect annealing and diffusion heat treatment times is shown in FIGS. 10A-10E and 11.

Angular scans across the surface-normal <100> and off-normal <110> axial channels are shown in FIGS. 7C and 7D, respectively. The yields from Si near the surface (without Ag) are plotted for a comparison. The yields are integrated from Ag nanoparticle regions, and normalized to their corresponding random values. All yield curves show a dip at zero tilting with respect to axial channel position, which means Ag atomic rows are aligned with that of Si in both <100> and <110> directions. Such alignments support the epitaxial growth described in FIG. 6A. Under CSL configuration, a fraction of aligned Ag atomic rows are off Si axial direction and viewed as displacements by the channeled beam. This increases Ag yield and cause higher Ag minimum yields when compared with Si.

For the device applications, the Schottky barrier height of Ag—Si interface is around 0.6 eV, which suggests a threshold photon wavelength of ~1.8 µm for photoemission from Ag particles. Therefore, in addition to use as a computing component driven by 1.3 µm or even 1.55 µm semiconductor lasers, devices can be used for radiation detection requiring high spatial resolution since the substrate is compatible with existing Si technology. It is possible to extend applications further into infared region for imaging applications through strain engineering to narrow band gap of semiconductor medium, thus reducing Schottky barrier height. For example, Reducing $E_g$ to 0.8 eV in a $Si_{0.7}Ge_{0.3}$ layer grown in a relaxed $Si_{0.3}Ge_{0.7}$ structure can reduce Schottky barrier height to 0.2 eV for a Ag—Si interface. Thus, the threshold wavelength for device switching is increased to 6.2 µm.

The synthesized structure has potential to advance current technology for fabrication of the Si based integrated-optic super-chip, which will revolutionize everything from telecommunications to high-speed computing. In addition, the photoemissive properties of Ag (or other noble metal) nanoparticles has the potential to be used as a radiation detector operable from the visible to the infrared, which is also important for national security applications.

Figures 8A, 8B:
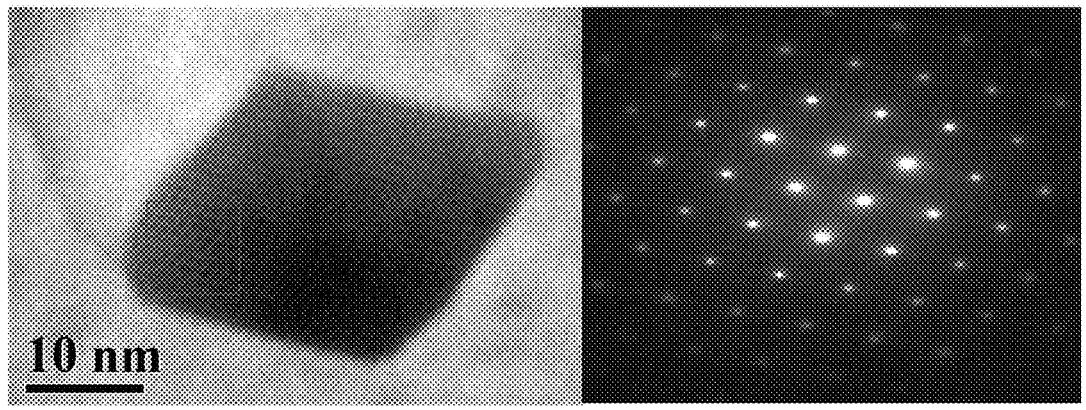
FIGS. 8A-8B are a high-resolution transmission electron micrograph of a partially filled void/nanoparticle created by the conditions of FIGS. 3A-3D, 4, 5 and 6A-6F, and a diffraction pattern indicating the zone axis is [011]

Now referring to FIGS. 8A-8B, a study of partially filled void/nanoparticle, with Ag/Si interface and Ag/vacuum interface will be described. FIG. 8A is a high-resolution transmission electron micrograph of partially filled void/nanoparticle created by same conditions as FIGS. 3A-3D, 4, 5 and 6A-6F. FIG. 8B is an accompanying diffraction pattern indicating the zone axis is [011]. Small portion of nanoparticle has been filtered by Fourier transformation and masking to emphasize Moire interference of Ag and Si (111) planes. The measured fringe spacing is 8.9 Å, a decrease of 6.4% from the calculated value of 9.51 Å measured by Equation 1. The dimensions of the nanoparticle are 36.6 nm in the (110) direction bounded by (100) planes, 22.0 nm in the (111) direction bounded by (11-1) plane at the Si/Ag interface, and 23.2 nm in the (11-1) direction bounded by (111) plane at the Si/Ag interface. At the corners of Si, Ag and free volume, the nanoparticle appears to grow by expanding a ledge a few monolayers thickness towards the Ag (111)/(11-1) corner.

Figure 9:
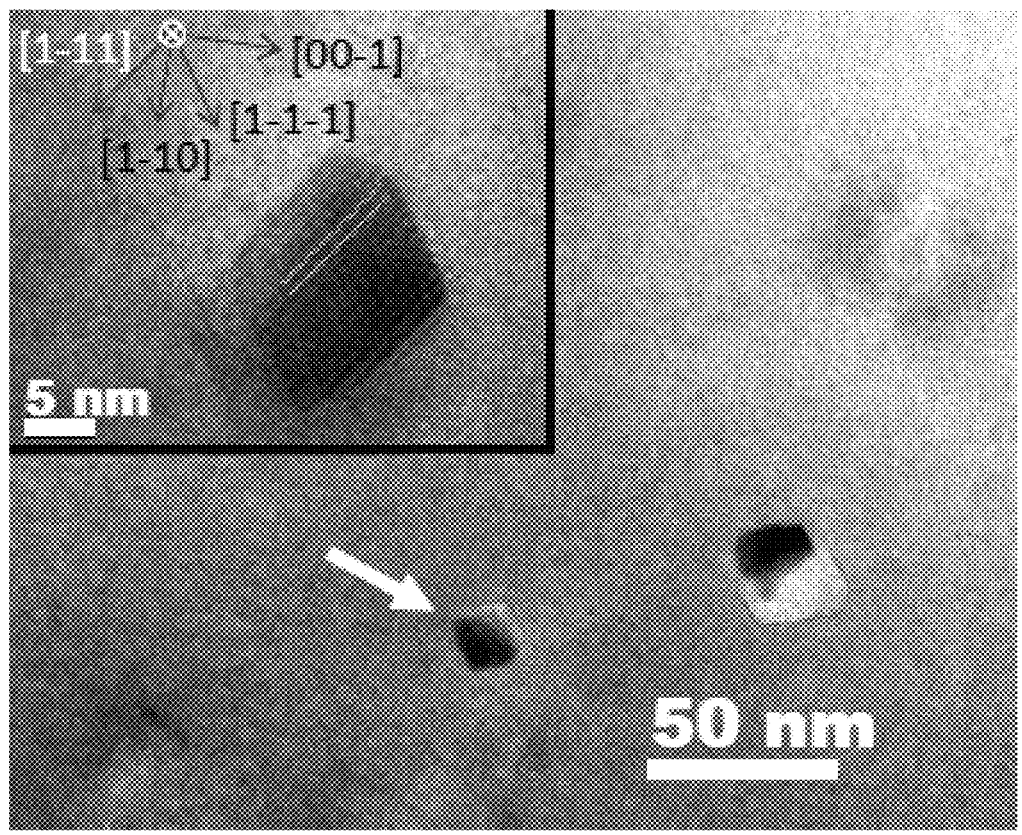
FIG. 9 is a transmission electron micrograph of Si implanted with $5 \times 10^{15}$ cm$^{-2}$ 100 keV He ions and annealed in flowing Ar at 950° C. for 30 minutes.

Referring now to FIG. 9, a transmission electron micrograph of Si implanted with 5E15/cm2 100 keV He ions and annealed in flowing Ar at 950° C. for 30 minutes is shown. Following thermal annealing, 100 nm Ag is deposited by evaporation, and heat treatment in flowing Ar at 750° C. for one hour is performed to diffuse metal into voids. Inset shows high-resolution micrograph of nanoparticle marked by arrow, and low-index orientations are indicated.

Figures 10A, 10B, 10C, 10D, 10E:
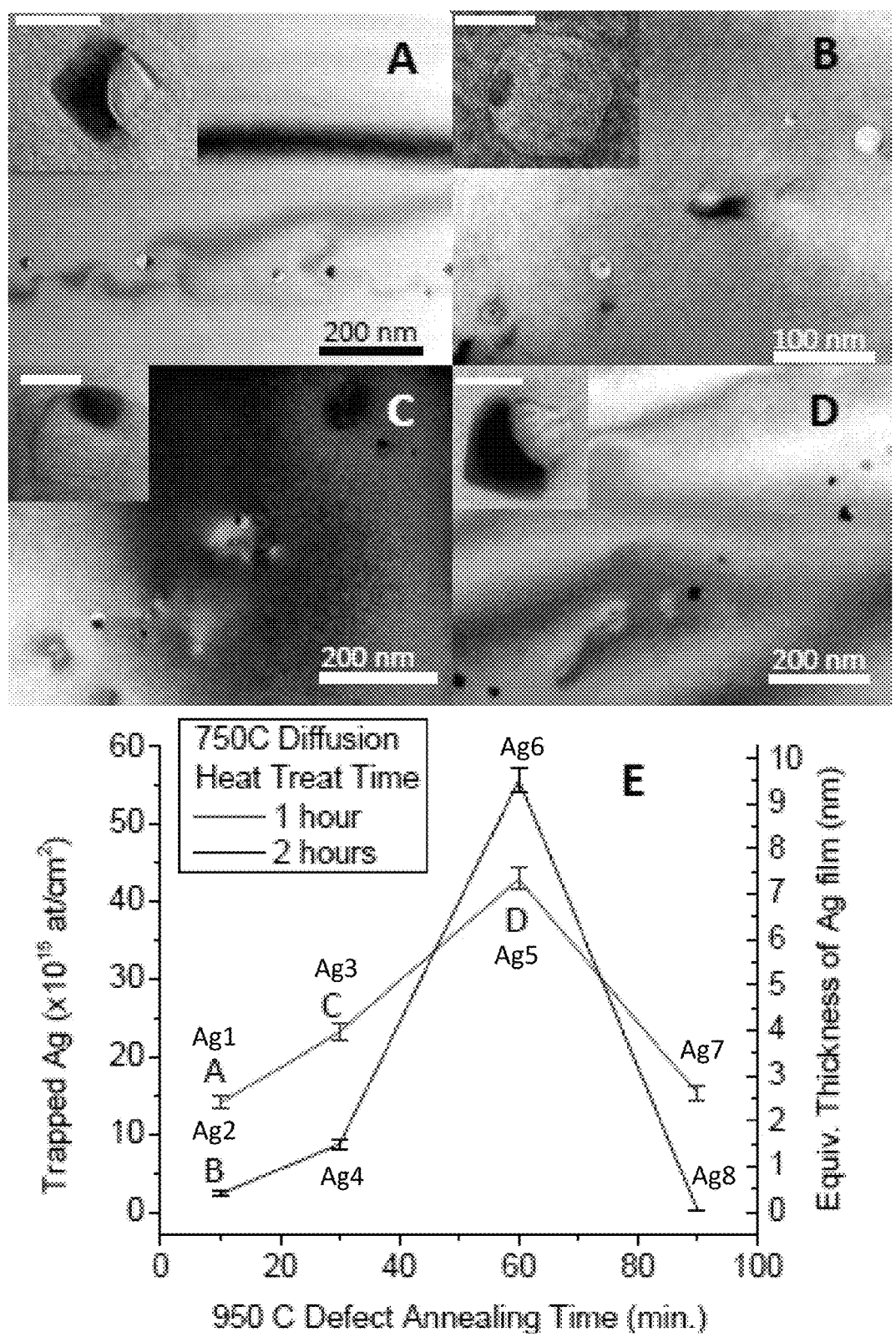
FIGS. 10A-10E depict a study of Ag trapping in nanoparticles for varying 950° C. defect annealing and 750° C. diffusion heat treatment times.

Now referring to FIGS. 10A-10E, a study of Ag trapping in nanoparticles for varying 950° C. defect annealing and 750° C. diffusion heat treatment times is shown. FIGS. 10A-10D are transmission electron micrographs of Si implanted with Ag. In FIG. 10A, the Si defects were annealed at 950° C. for 10 minutes followed by Ag diffusion heat treatment at 750° C. for one hour. In FIG. 10B, the Si defects were annealed at 950° C. for 10 minutes followed by Ag diffusion heat treatment at 750° C. for two hours. In FIG. 10C, the Si defect were annealed at 950° C. for 30 minutes followed by Ag diffusion heat treatment at 750° C. for one hour. In FIG. 10D, the Si defects were annealed at 950° C. for one hour followed by Ag diffusion heat treatment at 750° C. for one hour. Insets show higher magnification micrographs of nanoparticles, and scale bars in each inset are 20 nm. Amount of Ag trapped in nanoparticle/void layer is measured by RBS and displayed in FIG. 10E, and points corresponding to samples shown in micrographs FIGS. 10A-10D are labeled with lowercase letters. The right abscissa shows equivalent thickness of a continuous Ag film with bulk density of 10.47 g/cm³.

Figure 11:
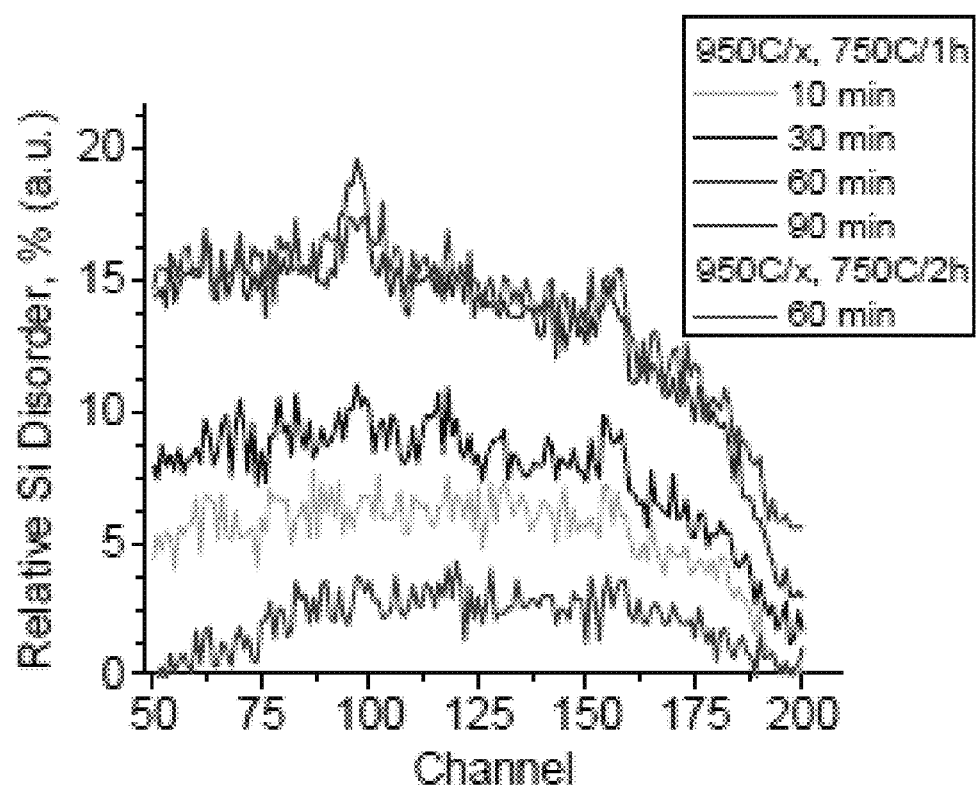
FIG. 11 is a graph showing the relative disorder of Si atoms extracted from <100> axial channeling data.

Referring now to FIG. 11, a graph showing the relative disorder of Si atoms extracted from <100> axial channeling data. Samples are fabricated with defect annealing at 950° C. varying from 10-90 minutes and diffusion heat treatment of one or two hours. Relative disorder curve of 30 min. defect annealing, previously shown in FIG. 7B, is included here for comparison. Amount of Ag trapping, shown in FIG. 10E, and residual disorder of neighboring Si atoms are not directly related.

A detailed discussion of the studies performed using the present invention will now be described. First, the decoration of voids in silicon by gold atoms will be discussed. Second, the decoration of voids in silicon by silver atoms will be discussed. Third, characterizing the atomic structure of silver nanoparticles in silicon will be discussed.

The decoration of voids in silicon by gold atoms will now be discussed. A limited number of successful experimental conditions have been found among a broad number of attempts. These parameters are summarized in Tables 1, 2 and 3. All experiments are performed on 300 um thick p-type silicon wafers with (001) orientation grown by float-zone technique doped with boron to resistivity 5-10-cm.

Table 1 details a straightforward approach consisting of forming voids by He ion irradiation and annealing followed by Au film deposition and diffusion heat treatment. Two high He ion fluences, $1 \times 10^{17}$ and $5 \times 10^{16}$ cm$^{-2}$, and two high temperatures for defect annealing, 750 and 950° C., for fixed time of two hours are investigated. After ion irradiation and defect annealing, 100 nm of Au is deposited by magnetron sputtering without any surface pre-treatment. Then, Au is diffused during 20 minute heat treatment at 750° C.

TABLE 1

Summary of experimental conditions attempted to fabricate gold nanoparticles in silicon

| Label | Fluence (cm$^{-2}$) | Anneal Temp. (° C.) | Anneal Time (hr.) |
|---|---|---|---|
| Au1 | $1 \times 10^{17}$ | 950 | 2 |
| Au2 | $1 \times 10^{17}$ | 750 | 2 |
| Au3 | $5 \times 10^{16}$ | 950 | 2 |
| Au4 | $5 \times 10^{16}$ | 750 | 2 |

Both defect annealing and diffusion heat treatment are performed in vacuum utilizing a hot-zone approach, where samples are placed in quartz boat and inserted into the hot-zone of the furnace at stated temperature using transfer rod. Two minutes are added to each anneal or heat treatment to allow the sample and quartz boat to heat up to furnace hot-zone temperature.

An attempt to understand the role of the sequence of ion irradiation, defect annealing, metal deposition and diffusion heat treatment is attempted in experimental conditions listed in Table 2. The ion fluence for each of Au5-16 is fixed at $5 \times 10^{16}$ cm$^{-2}$ He ions. However, for Au5-13, 55 nm thick Au film is deposited before ion irradiation, and for Au14-16, 55 nm thick Au film is deposited after ion irradiation and defect annealing. In order for He ions to penetrate to same depth in both cases, He ion energy for Au5-13 is set to 120 keV, and for Au14-16 to 100 keV. The goal of Au5-10 is to irradiate Si that has Au film on the surface with He ions and then anneal for one hour at temperatures ranging from 350-850° C. to study Au diffusion while voids are formed. The pressure in vacuum furnace for this series varies between $0.1-2 \times 10^{-6}$ torr while sample is in hot-zone. Before Au film deposition, samples are rinsed with acetone, methanol and DI H$_2$O five times, then held over open container of HF acid for 15 seconds "vapor etching" and finally rinsed in DI H$_2$O.

TABLE 2

Summary of experimental conditions attempted to fabricate gold nanoparticles in silicon

| Label | Fluence (cm$^{-2}$) | He$^+$ Energy (keV) | Anneal Temp. (° C.) | Anneal Time (hr.) |
|---|---|---|---|---|
| Au5 | $5 \times 10^{16}$ | 120 | 350 | 1 |
| Au6 | $5 \times 10^{16}$ | 120 | 450 | 1 |
| Au7 | $5 \times 10^{16}$ | 120 | 550 | 1 |
| Au8 | $5 \times 10^{16}$ | 120 | 650 | 1 |
| Au9 | $5 \times 10^{16}$ | 120 | 750 | 1 |
| Au10 | $5 \times 10^{16}$ | 120 | 850 | 1 |
| Au11 | $5 \times 10^{16}$ | 120 | 500 | 1* |
| Au12 | $5 \times 10^{16}$ | 120 | 650 | 1* |
| Au13 | $5 \times 10^{16}$ | 120 | 800 | 1* |
| Au14 | $5 \times 10^{16}$ | 100 | 500 | 1 |
| Au15 | $5 \times 10^{16}$ | 100 | 650 | 1 |
| Au16 | $5 \times 10^{16}$ | 100 | 800 | 1 |

All annealing occurred in vacuum furnace. Following this defect annealing, 55 nm Au deposited and then samples annealed for an additional hour at 450° C. in vacuum. Samples Au11-13 were subjected to compound annealing, where samples are first annealed at 450° C. for one hour, then removed from hot zone and furnace turned up to listed temperature and sample annealed for one additional hour. The time between compound anneals is 20 minutes. This compound annealing step is undertaken so that total thermal budget for samples Au11-13 and Au14-16 are equivalent.

Void nucleation and metal diffusion do not necessarily have to be caused by separate processes. It was investigated if the four step process with two heat treating steps, first investigated by samples Au1-4, could be decreased to three steps by conflating defect annealing and diffusion heat treatment into one heat treatment. The series of samples Au11-13 and Au14-16 are designed to be a direct comparison of the effect of the sequence of metal film deposition with one final heat treatment versus ion irradiation and defect annealing followed by metal film deposition and diffusion heat treatment. Samples Au11-13 are deposited with 55 nm thick Au film by magnetron sputtering, then implanted with $5 \times 10^{16}$ cm$^{-2}$ 120 keV He ions. After metal film deposition and ion implantation, each sample is subjected to a compound annealing step, where samples are annealed for one hour at 450° C., then removed from hot-zone for 20 minutes. After 20 minutes, the samples are re-inserted into the hot-zone that has been heated to higher temperature, listed in Table 2, for additional hour. The purpose of this torturous heat treatment is so the thermal budget of samples Au11-13 matches those of samples Au14-16, which are subjected to separate defect annealing and diffusion heat treatment.

Samples Au14-16 are implanted with $5 \times 10^{16}$ cm$^{-2}$ 100 keV He ions first, then defects are annealed for one hour at temperatures listed in Table 2. Then, samples are deposited with 55 nm Au by magnetron sputtering and diffusion heat treatment of 450° C. for one hour is applied.

Deposition of Au film leads to abundant diffusion of Au into Si. Therefore, investigation proceeded involving low-fluence irradiation of 60 keV Au ions to limit the amount of Au atoms available to diffuse into silicon. The four-step process of He ion irradiation, annealing, metal ion irradiation and diffusion heat treatment are employed. Samples Au17-32 are implanted with $1 \times 10^{17}$ or $5 \times 10^{16}$ cm$^{-2}$ 100 keV He ions. Defect annealing times are fixed to either 20 minutes or two hours at 350, 550, 750 or 950° C. in quartz tube furnace utilizing hot-zone method. Then, samples are irradiated with 60 keV Au ions to fluence $1 \times 10^{15}$ cm$^{-2}$ 60 keV Au ions, which are expected to penetrate 32±6 nm [76]. Heat treatment for two hours at 750° C. in flowing $N_2$ gas is applied to cause diffusion of Au to void region.

Following cross-sectional TEM analysis of samples in the series Au17-32, it was decided to implant Samples Au33-35 with $1 \times 10^{16}$, $1 \times 10^{15}$ or $1 \times 10^{14}$ cm$^{-2}$ 100 keV He ions, respectively, and the rest of parameters are identical to Au17 ($1 \times 10^{17}$ cm$^{-2}$) and Au25 ($5 \times 10^{16}$ cm$^{-2}$). The purpose is to decrease void size and density so the number density of trapping sites for Au atoms would be decreased so that amount of Au trapped in each void might increase. Analysis of Au diffusion is performed by RBS analysis at UH Ion Beam Laboratory with detector positioned at 165° backscattering angle detecting backscattered ions from 2 MeV He ion beam incident in random mode.

TABLE 3

Summary of experimental conditions attempted to fabricate gold nanoparticles in silicon

| Label | Fluence (cm$^{-2}$) | Anneal Temp. (° C.) | Anneal Time (hr.) |
|---|---|---|---|
| Au17 | $1 \times 10^{17}$ | 950 | 2 |
| Au18 | $1 \times 10^{17}$ | 750 | 2 |
| Au19 | $1 \times 10^{17}$ | 550 | 2 |

TABLE 3-continued

Summary of experimental conditions attempted to fabricate gold nanoparticles in silicon

| Label | Fluence (cm$^{-2}$) | Anneal Temp. (° C.) | Anneal Time (hr.) |
|---|---|---|---|
| Au20 | $1 \times 10^{17}$ | 350 | 2 |
| Au21 | $1 \times 10^{17}$ | 950 | 0.33 |
| Au22 | $1 \times 10^{17}$ | 750 | 0.33 |
| Au23 | $1 \times 10^{17}$ | 550 | 0.33 |
| Au24 | $1 \times 10^{17}$ | 350 | 0.33 |
| Au25 | $5 \times 10^{16}$ | 950 | 2 |
| Au26 | $5 \times 10^{16}$ | 750 | 2 |
| Au27 | $5 \times 10^{16}$ | 550 | 2 |
| Au28 | $5 \times 10^{16}$ | 350 | 2 |
| Au29 | $5 \times 10^{16}$ | 950 | 0.33 |
| Au30 | $5 \times 10^{16}$ | 750 | 0.33 |
| Au31 | $5 \times 10^{16}$ | 550 | 0.33 |
| Au32 | $5 \times 10^{16}$ | 350 | 0.33 |
| Au33 | $1 \times 10^{16}$ | 950 | 2 |
| Au34 | $1 \times 10^{15}$ | 950 | 2 |
| Au35 | $1 \times 10^{14}$ | 950 | 2 |

Samples first implanted with 100 keV He ions then annealed in vacuum furnace for indicated time and temperature. Then, samples implanted with 60 keV Au ions to fluence $1 \times 10^{15}$ cm$^{-2}$ followed by diffusion heat treatment for two hours at 750° C. in flowing $N_2$ gas.

The concentration of Au as a function of depth from surface is measured by RBS in random mode utilizing 2 MeV He ion beam. A surface barrier detector is set at 165° C. backscattering angle in IBM geometry.

Cross-sectional TEM specimens are made by mechanical polishing, dimpling and Ar ion milling. Specimens of sample Au1 are made after ion irradiation, after ion irradiation and defect annealing, and after ion irradiation, defect annealing, metal film deposition and diffusion heat treatment. Specimens of samples Au12, -13, -18, -25, -26, -29 and -33 are fabricated by traditional mechanical method. These specimens are analyzed in JEOL JEM-2010 transmission electron microscope or FEI Tecnai G2 F20 ST FE-TEM transmission electron microscope, both operated at 200 kV.

Figures 12A, 12B, 12C:
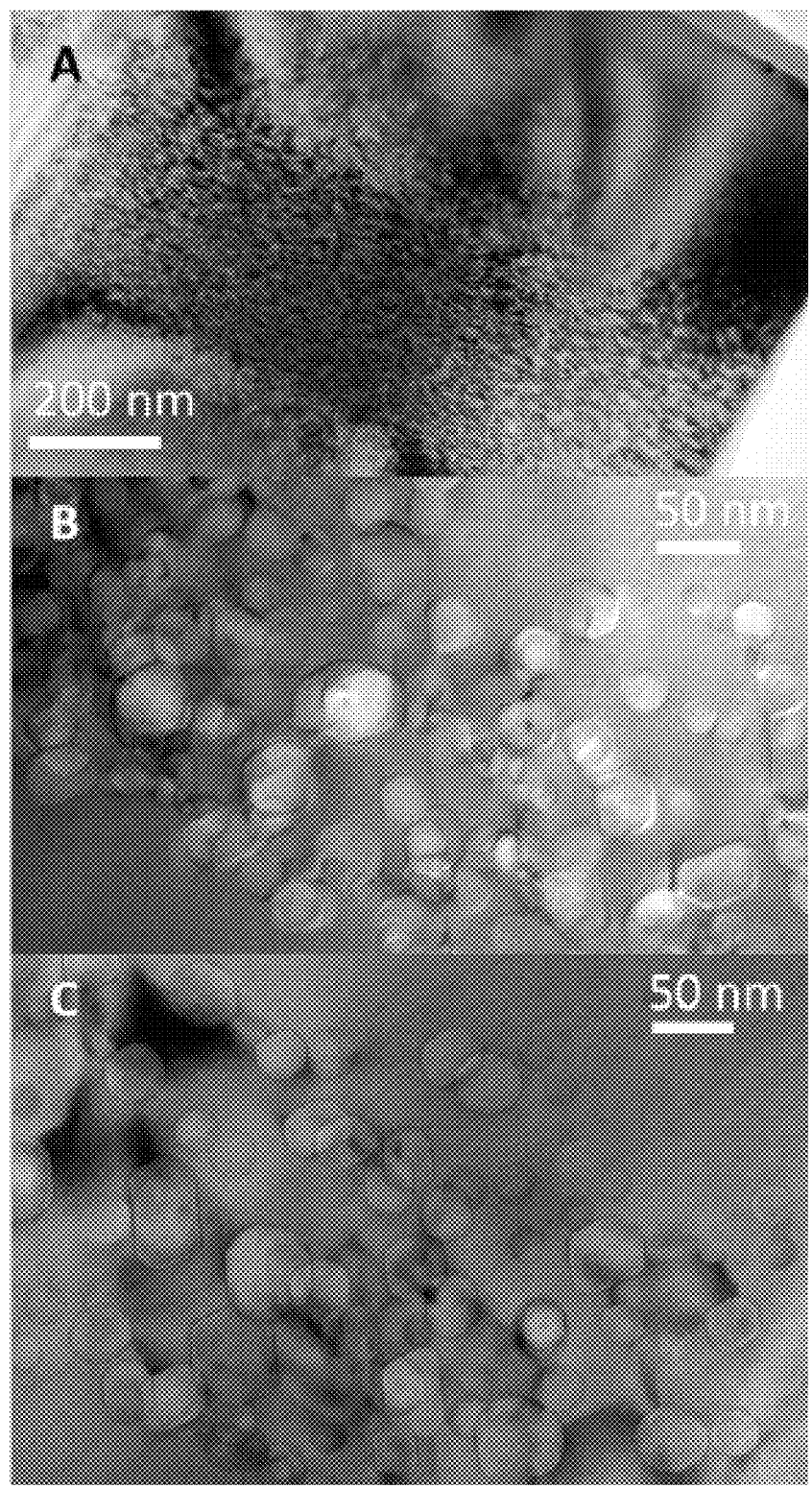
FIGS. 12A-12C are cross-sectional transmission electron micrographs of sample Au1 after different stages of fabrication process.

There are multiple steps to creating each sample, and FIGS. 12A-12C show transmission electron micrographs of silicon wafer after irradiation with $1 \times 10^{17}$ cm$^{-2}$ 100 keV He ions (FIG. 12A), after irradiation (shown in FIG. 12A) and defect annealing at 950° C. for two hours (FIG. 12B), and after irradiation and defect annealing (shown in FIG. 12B) followed by 100 nm Au film deposited on surface and diffusion heat treatment at 750° C. for 20 minutes (FIG. 12C). The large amount of disorder following irradiation with $1 \times 10^{17}$ cm$^{-2}$ 100 keV He ions results in a thick band of defects, and annealing at 950° C. for two hours results in defect recombination and evolution into larger structures. Helium gas desorbs from silicon sample in a few minutes at this annealing temperature [9].

Figure 13A:
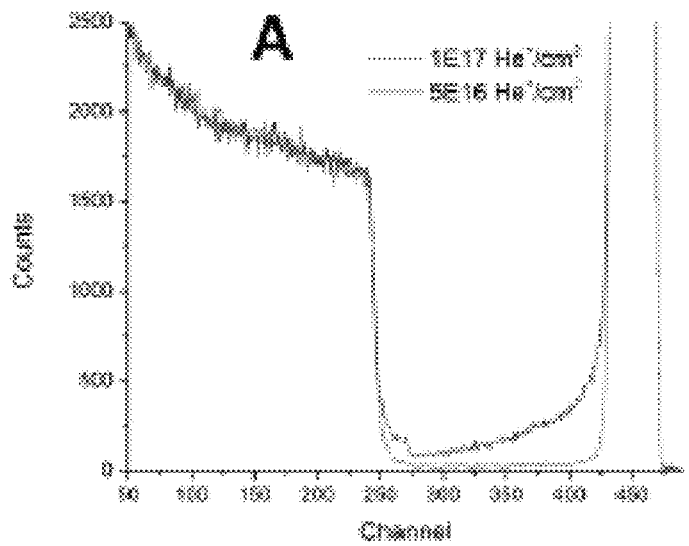
FIGS. 13A-13B are graphs of Rutheford backscattering spectra from samples Au1 and -3 (FIG. 13A), and samples Au2 and -4 (FIG. 13B)
Figure 13B:
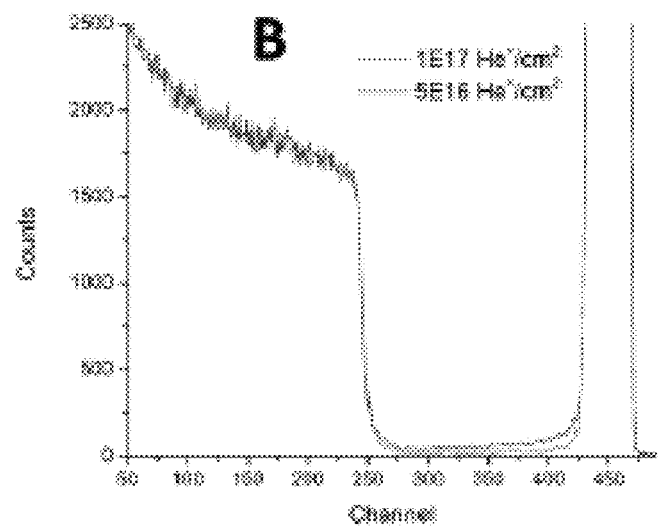

Rutherford backscattering spectra from samples Au1-4, described in Table 1, are obtained to determine the amount of gold that diffuses and if gold is preferentially trapped at voids. These data, shown in FIGS. 13A-13B, indicate that gold diffuses readily into silicon following irradiation and defect annealing. More specifically, FIG. 13A shows Rutherford backscattering spectra from samples Au1 and -3, annealed at 950° C. for two hours following He ion irradiation to stated fluence, and FIG. 13B shows Rutheford backscattering spectra from samples Au2 and -4, annealed at 750° C. for two hours following He ion irradiation to stated fluence. Following defect annealing for two hours, all samples are deposited with 100 nm Au film by magnetron sputtering and heat treated for 20 minutes at 750° C. to diffuse metal inside sample. There is also a small peak in front of the Si peak that shows that Si diffuses into Au surface layer in Au1, indicating the formation of gold silicide compound. However, no preferential trapping is measured by RBS or TEM.

Analysis by TEM and RBS of samples Au1-4, shown in FIGS. 12A-12C and FIGS. 13A-13B, show that the method used to fabricate the samples results in large voids, around 50 nm, at the end of range of 100 keV He ions. However, no nanoparticles are seen in TEM and no significant amount of Au trapping is measured by RBS. Gold diffuses too readily into silicon, with the diffusion tail possibly obscuring a small amount of gold atoms trapped on inner surface of voids. The binary phase diagram of Au—Si shows that Au and Si are immiscible, with a eutectic point when Au concentration is 18.6%. The diffusion heat treatment temperature is 750° C., but the Au—Si eutectic temperature is 363° C. [50]. It is desirable to avoid formation of liquid phase Au—Si. However, thermally driven diffusion below the eutectic temperature would require diffusion times of hundreds of hours or more for Au to diffuse to voids at depth around 650 nm.

Figure 14:
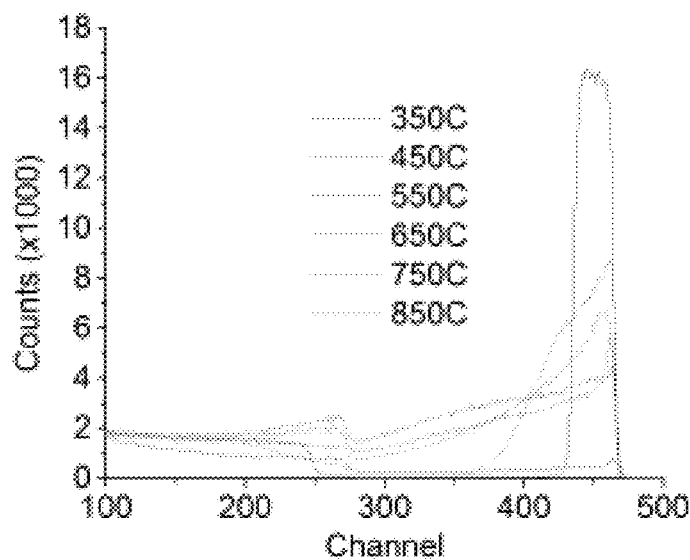
FIG. 14 is a graph of Rutheford backscattering spectra showing Au diffusion into Si wafer from samples Au5-10.

Decreasing the thermal budget for annealing and heat treatment and changing the order of ion irradiation and Au film deposition are investigated for several conditions listed in Table 2. The possibility of accomplishing the dual goals of void nucleation and metal diffusion in one annealing step are investigated. Samples Au5-10 are float zone Si(100) wafers deposited with 55 nm Au by magnetron sputtering, followed by irradiation with $5\times10^{16}$ cm$^{-2}$ 100 keV He ions and one hour treatment at temperatures ranging from 350-850° C. Results for Au diffusion are determined by RBS, and shown in FIG. 14. The least diffusion occurs in annealing at 350° C., which is expected because that is the lowest temperature and below the eutectic point, but the next lowest amount of Au diffusion from the surface is caused by annealing for one hour at 850° C. The least amount of Au is left on the surface by annealing at 550° C. The diffusion of Au from surface into bulk is maximum at this temperature, 550° C., and decreases as temperature is lowered to 350° C. as well as when temperature is raised to 850° C.

Figure 15A:
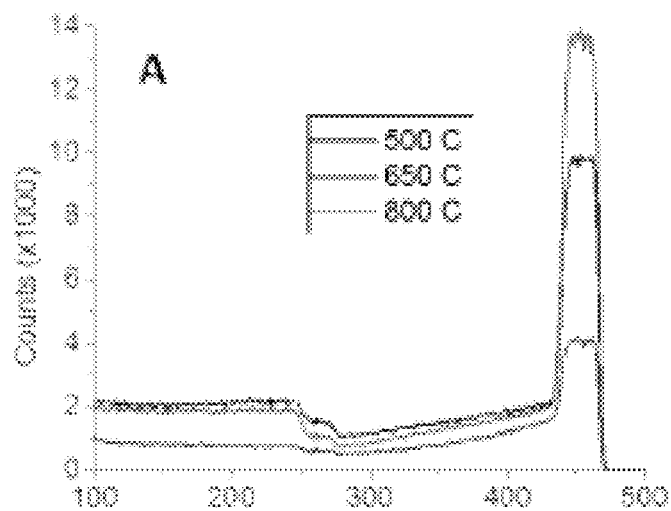
FIGS. 15A-15B are graphs of Rutheford backscattering spectra showing Au diffusion into Si wafer from samples Au14-16 (FIG. 15A) and Au11-13 (FIG. 15B)
Figure 15B:
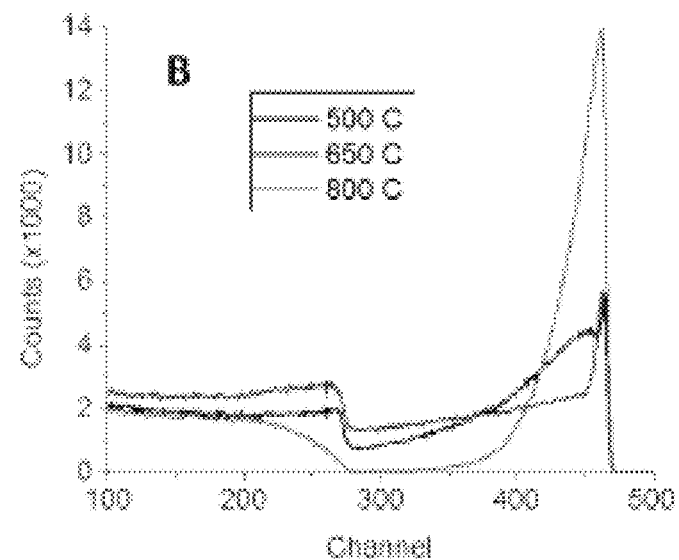

The results for Au diffusion determined by RBS for samples Au11-16 are shown in FIGS. 15A-15B. The effect of the order of He ion irradiation and Au film deposition are investigated. The results from samples Au14-16 are shown in FIG. 15A, the case of He ion irradiation and defect annealing followed by metal film deposition and diffusion heat treatment. Gold is most efficiently diffused into the bulk after defect annealing at the intermediate temperature, 650° C. in this case. The results from samples Au11-13 are shown in FIG. 15B, the case of metal film deposition followed by He ion irradiation and annealing. These three curves show varying degrees of diffusion of Au into the bulk, but nothing that indicates the results are particularly promising for nanoparticle formation. Thermal budget for all samples are equal, and further details are found in Table 2.

Figures 16A, 16B:
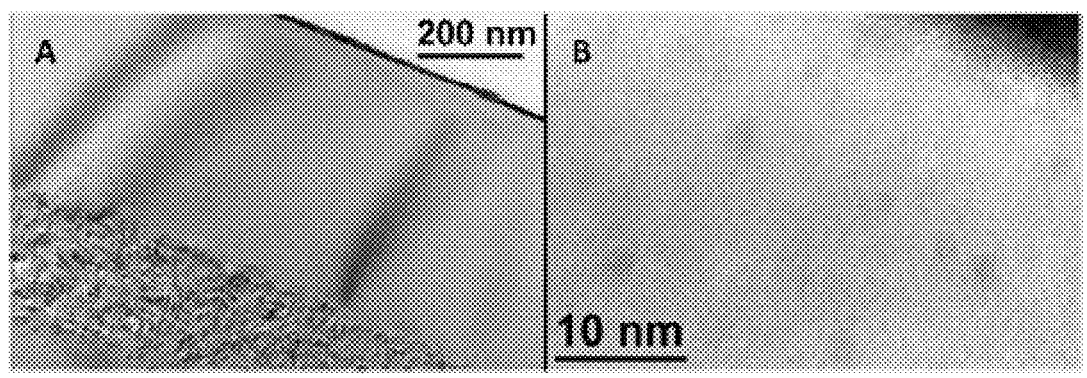
FIGS. 16A-16B are transmission electron micrograph cross-sections of sample Au12.
Figures 17A, 17B:
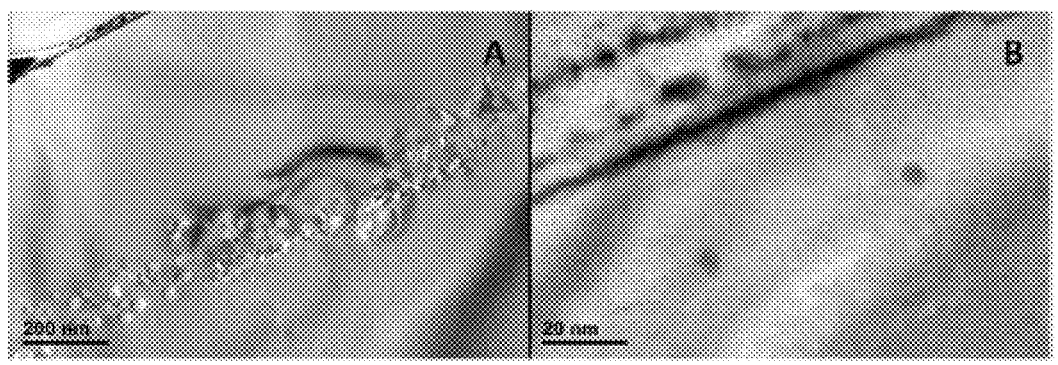
FIGS. 17A-17B are transmission electron micrograph cross-sections of sample Au13.

Transmission electron micrographs showing overviews of damaged layer and small nanoparticles near the Si surface are shown in FIGS. 16A-16B (sample Au12) and 17A-17B (sample Au13). FIG. 16A is an overview of surface and defect band that does not appear to contain void in Au12. FIG. 16B is higher resolution micrograph showing possible small nanoparticles formed in the near-surface region in Au12. FIG. 17A is an overview of surface and void region in Au13. FIG. 17B is higher resolution micrograph showing small nanoparticles formed near the surface in Au13. The effect on void size due to annealing at 650° C., in FIG. 16A, and 800° C., in FIG. 17A, is significant. Lower temperature does not evolve voids or anneal out most of the disorder, whereas higher temperature creates large voids and anneals out other defects besides dislocations. The nanoparticles formed near the Si surface shown in FIG. 16B are spherical and less than 1 nm diameter, and those formed in FIG. 17B are spherical and around 2 nm diameter. Transmission electron micrographs and RBS data, shown in FIGS. 15A-15B, show that there are voids, at least in Au13, and an abundant amount of Au diffused into Si substrate, but no Au is trapped in voids.

One strategy to limit the excess Au atoms that diffuse into Si because of heat treatment is to implant low energy Au ions into Si wafers after defect annealing instead of depositing a film on the surface, thereby limiting the amount of Au in the system. Samples Au17-35 are irradiated with 60 keV Au ions to fluence $1\times10^{15}$ cm$^{-2}$ in order to limit the number of Au atoms available to diffuse into Si.

Figure 18:
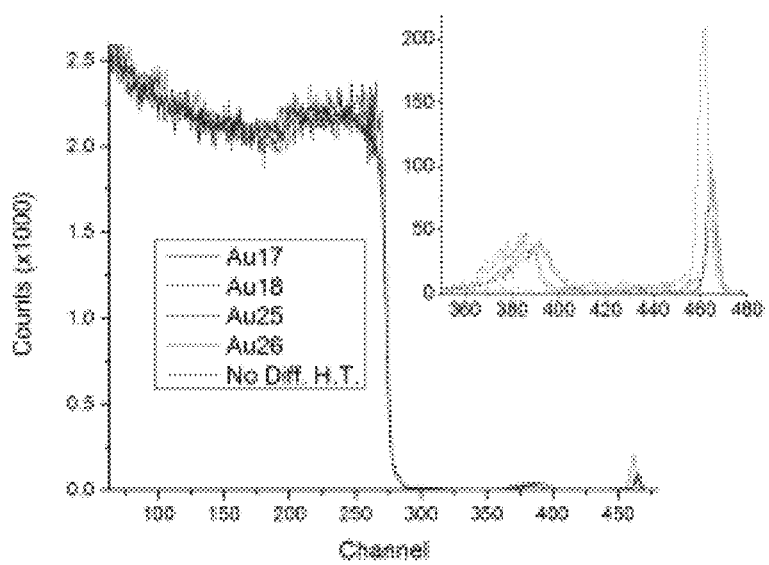
FIG. 18 is a graph of Rutherford backscattering spectra from samples Au17, -18, -25 and -26.

RBS spectra obtained in random mode from samples Au17, -18, -25 and -26 are shown in FIG. 18. Samples Au17 and -18 have been irradiated with $1\times10^{17}$ cm$^{-2}$ and samples Au25 and -26 with $5\times10^{16}$ cm$^{-2}$ 100 keV He ions. Defect annealing for two hours is performed at 950° C. for Au17 and -25, and 750° C. for Au18 and -26. Inset shows channel range which has backscattering yield from Au atoms in Si. The curve labeled "No Diff. H.T." is taken from a Si sample irradiated with Au ions but not heat treated to cause Au diffusion, and shows distribution of irradiated Au ions. The rest of the curves show that a portion of irradiated Au remains near surface and a portion diffuses to voids. Another feature of these curves is the odd shape of the Si backscattering yield.

Figure 19:
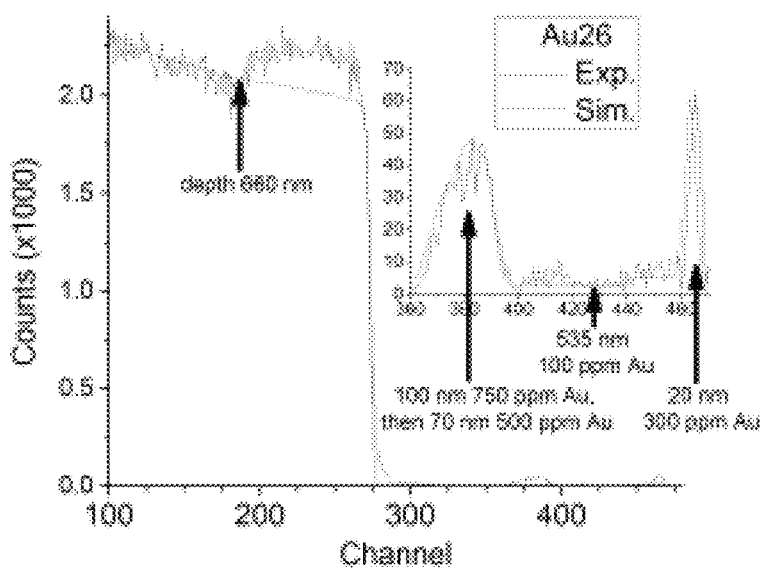
FIG. 19 shows the simulated and experimental Rutherford backscattering spectra from samples Au26.

FIG. 19 shows the random RBS spectrum from sample Au26 plotted with a simulated RBS spectrum obtained using the RBX simulation code [39]. The thicknesses and concentrations of Au layers extracted by simulation are estimates based on assumption of bulk density of Au (19.30 g cm$^{-3}$) and that the only two elements measured are Au and Si. The simulation shows that there is a region 170 nm wide where Au is trapped. One feature not accurately described by the simulation is Si from surface to depth 660 nm, near the projected range of He ion irradiation. Either this surface layer of Si has higher density than bulk Si or the voided layer has significant depletion of Si, or both. If there is a depletion of Si, it is not symmetric and extends beyond projected range of He ion irradiation.

Figures 20A, 20B, 20C, 20D:
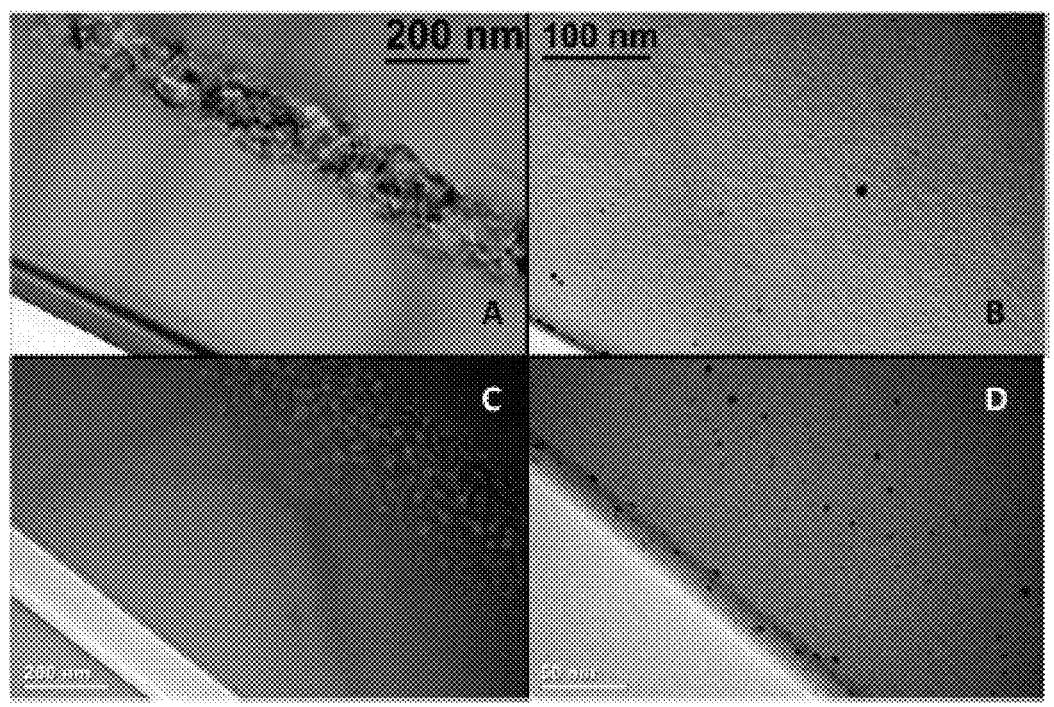
FIGS. 20A-20D are cross-sectional transmission electron micrographs of surface and void regions of samples Au26 and Au18 implanted with 100 keV He ions to fluences $5 \times 10^{16}$ cm$^{-2}$ and $1 \times 10^{17}$ cm$^{-2}$, respectively.

Transmission electron micrographs showing surface through void region of samples Au26 and -18 are shown in FIGS. 20A and 20C, respectively. The difference between the two samples is Au26 has lower He ion irradiation fluence than Au18 by a factor of two ($5\times10^{16}$ cm$^{-2}$ vs. $1\times10^{17}$ cm$^{-2}$). The significantly decreased width of the void layer in FIG. 20A compared to 20C reflects this difference. The near surface regions of Au26 and -18 are shown in FIGS. 20B and 20D, and nanoparticles are created in this region in both samples. According to RBS spectra in FIG. 18, Au26 and -18 have similar quantity of Au atoms throughout depth of interest, except Au26 has slightly more Au trapped in void layer than Au18. Despite the number of nanoparticles observed near the surface, and Au trapped in void layer measured by RBS, no nanoparticles are observed in void layer. Monolayer or less coverage of voids near projected range of He ion irradiation is likely.

Figure 21:
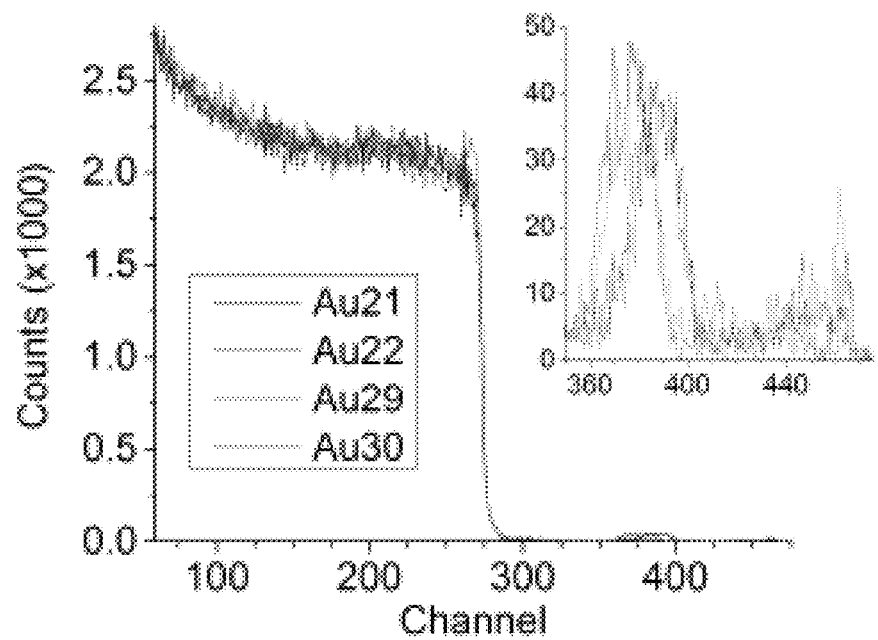
FIG. 21 is a graph of Rutherford backscattering spectra from samples Au21, -22, -29 and -30.

Trapping of Au atoms in void layer in samples Au21, -22, -29 and -30 is large according to FIG. 21, larger than trapping observed for samples Au17, -18, -25 and -26 in FIG. 18. The difference between the sets of four samples is that Au21, -22, -29 and -30 are annealed for 20 minutes, whereas Au17, -18, -25 and -26 are annealed for two hours. Therefore, samples shown in FIG. 21 have more residual defects. Diffusion of Au is greater for lower thermal budget defect annealing compared to higher thermal budget defect annealing, shown by increased trapping of Au in void layer and dramatically decreased retention of Au atoms at Au ion irradiation range.

Figures 22A, 22B:
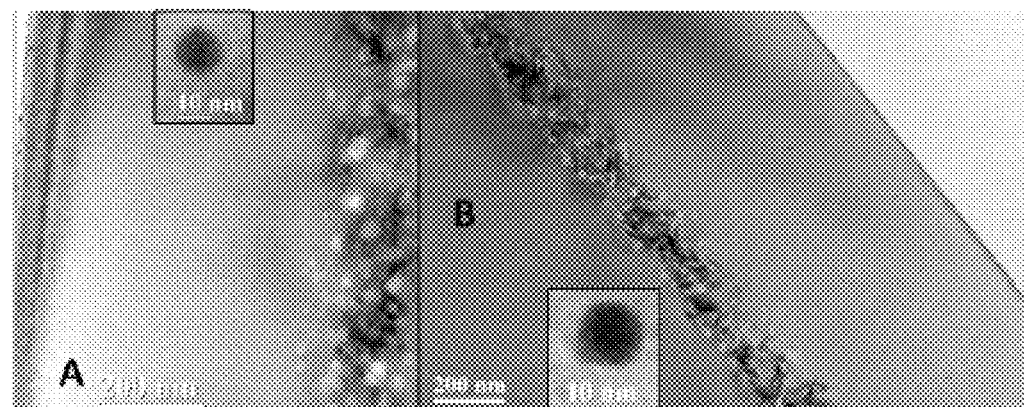
FIGS. 22A-22B are cross-sectional transmission electron micrographs of samples A Au25 and B Au29 implanted with 100 keV He ions to fluence $5 \times 10^{16}$ cm$^{-2}$ and annealed at 950° C. for two hours and 20 minutes, respectively.

Transmission electron micrographs from two samples irradiated with 100 keV He ions to fluence $5 \times 10^{16}$ cm$^{-2}$ followed by defect annealing at 950° C. for two hours and 20 minutes are shown in FIGS. 22A and 22B, respectively. The band of defects at projected range of 100 keV He ion irradiation created by longer annealing time in FIG. 22A has more voids and fewer dislocation-type defects than defect band created by shorter annealing time in FIG. 22B. Insets in each micrograph contain nanoparticles that are formed near the surface, and longer annealing time creates larger near-surface nanoparticles. However, similar to other cases, Au trapping determined by RBS does not result in nanoparticle formation in void region, indicating that small amount of Au is trapped in each void or trapped in other types of defects.

In general, voids are difficult to image using TEM. However, changing the focusing condition of the transmitted electron beam increases the Fresnel contrast of edges of voids. The method used to image voids is generally referred to as the under-focus over-focus method, named for progression of micrographs in under-focused, in-focus and over-focused conditions that is used to determine void location and size. In the case of TEM results shown from samples investigated thus far, voids are relatively easy to image because of known location and high density.

Figures 23A, 23B, 23C:
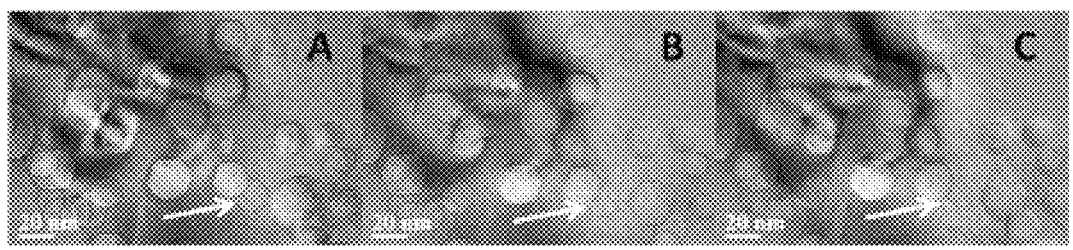
FIGS. 23A-23C are cross-sectional transmission electron micrographs of sample Au29 in under-focused (FIG. 23A), in focus (FIG. 23B), and over-focused condition (FIG. 23C)

Analysis by RBS in random mode shows that measurable amount of Au atoms are trapped in void layers, but does not indicate what defects are trapping Au atoms. The question of coverage of inner surfaces of voids with thin layers, even monolayers or less, with Au atoms is not resolved by TEM results already displayed. FIGS. 23A-23C show a series of micrographs obtained with electron beam under-focused (FIG. 23A), in-focus (FIG. 23B), and over-focused (FIG. 23C). If there is no thin layer of Au, then each void should be almost invisible in micrograph that is in-focus, and contrast should be greater when micrograph is slightly out-of-focus. Of all voids shown in region probed by micrographs in FIG. 23A-23C, the only one which exhibits normal void contrast is indicated by white arrow. It is almost spherical. There are a number of other voids that either do not exhibit the same behavior or are not spherical or both. One possible reason for the expected contrast change to be exhibited by one void and no others is that no other voids are located at the same position in the specimen with respect to the electron beam. However, there are many voids and this seems unlikely. The under-focus over-focus analysis does not prove that some voids have monolayer of Au adsorbed on inner surfaces, but it does show that contrast changes normally associated with changing electron beam focusing conditions are not followed by at least some voids.

Figure 24A:
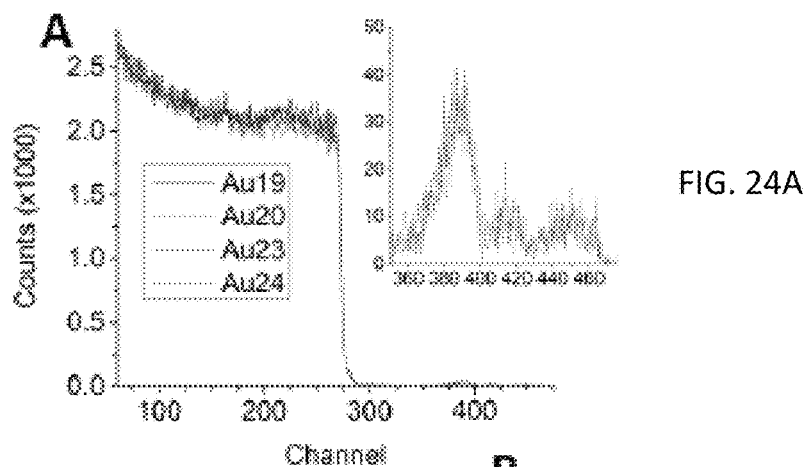
FIGS. 24A-24B are graphs of Rutherford backscattering spectra showing Au trapped in samples A Au19, -20, -23, and -24 and B Au27, -28, -31 and -32.
Figure 24B:
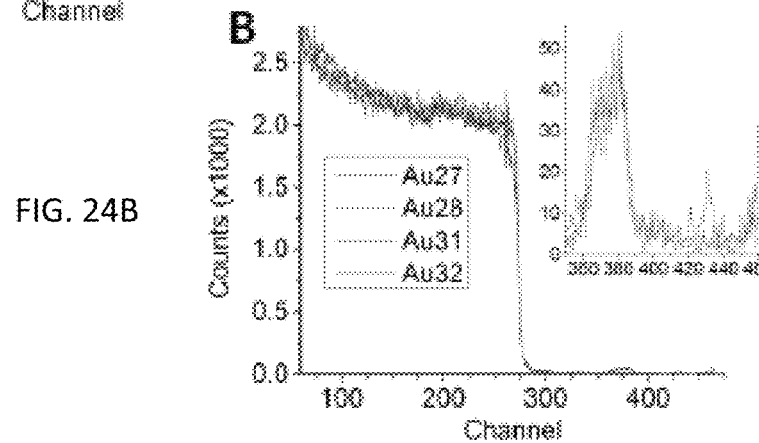

The diffusion of Au atoms in samples that have defects annealed at 350 and 550° C. for 20 minutes or two hours following He ion irradiation are shown in FIGS. 24A-24B. All samples are irradiated with 100 keV He ions to fluences A $1 \times 10^{17}$ or B $5 \times 10^{16}$ cm$^{-2}$. Sample Au27, in FIG. 24B, shows an unusual tri-modal Au distribution instead of the normal bi-modal distribution expected from near-surface irradiation and buried Au trapping layer. The tri-modal distribution, also seen less conclusively in random RBS spectra in FIG. 24A, indicates that there is an intermediate defect peak, possibly at depth corresponding to one-half the projected range of He ion irradiation ($R_p/2$), that traps Au atoms diffusing from near-surface. The irradiation fluence of four samples shown in FIG. 24A is factor of two greater than four samples shown in FIG. 24B, so quantities of residual defects in each of four samples in FIG. 24A are greater than counterparts in FIG. 24B. Of all eight samples with RBS data displayed in FIGS. 24A-24B, sample Au27 has lowest He ion irradiation fluence, $5 \times 10^{16}$ cm$^{-2}$, and highest thermal budget of defect annealing, 550° C. for two hours. Sample Au19 has same defect annealing thermal budget but higher He ion irradiation fluence. Weak intermediate Au trapping peak is observed in FIG. 24A from four samples with most defects, and strong intermediate Au trapping peak is observed in sample Au27, which has the least residual point defects of any of eight samples shown in FIGS. 24A-24B. Low temperature defect annealing and the observed intermediate Au trapping peak are of little utility to the stated goals of this project, but should be studied for sake of understanding intermediate $R_p/2$ defect behavior. No TEM specimens are made of any samples investigated by RBS in FIGS. 24A-24B which could elucidate this question.

Figure 25:
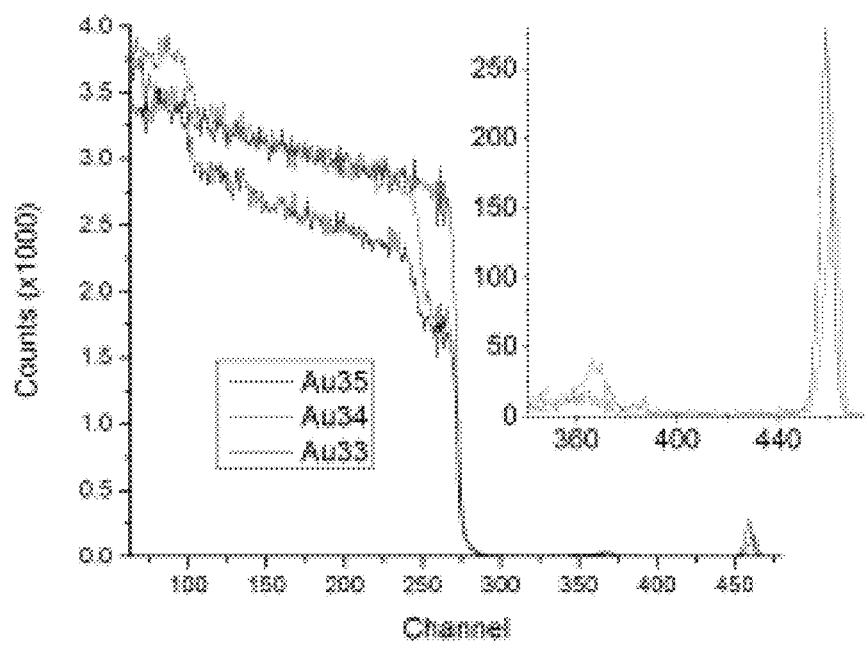
FIG. 25 is a graph of Rutherford backscattering spectra showing Au trapped in samples Au33, -34 and -35.

Samples Au33-35 are irradiated with decreasing He ion irradiation fluence in order to limit the number of Au trapping sites in order to achieve nanoparticles with measurable size at projected range of 100 keV He ions. Random RBS spectra in FIG. 25 obtained from these samples show that appreciable Au trapping in void region is limited to sample Au33, and extremely limited amount of Au is trapped in void region in samples Au34 and -35. RBS curves of samples Au34 and -35 also show significant surface contamination, indicated by decreased yield of Si and increased yield of O at surface. Sample Au34 has a thin oxidized surface layer, but sample Au35 has surface oxide layer more than 1 μm thick. The effect of oxidation on diffusion of Au is not known. The samples have identical fabrication parameters except for decreasing fluence of 100 keV He ions: Au33 $1 \times 10^{16}$, -34 $1 \times 10^{15}$ and -35 $1 \times 10^{14}$ cm$^{-2}$. Ion fluences of $1 \times 10^{15}$ and $1 \times 10^{14}$ cm$^{-2}$ do not cause Au atoms to diffuse from surface into bulk, based on comparison with "No Diff. HT" curve in FIG. 18.

Figure 26:
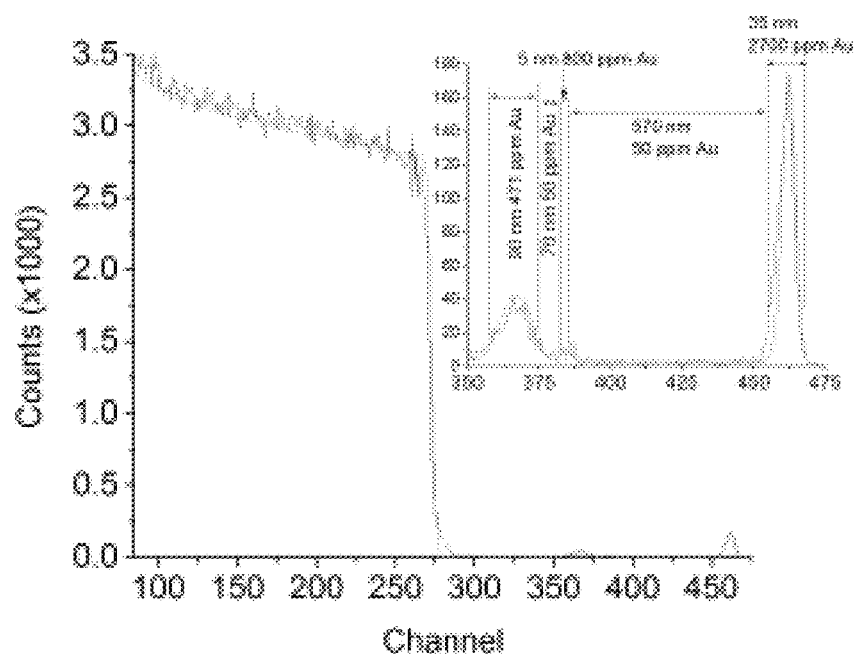
FIG. 26 are graphs of simulated and experimental Rutherford backscattering spectra from sample Au33.

Spectrum of sample Au33 shows that there is no surface oxidation, Au atoms are trapped at an intermediate position between projected ranges of Au and He ion irradiation near to void layer, and that Au diffuses from near-surface to void layer. The experimentally obtained random RBS spectrum is simulated using RBX, and simulated and experimental spectra are plotted in FIG. 26. The thicknesses extracted by simulation are based on assumption that Au nanoparticles have bulk density of 19.30 g cm$^{-3}$. The comparison of simulated spectrum assumes only Si and Au are present in sample Au33, and that Au atoms have bulk Au density. Layer thicknesses and concentrations of Au are estimates. The backscattering from Si shows that there are no variations in density of Si throughout depth of interest and beyond, unlike sample Au26 shown in FIG. 19. The region with significant amount of Au trapping is 90 nm wide, according to simulation.

Figures 27A, 27B, 27C:
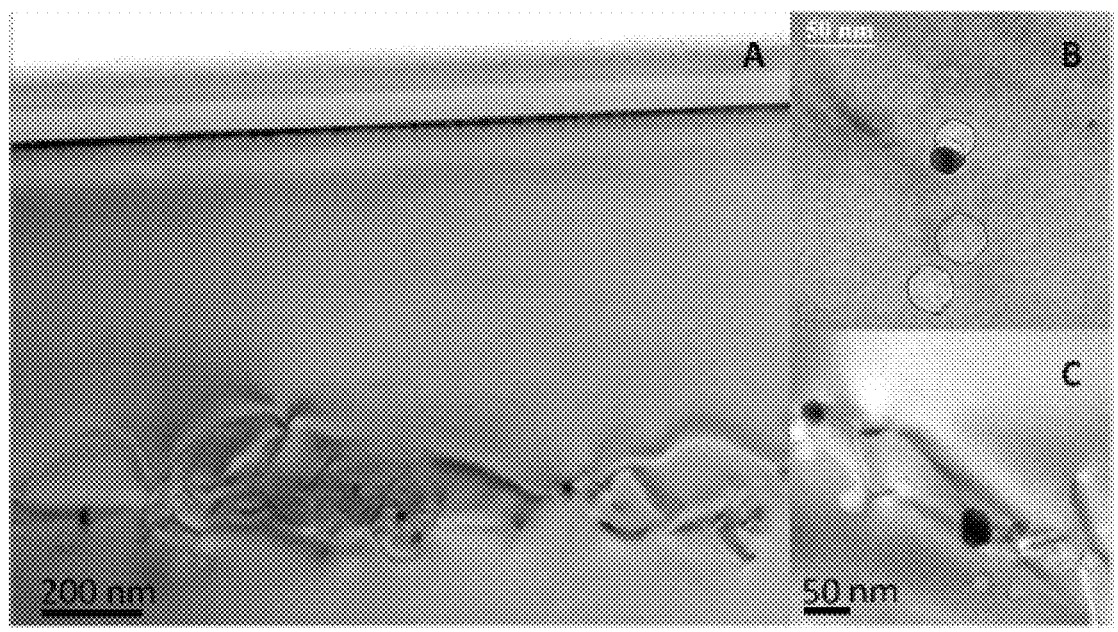
FIGS. 27A-27C are cross-sectional transmission electron micrographs of sample Au33 overview (FIG. 27A), void partially filled with Au atoms (FIG. 27B), and voids fully filled with Au atoms (FIG. 27C)

FIGS. 27A-27C contain micrographs from Au33 cross-sectional TEM specimen. The overview micrograph, FIG. 27A, shows some small particles with dark contrast interspersed in dislocations. Micrographs in FIGS. 27B and 27C show partially and fully filled nanoparticles, respectively, surrounded by voids. No nanoparticles are observed near the surface, as in several other samples shown previously. Gold atoms decorate voids in void layer.

Figures 28A, 28B:
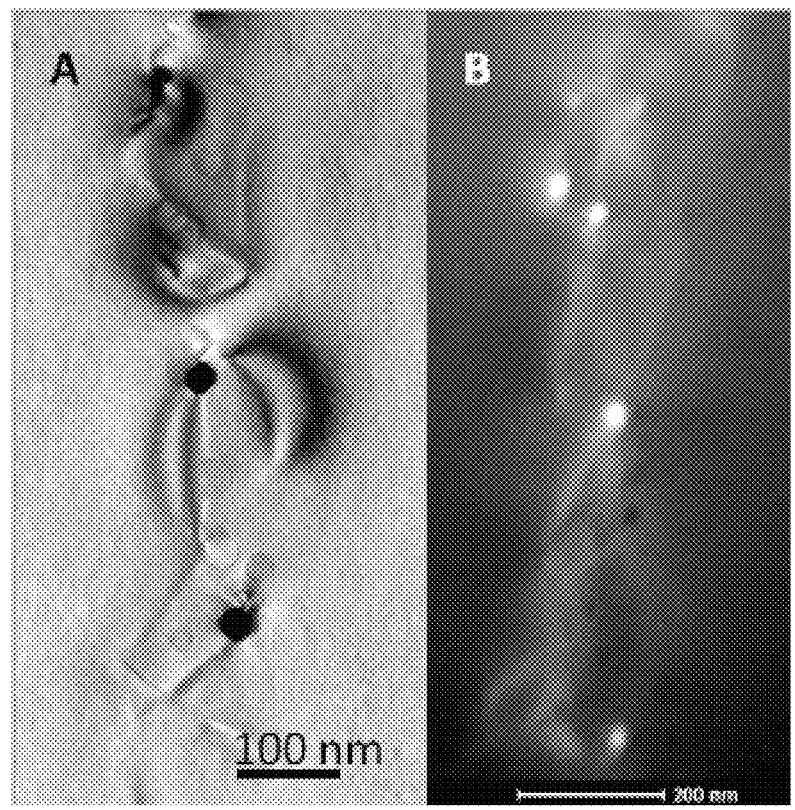
FIGS. 28A-28B are a cross-sectional transmission electron micrograph (FIG. 28A) and a scanning transmission electron micrograph (FIG. 28B) of sample Au33.

The nanoparticles in sample Au33 are examined in more detail by additional electron microscopy techniques to determine elemental composition and, if possible, crystallographic structure of nanoparticles and surrounding silicon host material. Comparison of TEM and scanning TEM in FIGS. 28A-28B indicate that dark particles in bright-field TEM contain high-Z material (FIG. 28A), and that more high-Z material is dispersed throughout the void layer. Voids are clearly seen in STEM (FIG. 28B) as large holes with dark contrast. The source of hazy, dispersed secondary electrons is assumed to be Au atoms trapped at defects other than voids or nanoparticles, but the nature of these defects is not known.

Figures 29A, 29B, 29C:
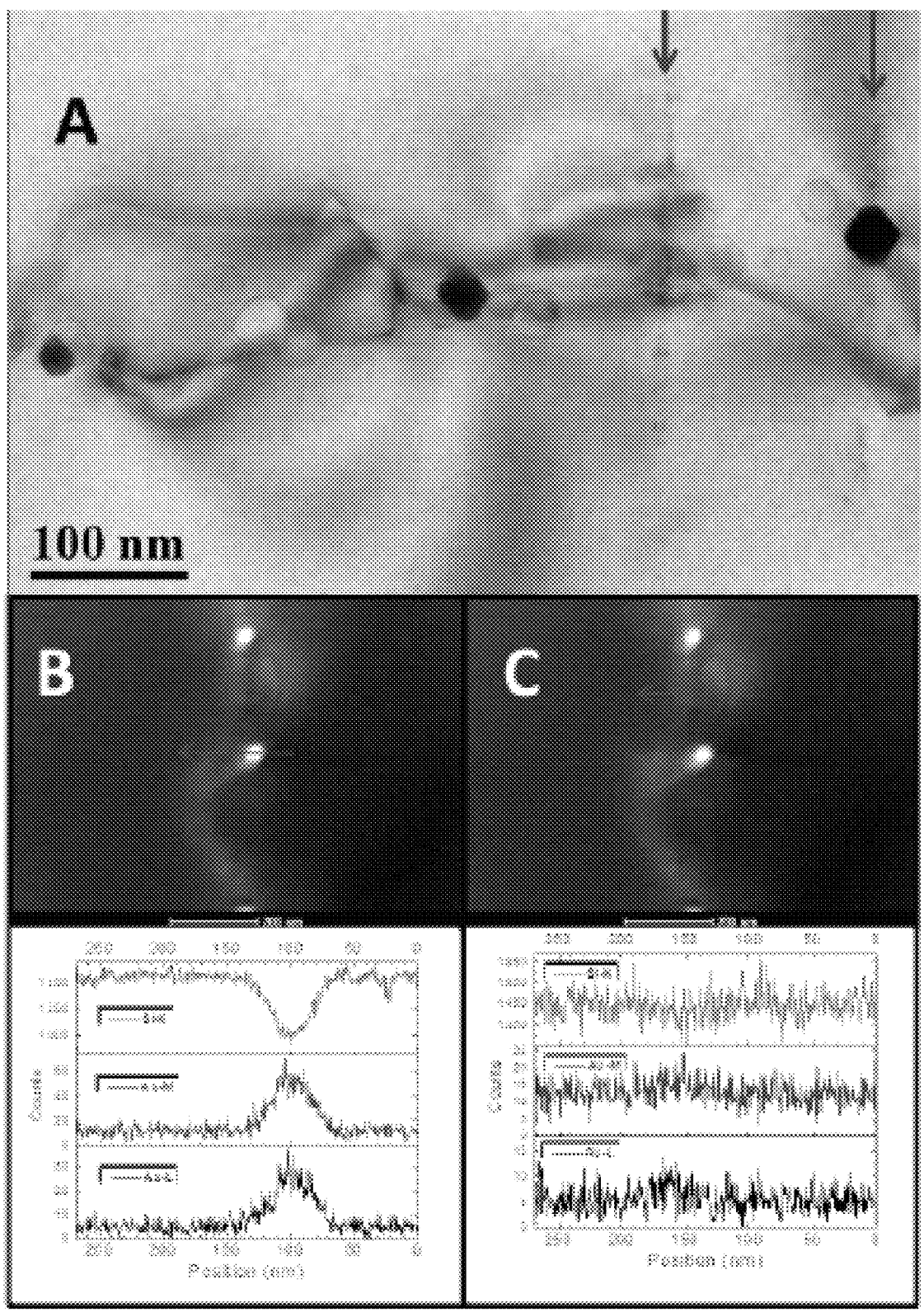
FIGS. 29A-29C are a cross-sectional TEM (FIG. 29A) and scanning TEM and energy dispersive X-ray yields of Si—K, Au-M and Au-L lines of high-Z nanoparticle adjacent to dislocation and dilute high-Z area (FIG. 29B) and void adjacent to a dislocation in dilute high-Z area (FIG. 29C)

Presence of Au is confirmed by energy-dispersive X-ray spectroscopy (EDS). FIGS. 29A-29C contain a transmission electron micrograph with two red arrows showing the damage caused by line scans of the electron beam across two features collected in scanning mode (FIG. 29A): a nanoparticle (FIG. 29B) and a void and dislocation (FIG. 29C). Scanning transmission electron micrographs, where the image is formed by highly scattered or secondary electrons collected by a high-angle annular dark field (HAADF) detector, are shown in FIGS. 29B and 29C, and X-ray yield collected right-to-left from each position of the energy-dispersive X-ray spectroscopy (EDS) line scans indicated by red arrows are displayed in bottom panes. X-ray yields with characteristic energies of Si—K, Au-M and Au-L shells are plotted. The energies of the Au-M electron shells are 2.21-3.42 keV, for Au-L 11.2-14.4 keV, and for Si—K 1.84 keV [64, 33]. The transmission electron micrograph is obtained following scanning TEM and EDS collection, and the damage from focusing intense electron beam at each position indicates position and breadth of each line scan.

The EDS line scan across the nanoparticle in FIG. 29B is straight-forward to interpret: Au atoms are trapped in void, and the large yield of Au-M and Au-L characteristic X-rays confirms this. Accompanying the presence of Au is depletion of Si—K characteristic X-rays, showing that Au replaces Si for a portion of the thickness of the TEM specimen. However, there is another effect that causes Si characteristic X-ray yield to be reduced even further. The electron beam penetrates the specimen ejecting electrons from the K-shell of Si atoms, and some fraction of the characteristic X-rays are emitted into the solid angle subtended by the HAADF detector. X-rays emitted from Si electron shells that have to penetrate Au nanoparticle have lower probability of being collected in HAADF detector than X-rays that do not have to penetrate Au, so the apparent Si atom concentration appears lower in the region with Au nanoparticle. The Au nanoparticle shields Si atoms lying beyond it from the electron beam, and shields the HAADF detector from some characteristic X-rays emitted from Si atoms.

The EDS line scan across the void in FIG. 29C is challenging to interpret. There exist in this sample fully- and partially-filled nanoparticles, voids that may or may not have monolayer coverage of Au atoms on inner surfaces, and dislocation lines and loops. Gold atoms trapped in dislocations would cause sharp increase in Au-L or -M characteristic X-ray yield, and lack of such a signature indicates no highly localized Au trapping. Small increase in Au characteristic X-ray yield indicates the presence of Au atoms is related to the strain in the system due to irradiation induced defects and/or nanoparticles and voids. The barely measurable Au enrichment across a wide region indicates that the source measured Au atoms are not trapped in dislocations, but rather diffusion trapped in point defects or some other defects. One possible explanation is that Au atoms are diffusing into or out of Au nanoparticles because the final processing parameter, annealing at 750° C. for two hours, is not optimized to form Au nanoparticles.

Figures 30A, 30B:
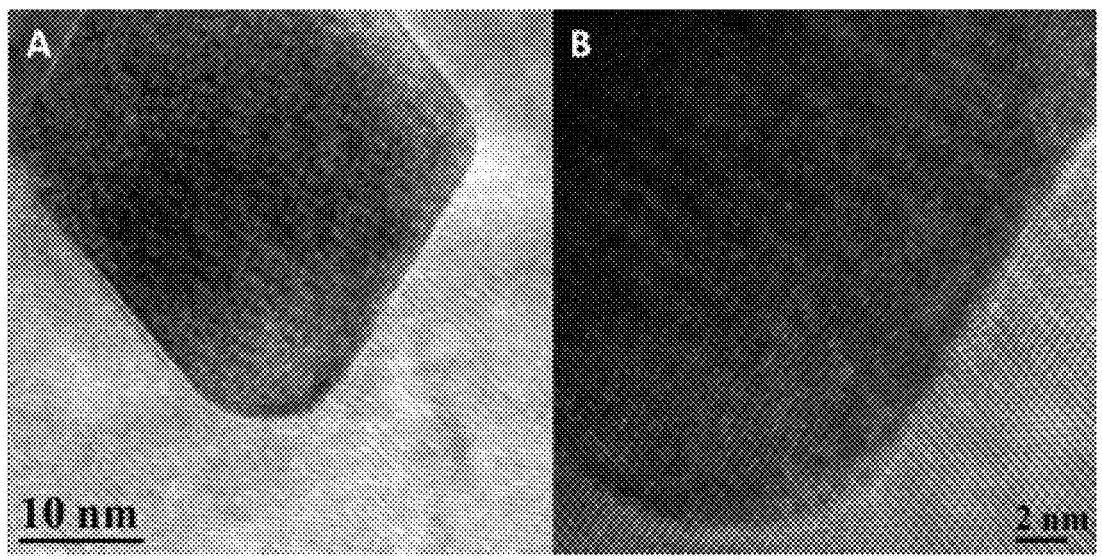
FIGS. 30A-30B are high-resolution cross-sectional transmission electron micrographs of nanoparticle in sample Au33 showing Au/Si interface.

High-resolution micrographs of one Au nanoparticle in sample Au33 are shown in FIG. 30A-30B. Individual atomic planes of silicon are visible, and extend into the nanoparticle region. However, the atomic planes that extend without any deviation from silicon region into nanoparticle region are from pure silicon surrounding the nanoparticle. Unfortunately, no definitive crystallographic data determining the atomic structure of Au atoms in Au nanoparticles have been obtained. From FIGS. 30A-30B, it can see that there are no great distortions in silicon atomic planes near to the Au nanoparticle, and that it has a sharp interface. Furthermore, recognizing that the zone axes of these two micrographs are near to [011] the nanoparticle shape is bound by (111) and (100) planes.

In samples Au1-4, it is clear that Au readily diffuses into Si from a film on the surface. The diffusion is probably enhanced by defects created by He ion irradiation. Voids are created, but other point defects and extended defects clearly present a greater number of more stable trapping sites for Au atoms, so no Au trapping in void layer is observed.

Samples Au5-10 undergo heat treatment at temperatures ranging from 350-850° C. without defect annealing. For the temperature range from 350-550° C., the simple case of increasing temperature causing increased diffusivity causes increased diffusion. However, as temperature increases from 550-650° C. and so on, point defect recombination becomes progressively more important with increasing temperature, and diffusion decreases. Gold diffusion in silicon is mediated by silicon point defects, interstitials and vacancies, so annihilation of point defects at higher temperatures decreases Au diffusion.

Based on RBS results of comparing samples Au11-13 and Au14-16, changing the order of high temperature and low temperature heat treatments probably had a significant effect on the results, rendering the comparison of these sets of samples weak and uninformative.

Significant diffusion of Au is observed for samples Au1-16, but no trapping of Au in void layer is observed. Deposition of Au on surface in thick film introduces excessive amount of Au into Si, and trapping by open-volume defects is not observed following diffusion heat treatment.

Irradiation with small fluence of low energy Au ions controllably introduces Au into Si samples. Trapping of Au atoms in void layer is observed for samples Au17-32, but no nanoparticles are observed. Additional odd Au trapping behavior is also noted, such as strong trapping at an intermediate peak in sample Au27. However, investigation by TEM shows that no nanoparticles are formed as a consequence of Au trapping observed by random RBS spectra for samples Au17-32. Decreasing He ion irradiation fluence by factor of five, to $1 \times 10^{16}$ cm$^{-2}$, accompanied by maximum thermal budget for defect annealing accomplishes nanoparticle formation at projected range of He ion irradiation. However, further decreasing ion irradiation fluence by one order of magnitude did not accomplish nanoparticle formation.

Gold is contained in nanoparticles formed in sample Au33, evidenced by characteristic X-rays emitted by excitation with electron beam. Other locations of trapped Au could not be determined, but it is likely that dislocations do not contribute to significant amount of Au trapping. High-resolution TEM shows that Au nanoparticles have sharp interface with Si, and that Si surrounding nanoparticles is not strained. However, the atomic structure of Au nanoparticles has not been determined.

The decoration of voids in silicon by silver atoms will now be discussed. Irradiation species, fluence and defect annealing temperature are chosen so that low density of voids are nucleated free of helium and other chemical bonding that grow to sizes of few tens of nanometers accompanied by minimum amount of dislocations [28, 68, 59]. Silver atoms are diffused from the substrate surface and chemisorbed on the inner surface of voids in silicon. Nanoparticles are formed with size up to 40 nm. A range of fully filled nanoparticles, not accompanied by free volume, and partially filled nanoparticles, with widely vary free volume, are observed adjacent to each other.

The method to fabricate nanoparticles by chemisorption onto an inner surface consists of three steps: create open volume defects in a suitable material, deposit immiscible metal on surface, and diffuse metal into defects. Voids are preferred open-volume defect in this research. For all samples deposited with Ag, ion irradiation fluence is $5 \times 10^{15}$ cm$^{-2}$, except for Ag10-12 and Ag15-17, which are irradiated with 1 and $10 \times 10^{15}$ cm$^{-2}$ 100 keV He ions, respectively. Voids nucleate and grow by defect annealing at high temperature. Samples Ag1-8 and Ag18-27 are annealed in quartz tube furnace with flowing ultra-high-purity Ar gas at 950° C. for 10, 30, 60 or 90 minutes. Details of samples Ag1-8 are found in Table 4 and Ag18-27 in Table 5. Samples Ag9-17 are annealed in different quartz tube furnace, designed to be ultra-high vacuum atmosphere, at 927° C. for 1, 3.5 or 5 hours, and details of individual samples can be found in two tables.

TABLE 4

Summary of defect annealing (D.A.) and diffusion heat treatment (Diff H.T.) conditions

| Label | D.A. Time (min.) | Diff. H.T. Time (hr.) | Atmosphere |
|---|---|---|---|
| Ag1 | 10 | 1 | UHP Ar |
| Ag2 | 10 | 2 | UHP Ar |
| Ag3 | 30 | 1 | UHP Ar |
| Ag4 | 30 | 2 | UHP Ar |
| Ag5 | 60 | 1 | UHP Ar |
| Ag6 | 60 | 2 | UHP Ar |
| Ag7 | 90 | 1 | UHP Ar |
| Ag8 | 90 | 2 | UHP Ar |
| Ag9 | 210 | 2 | Mixed |

All samples are implanted with $5 \times 10^{15}$ cm$^{-2}$ 100 keV He ions before defect annealing, and 100 nm Ag deposited by evaporation on sample surface before diffusion heat treatment. For Ag1-6, approximately 110 nm of Ag is deposited before diffusion heat treatment. The indicated annealing atmosphere applies to both defect annealing and diffusion heat treatment. Defect annealing temperature is 950° C. for samples Ag1-8, and 927° C. for sample Ag9, and diffusion heat treatment temperature is 750° C. for all samples in this table.

TABLE 5

Ion fluence, defect annealing (D.A.) and diffusion heat treatment (D.H.T.) parameters

| Label | Fluence (cm$^{-2}$) | D.A. Time (hr.) | D.H.T. Time (hr.) | D.H.T. Temp. (° C.) |
|---|---|---|---|---|
| Ag10 | $1 \times 10^{15}$ | 1 | 2 | 750 |
| Ag11 | $1 \times 10^{15}$ | 3.5 | 2 | 750 |
| Ag12 | $1 \times 10^{15}$ | 5 | 2 | 750 |
| Ag13 | $5 \times 10^{15}$ | 1 | 2 | 750 |
| Ag14 | $5 \times 10^{15}$ | 5 | 2 | 750 |
| Ag15 | $1 \times 10^{16}$ | 1 | 2 | 750 |
| Ag16 | $1 \times 10^{16}$ | 3.5 | 2 | 750 |
| Ag17 | $1 \times 10^{16}$ | 5 | 2 | 750 |
| Ag18 | $5 \times 10^{15}$ | 0.5 | 0.17 | 750 |
| Ag19 | $5 \times 10^{15}$ | 0.5 | 0.5 | 750 |
| Ag20 | $5 \times 10^{15}$ | 0.5 | 0.17 | 650 |
| Ag21 | $5 \times 10^{15}$ | 0.5 | 0.5 | 650 |
| Ag22 | $5 \times 10^{15}$ | 0.5 | 1 | 650 |
| Ag23 | $5 \times 10^{15}$ | 0.5 | 2 | 650 |
| Ag24 | $5 \times 10^{15}$ | 0.5 | 0.17 | 550 |
| Ag25 | $5 \times 10^{15}$ | 0.5 | 0.5 | 550 |
| Ag26 | $5 \times 10^{15}$ | 0.5 | 1 | 550 |
| Ag27 | $5 \times 10^{15}$ | 0.5 | 2 | 550 |

All samples are implanted with 100 keV He ions before defect annealing to indicated fluence. After defect annealing, 100 nm Ag was deposited by evaporation on the substrate surface. Leaks in vacuum furnace during defect annealing at 927° C. are suspected to have seriously altered results of samples Ag10-17. Diffusion heat treatment carried out in flowing UHP Ar gas for diffusion heat treatment of Ag10-17. Samples Ag18-27 were annealed and heat treated in flowing UHP Ar gas.

The Ag—Si eutectic temperature is 830° C., greater than diffusion heat treatment temperature [51]. Additionally, equilibrium concentration of Ag in Si is one to two orders of magnitude less than that of Au, so Ag metal is introduced by thin film deposition on surface of Si samples [60]. Evaporation of silver onto silicon surface is performed in BOC Edwards Auto 306 Metal Evaporation Chamber in a clean room. Before loading into metal deposition chamber, samples are sequentially dipped in baths of acetone for 15 seconds and isopropanol for 10 seconds then solvents evaporated by blowing dry $N_2$ gas. This process is repeated one additional time. Samples are mounted on glass slide and stored in desiccator for 15 minutes, then exposed to vapor emitted from open bottle of HF acid for approximately 10 seconds each to etch oxide layer. Then, samples on glass slide carried to clean room within five minutes of HF acid "vapor etch". Following application of the (acetone-isopropanol-$N_2$)$_2$—HF procedure 100 nm Ag deposited on samples Ag7-8 and 110 nm on Ag1-6 on different dates. Samples deposited with Ag are stored in desiccator. All annealing heat treatments for Ag1-8 are performed within two days of metal deposition at 750° C. for one or two hours in the furnace with flowing UHP Ar gas. The temperature is measured by a thick thermocouple wire in the center of the furnace, and samples are contained in a quartz boat that can be inserted into and withdrawn from the hot zone. All annealing heat treatment times are augmented by two minutes to allow for the samples and boat to heat up to furnace temperature. Approximately one minute is required to insert quartz boat into hot zone of furnace, and approximately three minutes are required to remove quartz boat from furnace hot zone. Approximately two minutes after removal from hot zone, samples and quartz boat cool to less than 100° C. Samples Ag1-8 are not removed from flowing Ar for at least two hours after removal from hot zone.

The thickness monitor was malfunctioning during this Ag film deposition. RBS measurement of samples after deposition determines approximately 500 nm of Ag film is deposited on these samples. Except for Ag film thickness, same procedures and same equipment, including furnace, is used for Ag18-27 and Ag1-8.

The same procedure is performed for samples Ag18-27 as for Ag1-8, with one notable exception. Deposition of Ag is performed in the same location with the same instrument following same surface preparation procedure, but the deposition rate meter is out of service and a different operator performed the deposition. This led to deposition of around 500 nm of Ag on the surface, measured by RBS. This amount of Ag could not be removed by cotton swab and solvent. An etchant was employed containing 1:1:1 $H_2O$: $NH_4OH$:$H_2O_2$. De-ionized water is used, and the concentration of ammonium hydroxide and hydrogen peroxide are each 30%. Samples are placed into 30 mL total of etchant mixture for around 15 seconds followed by two rinses in DI-$H_2O$ for five minutes each. Samples are then dried with dry $N_2$ gas, and rinsed in alternating acetone and methanol baths for five seconds through two iterations before drying again with $N_2$ gas. The etchant mixture is a portion of the "RCA clean", and reportedly carries the risk of depositing Fe on the surface of Si samples. Samples Ag19 and Ag21-23 are etched by this process first, and balance of samples in the Ag18-27 series are etched later.

Samples Ag9-17 are fabricated as described in Tables 4 and 5. The story defect annealing of samples Ag9, -11 and -16 will be shared in detail to illustrate difficulties encountered. These samples are loaded into home-made vacuum furnace, different from the one used for samples Ag1-8 and Ag18-27, and vacuum is poor for a few days following. The vacuum read $7 \times 10^{-8}$ torr and furnace set to 930° C. The target temperature is 927° C. because the furnace could not heat up to desired 950° C. The samples are annealed for 3.5 hours plus two minutes, with actual furnace temperature, measured by thermocouple outside quartz tube near heating elements, ranging from 916-937° C. and pressure ranging from $6.5$-$9.5 \times 10^{-7}$ torr. Following defect annealing, irradiated surfaces appear clean, but on some samples the back surfaces possessed a rainbow-like discoloration.

Samples Ag9-17 are then deposited with 100 nm Ag by physical vapor deposition following surface preparation procedure described above in a deposition chamber. Before diffusion heat treatment was performed, a steadily worsening vacuum leak effecting the home-made vacuum furnace is detected, and furnace is modified slightly into a flowing Ar gas furnace. Diffusion heat treatment is performed with ultra-high purity Ar gas for two hours plus two minutes at 750° C.

The precise role of contamination from leaking vacuum furnace during defect annealing is not known, but it certainly effected every sample in the Ag9-17 series. For this reason, it is believed that fabrication of sample Ag9 can not be repeated.

Cross-sectional TEM specimens of several of Ag9-17 series were fabricated and analyzed by TEM and RBS. Cross-sectional TEM specimens from several of Ag9-17 samples are fabricated by mechanical thinning and dimpling so that the thinnest portion is less than 5 microns thick. Then specimens are ion milled with few-keV Ar ions at glancing angle to achieve thickness required for electron transparency, less than 200 nm. JEOL JEM-2010 electron microscope operating at 200 kV and FEI Tecnai G2 F20 ST FE-TEM operated at 200 kV.

Cross-sectional TEM specimens for samples Ag1-8 are fabricated and analyzed. Specimens are fabricated by the lift-out method using dual-beam scanning electron microscope-focused ion beam using liquid metal Ga source and analyzed using electron microscope operating at 200 kV.

Sample surfaces are prepared for RBS by wiping off excess Ag film remaining on surface. For samples with around 100 nm Ag deposition, wiping with cotton swabs wetted with a solvent such as isopropanol is sufficient to remove Ag. RBS is performed with analyzing beam of 2 MeV He ions, and current is 10 nA or less. Analysis of samples Ag1-8 were performed in an ion accelerator lab. Analysis of samples Ag18-27 by 2 MeV He ion beam in random mode were performed on 1.7 MV tandem accelerator. In both cases, surface barrier detector is placed at 165° backscattering angle in IBM geometry. No RBS analysis is performed on samples Ag10-17.

Samples Ag1-8 are analyzed by RBS and areal density of trapped Ag atoms with background subtracted are extracted by RBS simulation code RUMP. Areal density is converted to thickness of a continuous film of Ag by assuming the density of Ag to that of bulk Ag.

Figures 31A, 31B, 31C, 31D:
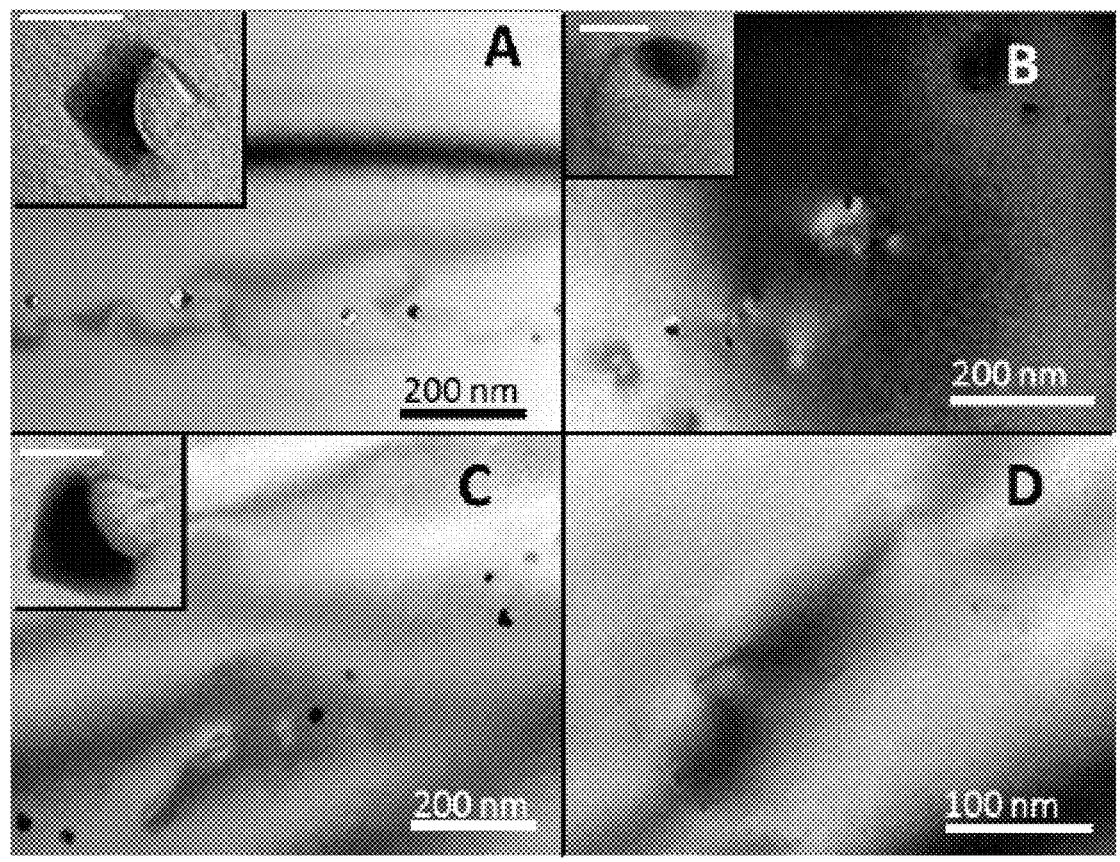
FIGS. 31A-31D are cross-sectional transmission electron micrographs of samples Ag1 (FIG. 31A), Ag3 (FIG. 31B), Ag5 (FIG. 31C) and Ag7 (FIG. 31D)
Figures 32A, 32B, 32C, 32D:
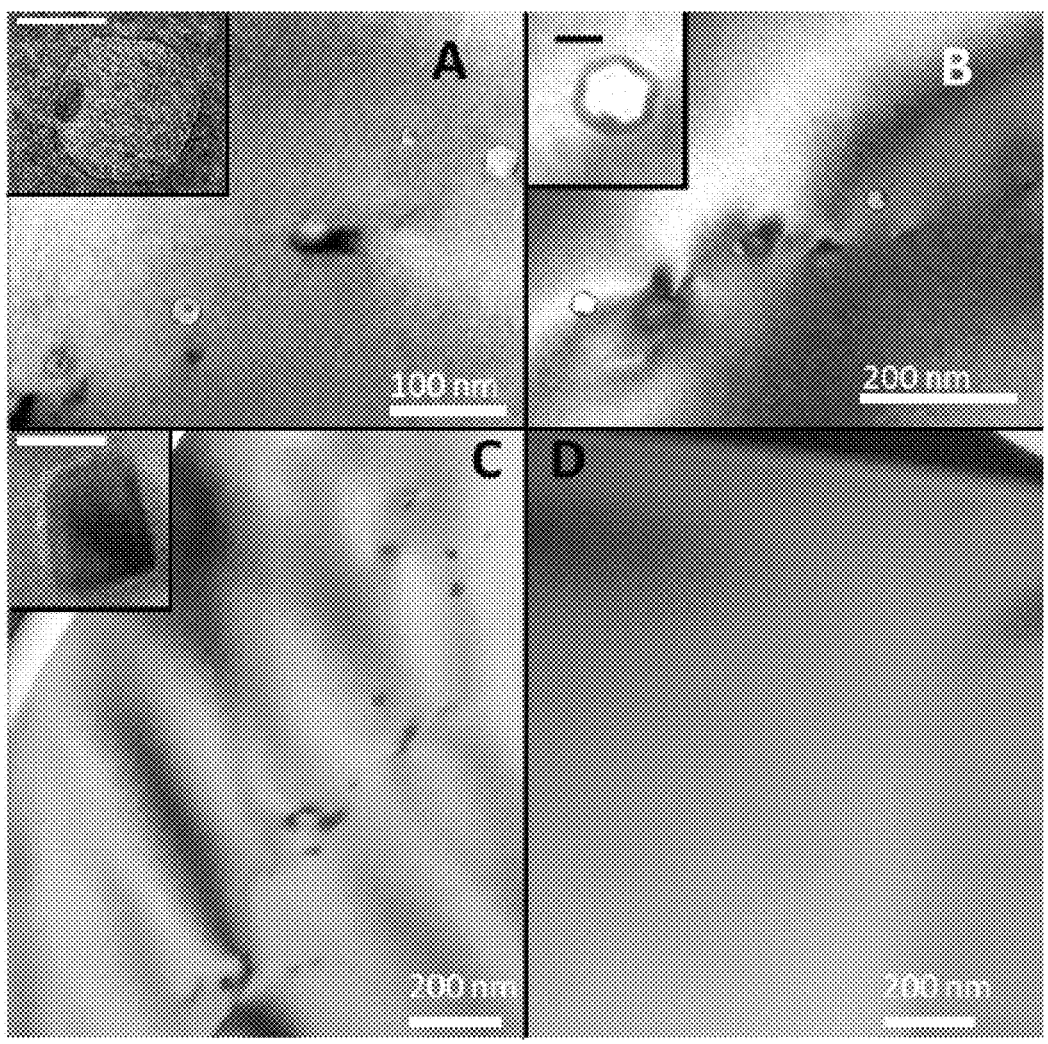
FIGS. 32A-32D are cross-sectional transmission electron micrographs of samples Ag2 (FIG. 32A), Ag4 (FIG. 32B), Ag6 (FIG. 32C), and Ag8 (FIG. 32D)

Samples Ag1-8 are simultaneous investigation of defect annealing and diffusion heat treatment conditions. Transmission electron micrographs of samples Ag1-8 are contained in FIGS. 31A-31D and FIGS. 32A-32D which have varying defect annealing times and diffusion heat treatment times of one and two hours, respectively. Individual nanoparticles from each are expanded in insets, and scale bars in all insets represent 20 nm. More specifically, FIGS. 31A-31D are cross-sectional transmission electron micrographs of samples Ag1 (FIG. 31A), Ag3 (FIG. 31B), Ag5 (FIG. 31C) and Ag7 (FIG. 31D). The diffusion heat treatment condition of all is 750° C. for one hour, but time of 950° C. defect annealing is 10 minutes (FIG. 31A), 30 minutes (FIG. 31B), 60 minutes (FIG. 31C), and 90 minutes (FIG. 31D). FIGS. 32A-32D are cross-sectional transmission electron micrographs of samples Ag2 (FIG. 32A), Ag4 (FIG. 32B), Ag6 (FIG. 32C), and Ag8 (FIG. 32D). The diffusion heat treatment condition of all is 750° C. for two hours, but time of 950° C. defect annealing is 10 minutes (FIG. 32A), 30 minutes (FIG. 32B), 60 minutes (FIG. 32C), and 90 minutes (FIG. 32D).

In FIGS. 31A-31D, features are located at depth near the calculated end-of-range of 100 keV He ions [76]. More Ag is trapped in each nanoparticle in FIGS. 31A and 31C than in FIG. 31B, but nanoparticles in FIG. 31B appear more numerous than in FIG. 31A. Varying amounts of dislocations are observed which roughly correspond with defect annealing time. FIG. 31A contains a number of dislocations in band containing nanoparticles, in FIG. 31B fewer, smaller dislocations and dislocation loops are visible, and in FIG. 31C a few long dislocation lines are visible. Nanoparticles in each inset of FIGS. 31A-31 show that presence of Ag causes change in faceting from equilibrium shape of void in Si to something else [14]. Examination of the partially filled void/nanoparticle complexes reveals that the void sizes vary more than nanoparticle sizes, suggesting that Ag trapping is more heavily dependent on diffusion heat treatment thermal budget than on the initial void size. Partially filled voids result from initial void size distribution and diffusion heat treatment parameters that are not optimized. In FIG. 31D, small nanoparticles, 5 nm diameter or less, are clustered around something that appears to be a dislocation because of the dark, strain-induced contrast. It is not clear if larger nanoparticles formed and then dissolved or if small quantity of Ag atoms are transported by diffusion from the surface and decorate available, small open volume defects.

The features visible in FIGS. 32A-32D are at depth around 650 nm, close to the calculated end-of-range of 100 keV He ions calculated by SRIM binary collision approximation code [76]. Comparison of the defects in the void/nanoparticle band in FIGS. 32A, 32B and 32C exhibit the opposite of the expected trend, where dislocations are visible in FIGS. 32B and 32C but none in FIG. 32A. Small differences exist between FIGS. 32A and 32B, with partially filled void-nanoparticles approximately 30 and 40 nm in diameter and small amount of silver trapped in each, but slightly more in FIG. 32B than in FIG. 32A. Shape of void/nanoparticles in FIGS. 32A and 32B insets are much different than nanoparticle in FIG. 32C inset. Condition Ag8, shown in FIG. 32D, shows no features visible in TEM. The surface is visible at the top, and the field shows beyond the 650 nm depth at which voids, nanoparticles and dislocations should be located.

Faceting of nanoparticles shown in insets of FIGS. 31A-31D and FIGS. 32A and 32B are markedly different. The amount of trapped Ag also differs significantly, so the faceting must result from presence of Ag in the void. Bonding of Ag to Si must be anisotropic, meaning bonding of Ag on some Si crystallographic planes is energetically favorable over others. In this case, faceting results in lowering the system free energy, as it does for faceting of voids in pure materials. Evidence for this can be seen in the profound difference in nanoparticle morphology in FIG. 32C compared to FIGS. 32A and 32B. However, comparison of nanoparticles in FIGS. 31A-31D and FIG. 32C confuses this story a little, and results using more refined experimental techniques are shown below.

The amount of silver atoms trapped in the void region of samples Ag1-8 are measured by RBS and compared according to the defect annealing and diffusion heat treatment times in FIG. 8.3. The number next to each point shows which condition corresponds to that point, e.g. "1" is Ag1, and sample description is contained in Table 4. The left ordinate axis shows the amount of trapped Ag in units of areal density, atoms $cm^{-2}$, the quantity measured by RBS analysis. The right ordinate is areal density converted into the equivalent thickness of silver film with bulk volumetric density, 10.49 g $cm^{-3}$, in angstroms. The right ordinate shows significant mass transport occurs in the diffusion heat treatment, more than 9 nm in Ag6. The trend observed in FIG. 10E defies easy explanation. It is clear that defect annealing and diffusion heat treatment parameters must be optimized. For defect annealing times of 10, 30 and 90 minutes at 950° C., increased diffusion heat treatment time at 750° C. decreases the amount of trapped Ag atoms. Trapping in these cases must be metastable. When defect annealing is 60 minutes at 950° C., trapping of Ag atoms increases when diffusion heat treatment time increases, suggesting trapping in this case is more stable than in defects created by different annealing times.

The trapping of Ag in voids is metastable, which has been shown for void gettering of Au [46]. The defect annealing time has greater effect on the amount of trapped Ag than on the size of individual nanoparticles. Increasing the amount of trapped Ag in each nanoparticle causes the shape of the void containing the nanoparticle to change. The morphology of nanoparticles is effected by amount of Ag trapped and density of voids available for trapping. The amount of Si point defects remaining after defect annealing determine the diffusion of Ag through the fixed distance from surface to voids, possibly by the dissociative mechanism of defect-mediated diffusion discussed for Ag in Si [60]. Comparison of the relative disorder of Si atoms with the Ag trapped by one hour diffusion heat treatment in FIG. 10E shows Si point defects are not proportional to amount of trapped Ag.

Figures 33A, 33B:
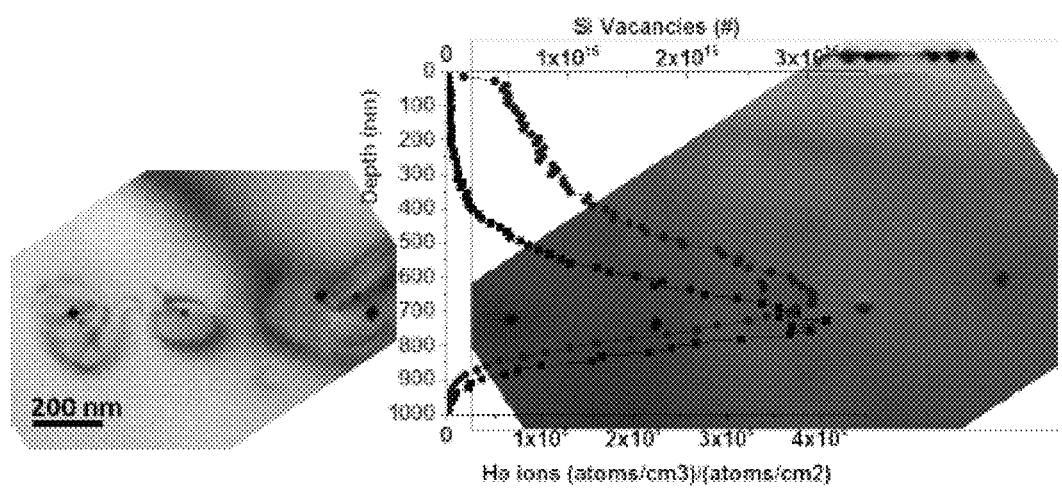
FIGS. 33A-33B are overviews of sample Ag9 aligned with SRIM calculation showing the range of He ions and Si vacancy profile.

FIGS. 33A-33B shows nanoparticles from two regions formed at the end of range of 100 keV He ions [76]. The He ion and Si vacancy profiles are extracted from SRIM binary collision approximation simulations and overlaid. In the micrograph on the right (FIG. 33B), the surface is visible and aligned with plot, and plot length scale applies. In the micrograph on the left (FIG. 33A), a scale bar is included. Nanoparticles with diameters up to 40 nm are shown. Some voids are partially filled with Ag and some are fully filled. Other sources of dark contrast, seen especially in left micrograph, are extended interstitial-type defects such as dislocations.

Figures 34A, 34B:
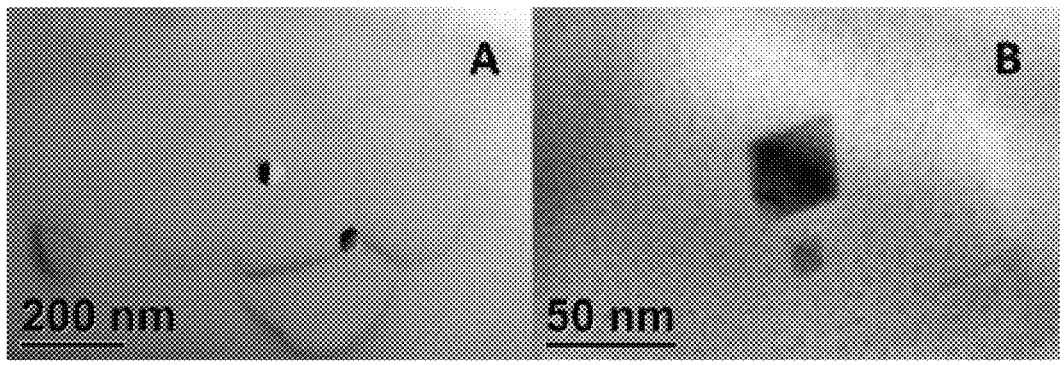
FIGS. 34A-34B are transmission electron micrographs from sample Ag9 showing partially filled (FIG. 34A) and fully filled nanoparticles (FIG. 34B)

FIGS. 34A-34B show higher magnification of nanoparticles from two regions of sample Ag9. In FIG. 34A there are partially filled nanoparticles, and in FIG. 34B there are large and small fully filled, highly faceted nanoparticles. There are three lines surrounding the two nanoparticles in A that are not explainable yet. They are too small to be thickness differences in the sample, and appear too large to be stress fields. All nanoparticles shown are faceted, but fully filled nanoparticles are more strongly faceted.

Figure 35:
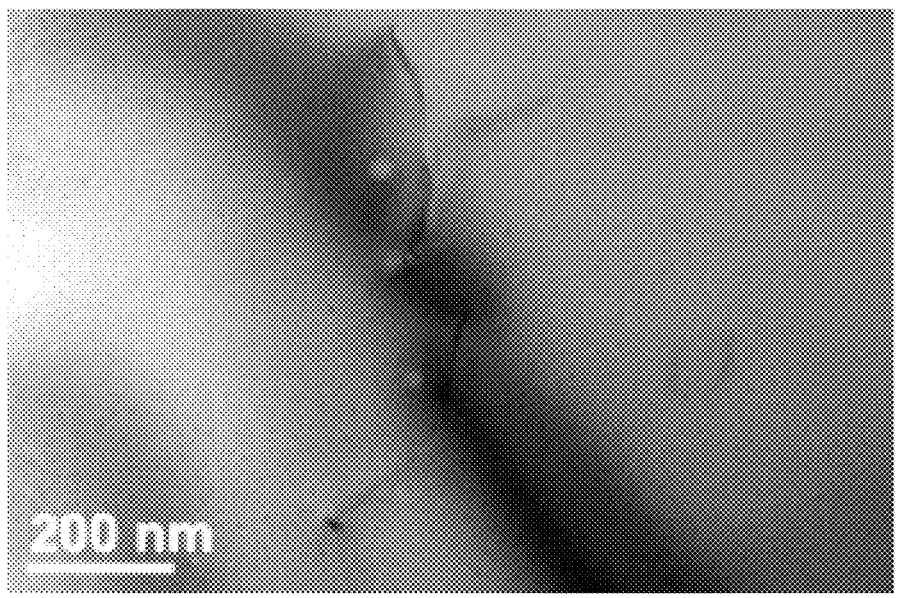
FIG. 35 is a cross-sectional transmission electron micrograph of sample Ag14.

A micrograph from sample Ag14 is shown in FIG. 35. This micrograph is in-focus, but voids can still be clearly seen. The thermal budget for defect annealing is very high, five hours at 927° C., explaining the relative dearth of features. It is possible that this sample does contain Ag nanoparticles, but the concentration of trapped Ag is too low to merit significant interest. With questionable repeatability due to defect annealing atmosphere, this sample is not investigated further. However, this micrograph is instructive, showing that excessive defect annealing leaves few features at the end of range of He ion irradiation which are able to trap diffused Ag atoms.

Figure 36:
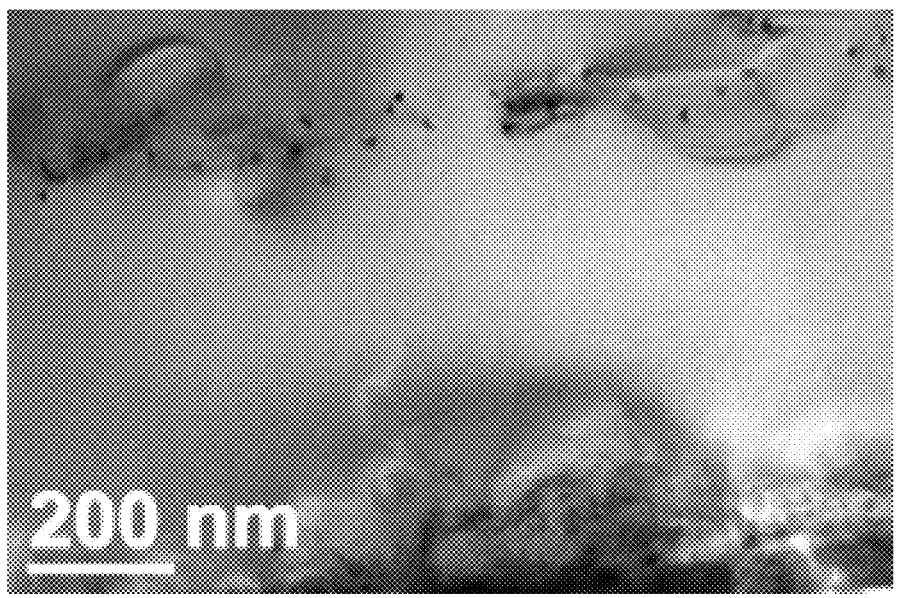
FIG. 36 is a cross-sectional transmission electron micrograph of sample Ag16 showing contaminated surface at bottom.
Figures 37A, 37B, 37C, 37D:
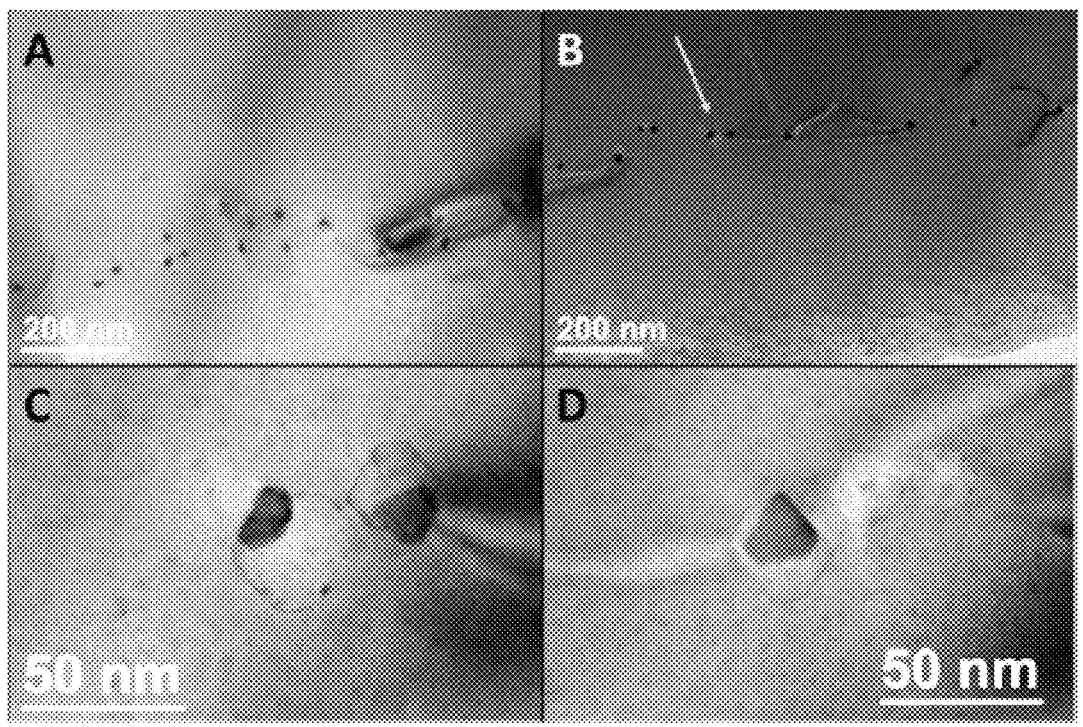
FIGS. 37A-37D are cross-sectional transmission electron micrographs of sample Ag16 showing nanoparticles.

An overview micrograph of sample Ag16 is shown in FIG. 36 with a damaged and defected surface. It must be assumed that the surface defects were introduced by contamination due to a leak in the vacuum furnace during three-and-a-half hour defect annealing. Despite the surface irregularities, a surprising amount of nanoparticles are formed. The surface deterioration makes accurate determination of the depth of these nanoparticles impossible, but it is safe to assume that nanoparticles are formed at depth around 650 nm from surface, the projected range of 100 keV He ions. Careful study of the nanoparticles in FIGS. 37A-37D indicates that nanoparticles appear the same as others formed in more "successful" cases, as in FIGS. 33A-33B and 34A-34B. FIGS. 37C and 37D are higher resolution micrographs of nanoparticles indicated by yellow and red arrows, respectively, in FIG. 37B. It is doubtful that this sample, or any other from the sequence Ag9-17, could be repeated using the same experimental conditions, but the nanoparticles do exist for study.

Figures 38A, 38B:
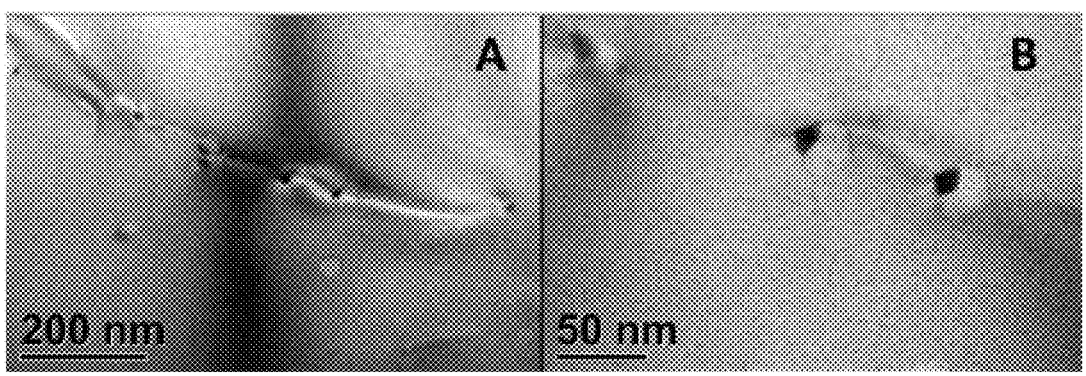
FIGS. 38A-38B are cross-sectional transmission electron micrographs of sample Ag17 showing nanoparticles.

The same irradiation condition, $1\times10^{16}$ $cm^{-2}$ 100 keV He ions, annealed for longer time, sample Ag17 is shown in FIGS. 38A-38B. FIG. 38B is higher resolution micrograph of nanoparticles in center of FIG. 38A. This sample shows voids partially filled with nanoparticles with size along greatest dimension around 15-20 nm, and voids containing nanoparticles are strongly faceted. The faceting of the voids is similar to those seen in samples Ag1 and -5, shown in FIGS. 31A-31D, and different from the equilibrium shape of voids in pure Si [14]. Furthermore, voids that would ordinarily require application of the under-focus over-focus method to enhance Fresnel contrast to detect are plainly visible in FIG. 38A.

Figure 39:
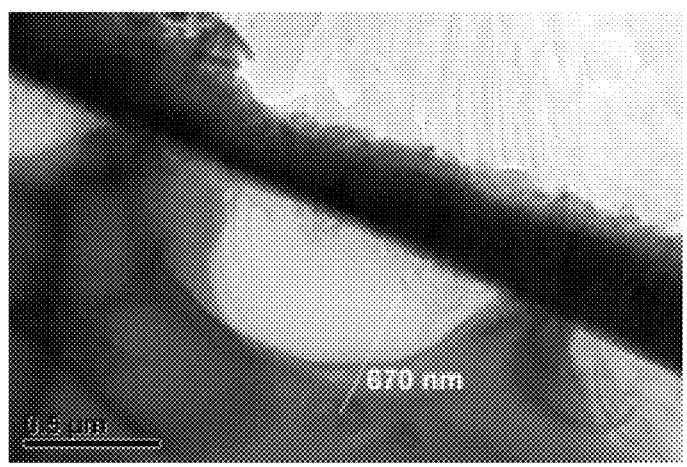
FIG. 39 is a cross-sectional transmission electron micrograph of sample Ag17 showing depth of voids and dislocations created by experimental method listed and large pit with depth several hundred nanometers.

As with sample Ag16 shown in FIG. 36, sample Ag17 suffers from surface irregularities. Dramatic evidence of type of surface defect commonly observed for this sample is shown in FIG. 39. The pitting observed extends several hundred nanometers below the surface. The shape of the pits is almost hemispherical, which can help to eliminate some possible causes. For example, excessive exposure to HF acid would create pits with (111) plane faces. The hemispherical shape could be caused by oxidation of that volume initiated at a small surface defect, which was then promoted by contaminated vacuum during defect annealing, and which was etched away by surface cleaning treatment involving HF acid. Ag16 and -17 suffer from greatest surface irregularities, and they underwent defect annealing together in the last set in the vacuum furnace with a steadily worsening leak.

Figure 40:
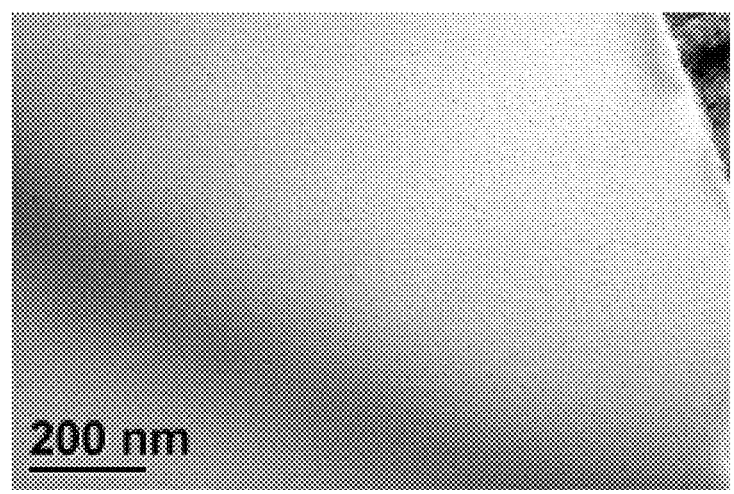
FIG. 40 is a cross-sectional transmission electron micrograph of sample Ag10 showing no voids, dislocations or nanoparticles.

The final micrograph from the "unsuccessful" series Ag10-17 due to surface contamination comes from sample Ag10, shown in FIG. 40. No features are shown in the region of interest between the surface and the calculated end-of-range of 100 keV He ions. The implanted ion fluence is too low for voids to nucleate or the defect annealing thermal budget is too large for voids to evolve large enough to be observed by TEM. The small dots are believed to be created by ion milling with Ar ions to sufficiently thin the sample for TEM.

Figure 41A:
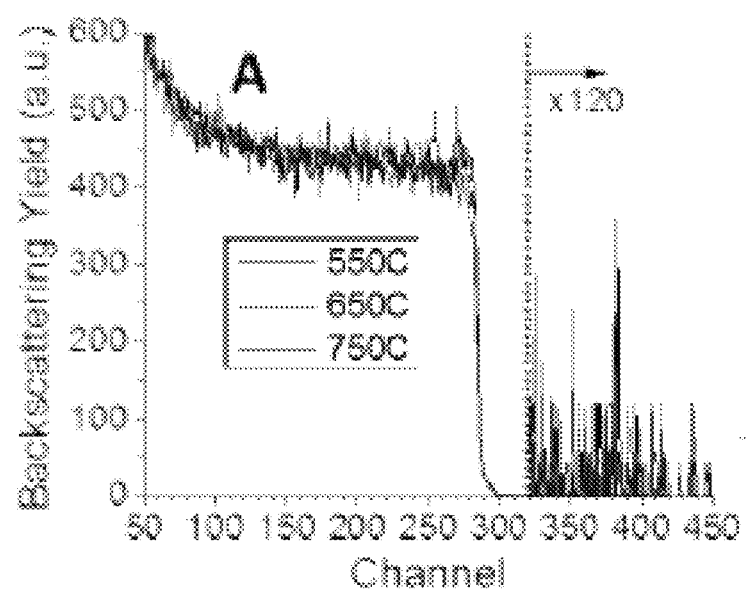
FIGS. 41A-41B are graphs of Rutherford backscattering energy spectra from samples Ag18, -20 and -24 subjected to diffusion heat treatment for 10 minutes at 750, 650 and 550° C., respectively, (FIG. 41A), and samples Ag19 and -21 subjected to diffusion heat treatment for 30 minutes at 750 and 650° C., respectively, (FIG. 41B)
Figure 41B:
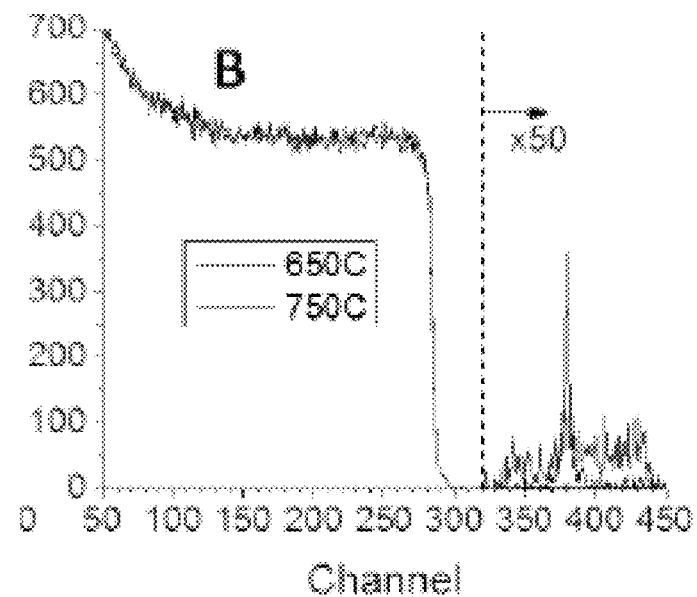

Samples Ag18-27 are investigated by RBS to determine amount of Ag atoms trapped in void region, shown in FIGS. 41A-41B. FIG. 41A corresponds to samples Ag18, -20 and -24 subjected to diffusion heat treatment for 10 minutes at 750, 650 and 550° C., respectively. FIG. 41B corresponds to samples Ag19 and -21 subjected to diffusion heat treatment for 30 minutes at 750 and 650° C., respectively. No trapped Ag is observed except in sample Ag19, the sample with largest diffusion heat treatment thermal budget. Silver is diffused from a surface layer, ≈500 nm thick, for 30 minutes at 750° C. in sample Ag19. The overly thick Ag surface layer is caused by poor operation of a malfunctioning deposition chamber, and it required chemical etching to remove. A consequence of chemical etching was deposition of thin layer of Fe contamination, seen in the sharp peak at channel 382 in spectrum from sample Ag21. The energy of that channel corresponds exactly to backscattering from Fe on surface, and if Ag were trapped in that sample, it would not be confined to such a thin layer with no evidence of trapping anywhere else. Samples Ag22 and -23 (not shown), with diffusion heat treatments at 650° C. for one and two hours, respectively, are similar to sample Ag21 in that there is no Ag trapping in voids.

Silver atoms diffuse into Si mediated by Si point defects, and are chemisorbed at inner surfaces of voids. The morphology of voids changes based on amount of Ag atoms trapped in voids.

The defect annealing and diffusion heat treatment parameters, time, temperature and atmosphere, have strong effect on Ag trapping at voids. Defect annealing creates two conditions that effect Ag trapping in voids: first, the void size, which increases with increasing time or temperature, and shape, which is spherical or faceted; second, the concentrations of point defects which mediate diffusion of Ag from surface to voids. The diffusivity of Ag atoms in Si samples containing some concentration of point defects throughout and voids localized far from surface depends on diffusion heat treatment time and temperature as well as point defect concentrations. However, temperature of diffusion heat treatment is sufficient to anneal defects that are not stable, including point defects, so diffusivity is also dependent on diffusion heat treatment time. It is observed that void size does not change dramatically with increased diffusion heat treatment time, so we consider He-induced voids at depth 650 nm in Si stable defects at 750° C.

High density of nanoparticles are formed as well as large nanoparticles, but the parameters used to fabricate samples Ag9-17 are not repeatable due to contaminated atmosphere during defect annealing. However, these questionable samples prove it is possible.

The study of Ag trapping by RBS of samples Ag18-27 leads to a couple of important conclusions about what will not work or cause additional difficulties in Ag nanoparticle fabrication process in Si. First, diffusion heat treatment times of 30 minutes or less and temperatures of 650° C. or less cause no Ag to be trapped in void layer. Increasing temperature to 750° C. for time of 30 minutes causes some Ag to be diffused to and trapped in voids, but very small amount. Secondly, etching a thick layer of Ag can lead to other, unexpected contamination on the surface. In this case, Fe is deposited on surface, and the ready diffusion and compound formation of Fe in Si is problematic for electronic devices. This etching should be avoided by only applying Ag films on the surface thin enough to remove by common solvents.

Characterizing the atomic structure of silver nanoparticles in silicon will now be described. This section studies silver nanoparticles in samples Ag3 and Ag9, described in Table 4. Heteroepitaxial growth of Ag on Si111 and Si110 utilizes 4:3 coincident-site lattice (CSL), and on Si100 2:3 CSL. The co-incident site lattice depends on the configuration of the void, specifically the family or families of atomic planes that define the void shape are inner surfaces. The implicit assumption in the exercise of defining CSL's is that inner surfaces of voids do not restructure.

Metal nanoparticles are grown inside silicon voids with atomic planes of Ag and Si parallel, measured by electron microscopy and diffractometry. Channeling RBS analysis measures the amount of residual disorder in material surrounding nanoparticles, and angular scans confirm alignment of multiple Si and Ag channeling axes.

The two samples investigated are irradiated with 100 keV He ions to fluence $5E15/cm^{-2}$ 100 keV He ions at room temperature with a well-focused, rastered beam into same p-type (100)-oriented Si wafer grown by float-zone technique. Defect annealing to nucleate and grow voids in sample Ag3 is performed for 30 minutes at 950° C. in flowing ultra-high purity Ar in a quartz tube furnace utilizing a hot-zone method. Defect annealing of sample Ag9 is performed for 210 minutes at 927° C. in vacuum in a quartz tube furnace utilizing a hot-zone method. The sample rests in a quartz boat and is inserted into and withdrawn from the furnace at temperature as rapidly as possible. Reported annealing times do not include fixed two minutes added to allow the sample to heat up to hot-zone temperature. After defect annealing and before physical vapor deposition (PVD), sample surfaces are cleaned by sequential acetone and ethanol baths followed by evaporation with dry $N_2$ gas, performed twice, then etching with HF acid vapor for 10 seconds. Evaporation of 100 nm Ag onto Si surface is performed in a BOC Edwards Auto 306 Metal Evaporation Chamber. Heat treatment to diffuse Ag into Si is performed at 750° C. for one hour (Ag1, -3, -5 and -7) or two hours (Ag6 and -9) in quartz tube furnace with flowing ultra-high purity Ar utilizing same hot-zone method. Samples Ag1, -3, -5, -6, -7, and -9 are analyzed by different methods. Additional details not listed here of the ion irradiation, defect annealing, Ag film deposition and diffusion heat treatment parameters that each sample is subjected to are listed in Table 4.

All samples listed above are examined by transmission electron microscopy, but in this section samples Ag3 and Ag9 are examined more closely than the results shown in the previous section. Cross-sectional specimens for transmission electron microscopy are created by mechanically polishing and dimpling followed by Ar ion milling at shallow angle in the case of Ag9, or by dual-beam SEM/FIB in the case of Ag3. TEM specimens from Ag9 are characterized in JEOL JEM-2010 microscope operated at 200 kV. The spacing of Ag atomic planes measured by diffraction patterns obtained are normalized to Si atomic planes.

Portions of micrographs are filtered by process of fast Fourier transformation, masking, and inverting the transformation. These transformed images are then averaged with original micrograph to yield Fourier-filtered micrographs which emphasize a feature that is weak due to noise. This is performed in Digital Micrograph software from Gatan, Inc.

Ion backscattering measurements were performed. A 2 MeV He ion analyzing beam probes the (100) and (110) axial channels, and the beam is aligned with the (100) plane channel as it scanned across the (110) axial channel. During angular scans of the (100) axis, the beam is not aligned with a plane channel. A surface barrier detector collects He ions backscattered 165° C. from incident direction. RBS spectra obtained under random orientation are fitted with third-order polynomials using the Microsoft Excel program in the channel range 50-200, and these fitted polynomials are used instead of raw data of random spectra to extract relative disorder profiles. Values for R2 variance for fitted functions are 0.971, 0.966, 0.970, 0.970 and 0.963 for random spectra from samples Ag1, -3, -5, -6 and -7, respectively, and is 0.987 for random spectrum from pure Si. Values of the coefficients and variance are listed in Table 6. The purpose of this additional fitting is to compare channeling spectra to random spectra that are close to ideal random spectra.

TABLE 6

Coefficients for third-order polynomial of type $f(x) = ax^3 + bx^2 + cx + d$ fitted to RBS random spectra obtained from samples in channel interval 50-200, where x is channel number and f (x) is counts.

| | a (×10$^{-3}$) | b | c (×100) | d (×10$^4$) |
| --- | --- | --- | --- | --- |
| Ag1 | −1.6571940476906 | 1.0036617692766 | −2.0057048250340 | 3.0321860590388 |
| Ag3 | −1.0130434903008 | 0.55229231822304 | −1.0203886839419 | 1.5079594626911 |
| Ag5 | −1.1481679748530 | 0.605949182484434 | −1.0892069580227 | 1.5074684333392 |
| Ag6 | −1.4926311321181 | 0.76976354146469 | −1.3509693790977 | 1.6974488155311 |
| Ag7 | −1.6313516098711 | 0.79382548456974 | −1.3025228785271 | 1.6369719973077 |
| Si | −2.2667254034740 | 1.0969971791027 | −1.8355976432599 | 2.0460487198490 |

Transmission electron micrograph in FIGS. 33A-33B and 34A-34B show voids evolved by defect annealing for 3.5 hours and Ag nanoparticles grown by diffusion heat treatment at 750° C. for two hours, with additional details previously described. Nanoparticles have diameters up to 40 nm, and are found in a band more than 100 nm thick.

Figures 42A, 42B:
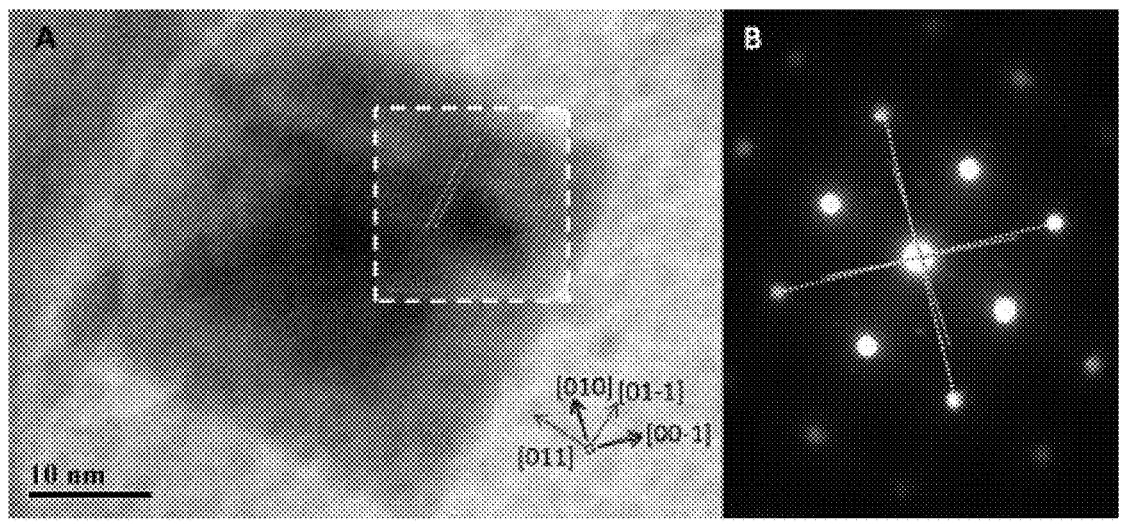
FIGS. 42A-42B are a transmission electron micrograph (FIG. 42A) and an electron diffraction pattern (FIG. 42B) of nanoparticle in sample Ag9.

High-resolution transmission electron micrograph and diffraction pattern of a large nanoparticle found in Ag9 cross-sectional TEM specimen are shown in FIGS. 42A-42B. The zone axis of the electron beam is [100]. The arrows indicating low-index orientations in FIG. 42A are derived from diffraction pattern FIG. 42B, where red indicates Si and black indicates Ag atomic plane directions. According to the diffraction pattern, Si and Ag (110) planes analyzed are parallel to each other, but Si and Ag (100) planes are deviated by around 3°. This angular deviation indicates that the crystal structure of Ag in nanoparticle is no longer cubic, but the right angles measured between Ag (110) atomic planes from the same electron diffraction pattern counter such a conclusion. In a cubic crystal, the (001) and (010) atomic planes have a square projection when viewed along the (100) direction, and the (011) and (01-1) planes are diagonals within that square. The angular deviation in (010) and (001) planes in diffraction pattern do not show that the Ag crystal is rotated with respect to the Si crystal, but that the projection of the (010) and (001) planes is changing from a square to a parallelogram. The Ag (001) plane spacing measured in FIG. 42B is within 0.3% of tabulated value, but Ag (010) and both Ag (011) planes deviate from tabulated values by 3.5%. It has been reported that the lattice structure of silver in nanowires at room temperature can compress in one direction to become face-centered tetragonal crystal [66]. However, such a transformation from cubic to tetragonal crystal structure would be accompanied by changes in the spacing of one of the (100) planes, which is observed in this case, but no change in the angle between planes, which is not observed in this case.

The projection of the nanoparticle in FIGS. 42A-42B viewed along the [100] zone axis is square, with shape bounded by (110) planes. A portion of the micrograph outlined by white square has been filtered to enhance the apparent fringe spacing by Fourier filtering method described herein. The fringe spacing measured from the filtered portion of the micrograph A is 5.6 Å, and the fringes are parallel to the [01-1] direction in Ag and Si.

Figures 43A, 43B:
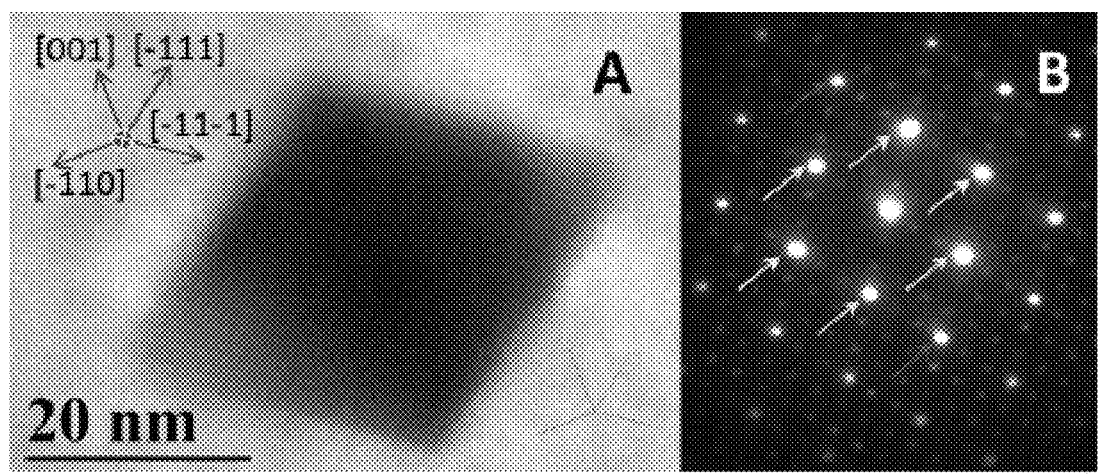
FIGS. 43A-43B are a transmission electron micrograph (FIG. 43A) and a electron diffraction pattern (FIG. 43B) of same nanoparticle in sample Ag9 shown in FIGS. 42A-42B.

The same nanoparticle is shown in electron micrograph and diffraction pattern in FIGS. 43A-43B with the electron beam aligned with the [011] zone axis. The atomic planes causing diffraction spots in FIG. 43B are indicated by colored arrows: yellow (100), red (110) and light blue (111). In this diffraction pattern, all Si and Ag atomic planes are parallel to each other. The spacings of Ag atomic planes measured in FIG. 43B are within 0.5% of bulk values, normalized to bulk Si atomic plane spacings, and angles between planes indicate face-centered cubic structure. The Si (002) reflections shown in the diffraction pattern, indicated by yellow arrows, are forbidden reflections, but appear because of double diffraction from multiple planes. The spacing of interference pattern caused by penetration of an electron beam through multiple crystals with different atomic plane spacings that are parallel was described by Moire, for instance the Si (111) and Ag (111) planes, are determined by Equation 1.

Close alignment of the Ag and Si atomic planes and the location inside the Si matrix renders the independent determination of planar spacing of Ag nanoparticles impossible without interference. This phenomenon also hinders exact observation of the size of nanoparticles using these micrographs. Moire interference pattern of Ag and Si (110) atomic planes contained in the portion of micrograph enclosed by white dashed lines in FIGS. 42A-42B is enhanced by Fourier filtering. The measured interference fringe spacing is 5.6 Å, and calculated value for interference fringe of Si (220) and Ag (220) planes with spacings 1.919 and 1.444 Å, respectively, using Equation 1 is 5.8 Å. The difference between measured and calculated values for fringe spacing shown in FIG. 42A is 5%.

Figures 44A, 44B:
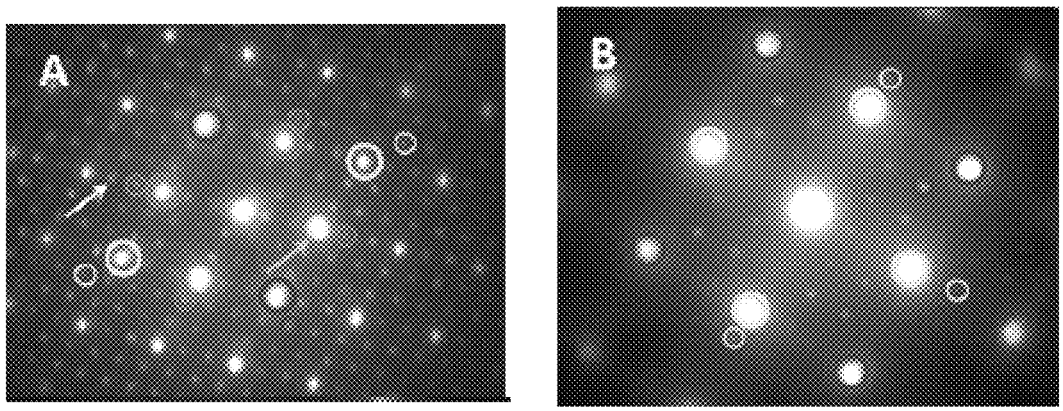
FIGS. 44A-44B are electron diffraction patterns shown in FIGS. 42B and 43B modified to increase visibility of weak reflections from Ag atomic planes or caused by Moire interference.

The diffraction patterns shown in FIGS. 42B and 43B are presented in FIGS. 44A and 44B, respectively, with values of brightness, contrast and gamma increased from 0.50 to 0.55. Low-intensity diffraction reflections caused by diffraction from Ag atomic planes or multiple diffractions due to Moire interference are more easily visible. The periodic nature of the high and low intensity diffraction reflections are a consequence of the relationship of crystal structures and lattice parameters of Si and Ag. Reflections from atomic planes are outlined by Si (thick) and Ag (thin) circles. Zone axis of the electron beam is A [011] and B [100].

Silver fcc and Si diamondlike crystal structures are similar, with the diamond-like crystal structure essentially being made up of two fcc sublattices offset in [111] direction fit into a larger unit cell. Diamond-like unit cell therefore contains twice as many atoms as fcc unit cell. Unit cells of Si and Ag have five (110) and (111) atomic planes, and [111] projections of each have atoms in same positions. The [110] projections of each crystal structure are different. In the fcc unit cell, there are three (100) atomic planes, whereas in diamond-like unit cell there are five (100) atomic planes. The lattice parameters of Si and Ag are 5.431 and 4.087 Å, respectively, so Ag lattice parameter is 24.5% smaller than that of Si. In reciprocal space, such as in a diffraction pattern, diffraction from atomic planes with smaller spacing is larger and vice-versa. Therefore, diffractions from Ag (111) or (110) atomic planes are approximately 33% farther than from Si counterparts.

Electrons in the electron beam are undergoing multiple diffractions from atomic planes resulting in diffraction patterns shown in FIGS. 44A-44B. In this case, the effective result is multiple points of origin of electrons before undergoing their final diffraction, which is then collected as data. Even though there is one electron beam incident on the specimen, and one true (000) transmitted beam, the effect of multiple diffractions results in multiple (000) transmitted beams. Therefore, there are multiple diffraction patterns overlaid on top of each other. The periodic, low-intensity spots are actually higher-order reflections of electrons that have been diffracted at least once previously. For example, the orange arrow in FIG. 44A is pointed at a (111) diffraction spot, assuming single diffraction from Si(111) planes of an electron initially directed toward the center spot, the (000) transmitted beam. An electron starting in the incident beam, diffracted by a (111) plane of Si, and then diffracted by a (311) Ag plane would be collected at the diffraction spot marked by the white arrow. The two additional low intensity diffraction spots between every high intensity diffraction spot in FIG. 44A are due to double (or higher) diffraction from Si and Ag atomic planes.

The contrast of different areas of the nanoparticle in FIGS. 42A and 43A indicates the thickness of Ag in that area of the nanoparticle compared to others. Lighter contrast in square projection in FIG. 42A is near the edges, and darker contrast at center, indicating the edges are thinner than center. Lighter contrast in FIG. 43A is at two sharp corners, and darker contrast is in center and uniform along (001) direction. This indicates the two sharp, thin corners are apices, and the wide, thick part along (001) direction is the base of the octahedron.

The micrographs in FIGS. 42A and 43A show that the shape of the nanoparticle is octahedral and bound by (111) surfaces. The aspect ratio is near unity, calculated by comparing the length of nanoparticle measured along the (110) and (100) directions. The [110] projection, FIG. 43A, of the nanoparticle shows that the sides are (111) planes, the base is rotated 3° from (001) plane, and the apices are bisected by (110) plane. The nanoparticle's four sides in the [100] projection, FIG. 42A, are rotated 3° from (011) directions indicated on micrograph.

The size of the nanoparticle in FIG. 42A is 29.1 nm in the [111] direction and 27.7 nm in the [11-1] direction, and it is approximately square in FIG. 42A with side lengths 33 and 35 nm. It should be noted that filtering by Fourier transformation and masking, as in FIG. 42A, eliminates some noise associated with electron interference, so reported lengths should be considered upper bounds. The uncertainty caused by fuzzy boundaries could account for the apparent misalignment of the nanoparticle shape with atomic planes, or this could be a characteristic of an enclosed Ag nanoparticle grown heteroepitaxially in silicon with no free surfaces.

Figures 45A, 45B:
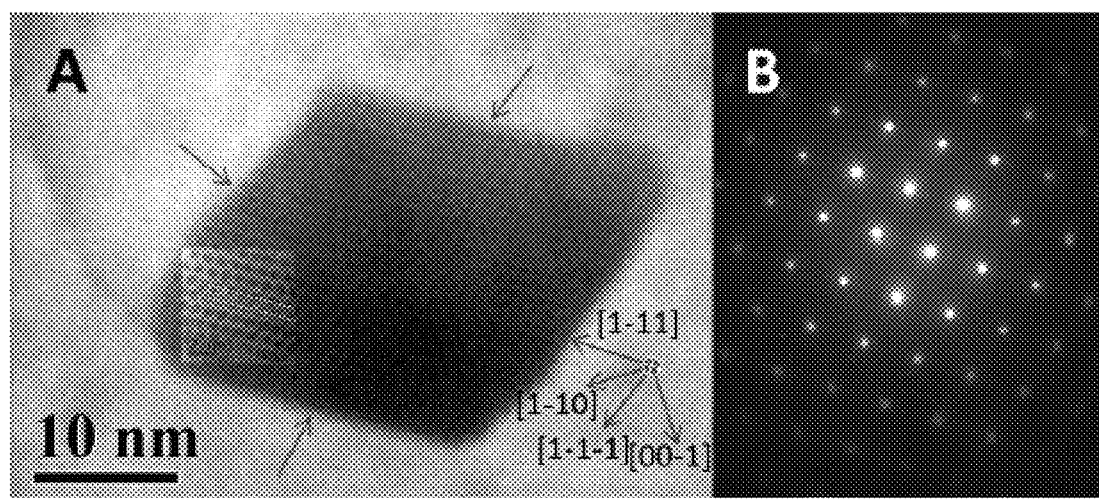
FIGS. 45A-45B are a transmission electron micrograph (FIG. 45A) and a electron diffraction pattern (FIG. 45B) of partially-filled void nanoparticle in sample Ag9.

Additional Moire interference patterns are reported in FIGS. 45A-45B and 46A-46B observed in samples Ag9 and -3, respectively. A portion of the micrograph in FIGS. 45A-45B is Fourier filtered and shows Moire interference of Si and Ag (111) planes, with measured fringe spacing of 8.9 Å. The edge of the void is visible on the left. Portion of the micrograph is Fourier filtered to enhance interference fringe, and spacing of fringe is 8:9/AA. Zone axis of the electron beam is [011]. A smaller nanoparticle created by different experimental conditions is shown in inset of FIGS. 46A-46B, and the Moire interference of Si and Ag (111) planes with fringe spacing 9.9 Å is measured. The calculated fringe spacing using Equation 1 with tabulated values for Si and Ag (111) planes is 9.51 Å. Interference fringe is visible in B without Fourier filtering, and fringe spacing is 9:9/AA. Zone axis of the electron beam is [011], and major crystallographic directions are indicated.

Figures 46A, 46B:
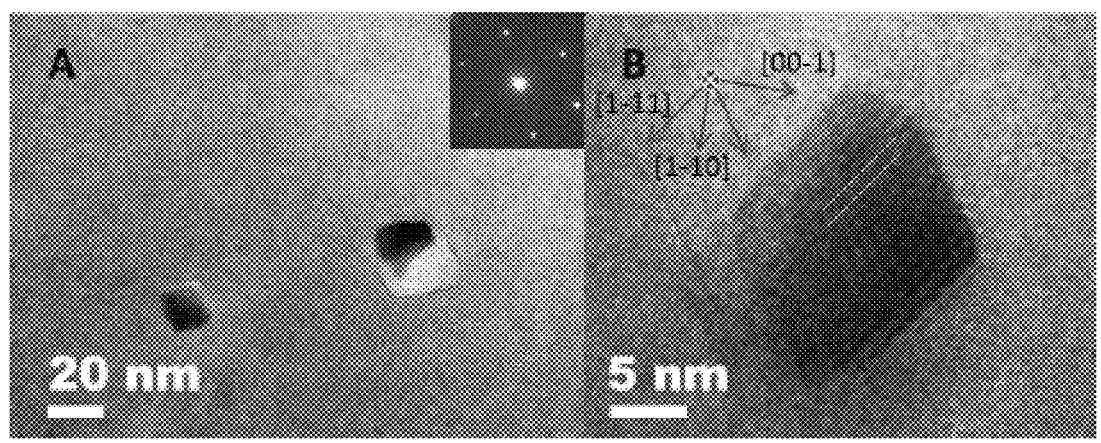
FIGS. 46A-46B are transmission electron micrographs from sample Ag3 of two nanoparticles with differing open volumes (FIG. 46A), and high-resolution electron micrograph (FIG. 46B) of left nanoparticle in FIG. 46A.

Nanoparticles that occupy a portion of the total void volume are shown in FIGS. 45A-45B and FIGS. 46A-46B. In FIG. 45A, the edge of the void can be seen on the left side of the micrograph, and diffraction pattern in FIG. 45B shows zone axis is [110]. Red arrows are pointing at Ag/Si interfaces, and blue arrows at Ag/vacuum interfaces, and all interfaces are predominantly bound by (111) planes. Two nanoparticles with free volume are shown in FIG. 46A, and FIG. 46B shows high resolution micrograph of left nanoparticle. The two nanoparticles in FIG. 46A are approximately the same size, though the free volume not filled by metal is different for each one. FIGS. 45A-45B and 46A-46B illustrate that free volume varies widely, but the amount of trapped Ag does not indicating that the Ag content of each nanoparticle is dependent on diffusion parameters and independent of void size. When voids are nucleated heterogeneously, following He ion fluence less than $1\times10^{16}$ cm$^{-2}$, void sizes vary widely [68]. The nanoparticle in FIG. 45A is imaged along the same zone axis as that shown in FIG. 43A, and the size of the two compare favorably even though there is no free volume in the latter. Furthermore, the shapes of nanoparticles in FIGS. 45A-45B and 46A-46B, with free volume, are primarily bound with (111) planes and bisected by (110) and (100) planes, just as in the nanoparticle in FIGS. 42A-42B and 43A-43B. The shapes of fully-filled nanoparticles and partially filled void-nanoparticles differ by small area bounded by (100) planes, indicating that the surface energies are slightly different in their anisotropy. In the case of silicon, the lowest energy surface is (111) and $\gamma_{100}=1.11\gamma_{111}$ is the next lowest surface energy [14]. This relationship is not observed for any Ag nanoparticles or Ag nanoparticle/void complexes in this study. The surface energy is weakly dependent on the nature of the interface, whether it is Ag—Si or Ag-void.

Rutherford backscattering energy spectra obtained when the ion beam is aligned with an atomic plane, such as [100] or [111], decreases the areal density of target atoms thus reducing the backscattering yield. If the ion beam is aligned with a major crystalline axis, where multiple atomic planes intersect, ⟨100⟩ or ⟨111⟩, the backscattering yield is further reduced. Using this method, the number of defects in a monocrystalline material can be measured in comparison to a control sample.

Figure 47:
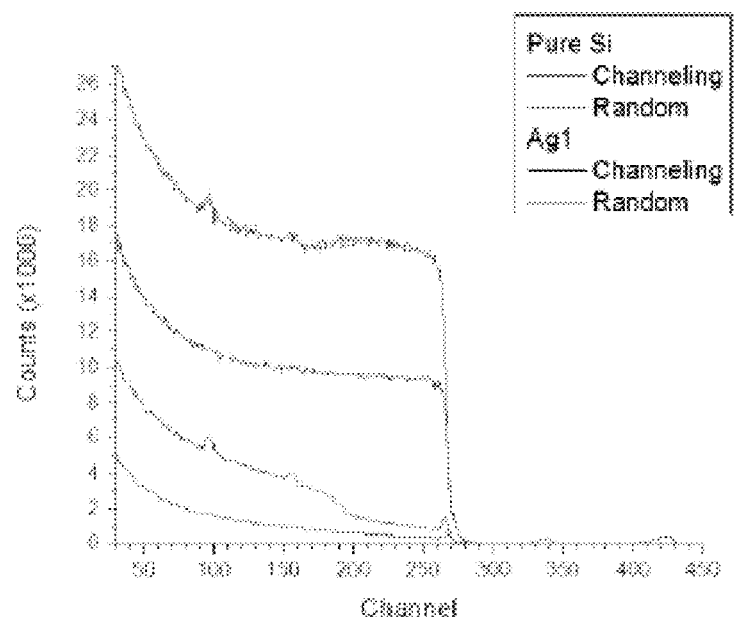
FIG. 47 is a graph of RBS channeling energy spectra from sample Ag1 and pure Si with ion beam aligned with [100] (surface-normal) channeling axis.

FIG. 47 shows RBS channeling spectra from sample Ag1 and pure Si control sample. The ion beam is aligned with the surface normal crystalline axis, the ⟨100⟩ axis, and that is plotted with "random" energy spectra obtained when the ion beam is un-aligned and encounters areal density of material corresponding to bulk volumetric density. The raw data shown in this figure differ by a significant amount, but this is due to different fluences of analyzing ion beam used to collect the data (essentially, different data collection times). The random spectra are used to normalize the channeling spectra by obtaining the value for $\chi_d$, from the following equation:

$$\chi = \frac{C^i}{\overline{C}_R} \quad (2)$$

wherein $C^i$ is counts in channel I in an aligned energy spectrum and $\overline{C}_R$ is counts in channel i in a non-aligned, random energy spectrum. The results are shown later.

Figure 48:
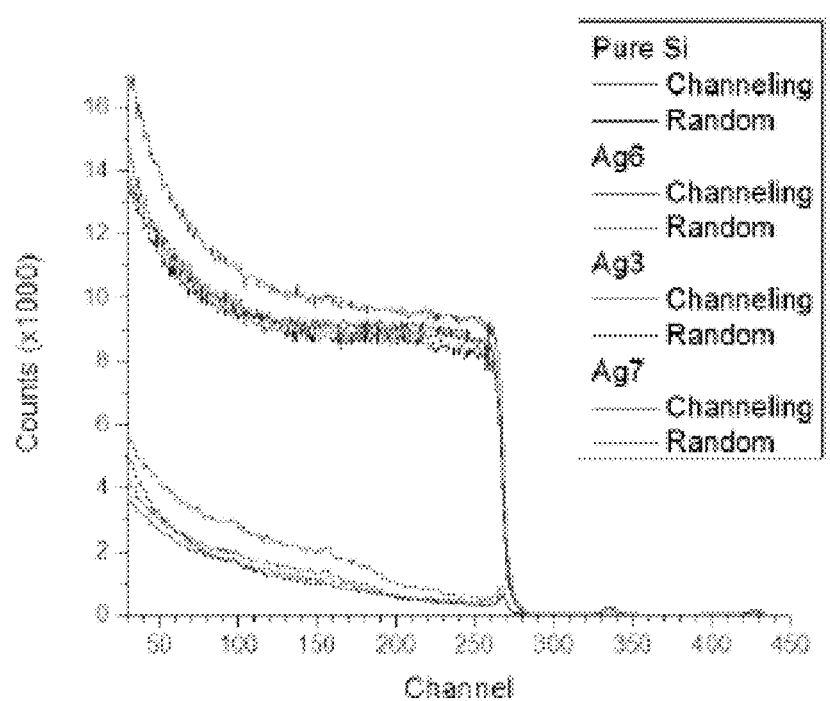
FIG. 48 is a graph of RBS channeling energy spectra from samples Ag3, -6, -7 and pure Si with ion beam aligned with [100] (surface-normal) channeling axis.

FIG. 48 shows random and channeling spectra from samples Ag3, -6, -7 and pure Si control obtained with ion beam aligned with ⟨100⟩ axis. Channeling spectra show that refining and optimizing the parameters for defect annealing and Ag diffusion has a measurable impact on the amount of defects measured in Si.

Figure 49:
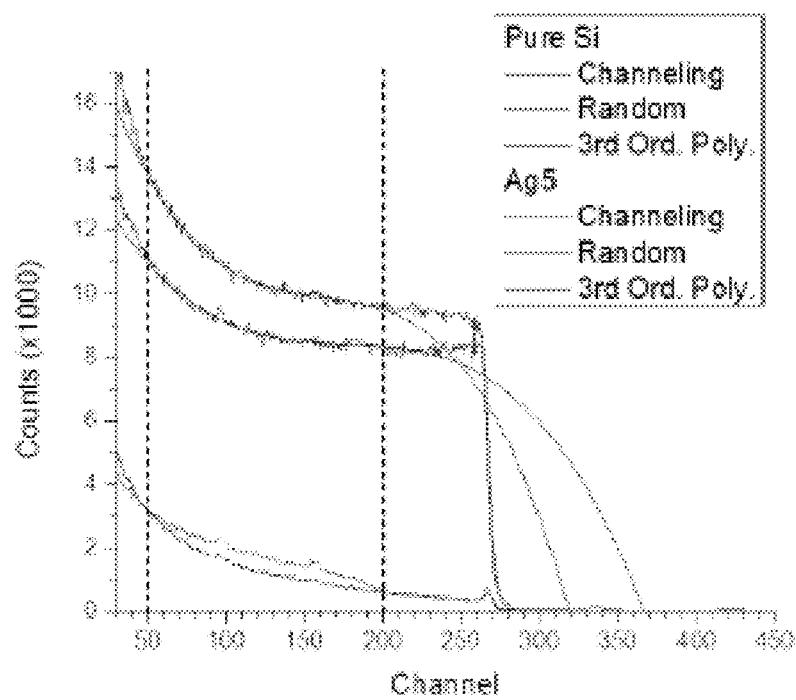
FIG. 49 is a graph of RBS channeling energy spectra from sample Ag5 and pure Si with ion beam aligned with [100] (surface-normal) channeling axis.

Every channeling spectrum has significant deviation from pure Si channeling spectrum between channels 50-200, so an additional step is taken in data analysis. A third-order polynomial is fitted to random spectrum in the channel interval 50-200, and two of these fittings are shown in FIG. 49 for sample Ag5 and pure Si control.

Figure 50A:
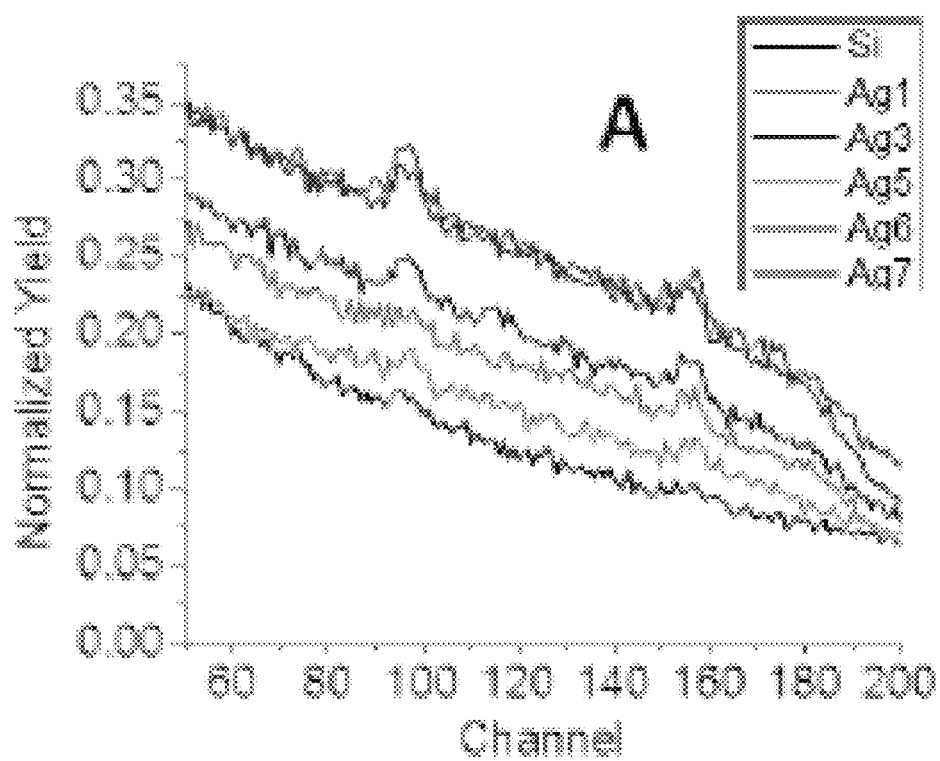
FIGS. 50A-50B are graphs showing normalized channeling yields from samples Ag1, -3, -5, -6, -7 and pure Si calculated by ratio of channeling counts to random polynomial-fitted counts (FIG. 50A), and Relative Si disorder of samples Ag1, -3, -5, -6 and -7 calculated by equation (FIG. 50B)
Figure 50B:
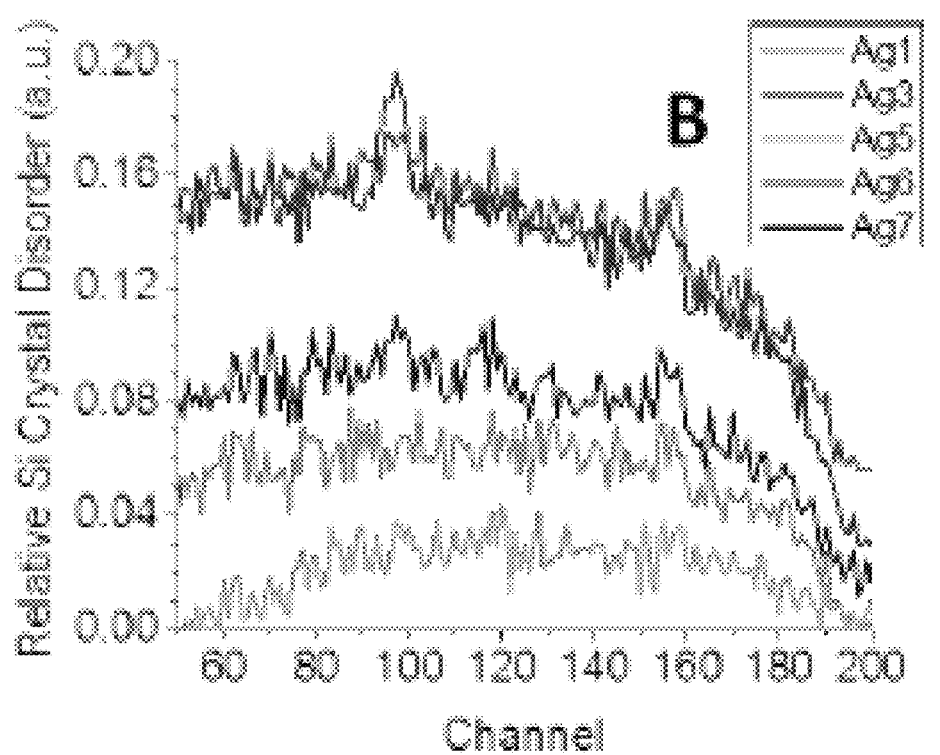

This effort is taken to decrease the effect of noise in the random spectra on the relative disorder profiles that are shown in FIGS. 50A-50B, which are graphs showing normalized channeling yields from samples Ag1, -3, -5, -6, -7 and pure Si calculated by ratio of channeling counts to random polynomial-fitted counts (FIG. 50A), and Relative Si disorder of samples Ag1, -3, -5, -6 and -7 calculated by equation (FIG. 50B). The relative disorder is calculated by taking the ratio of the difference of sample and control channeling yields versus random and control channeling yields:

$$\frac{n_D}{n} = \frac{\chi_d - \chi_v}{1 - \chi_v} \quad (3)$$

where $\chi$ is calculated using Equation 2 for d, samples that have crystalline damage, and for v, the control sample for each channel number. This calculation gives relative disorder in each sample compared to others, specifically the control sample. In the case where the sample does not contain a significant number of dislocations, which dechannel ions in a slightly different way than point defects, this value for relative disorder is the same as the defect concentration normalized by the atomic concentration of the sample. However, for samples Ag1, -3, -6, and -7, there are certainly a significant number of dislocations which accompany Si point defects. It is possible that sample Ag5 has sufficiently few dislocations that the relative disorder is the normalized defect concentration.

Figure 51A:
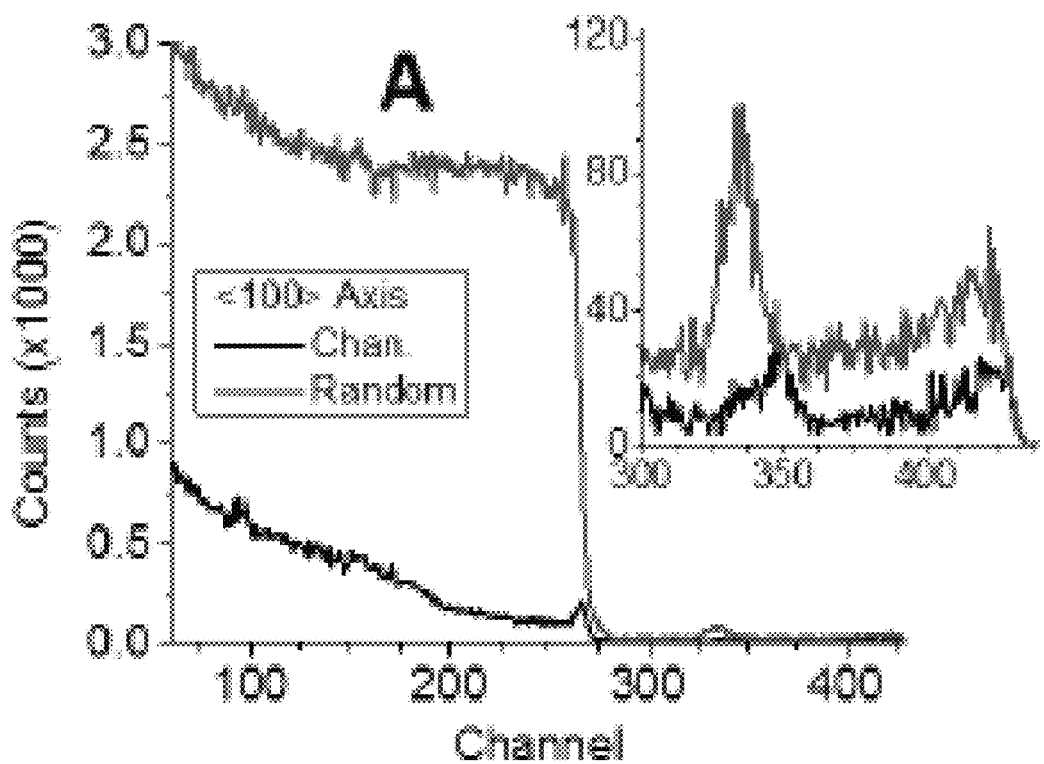
FIGS. 51A-51B are graphs of RBS channeling energy spectra from sample Ag3 with the ion beam aligned with [100] axis (FIG. 51A) and [110] axis (FIG. 51B) and (100) plane.
Figure 51B:
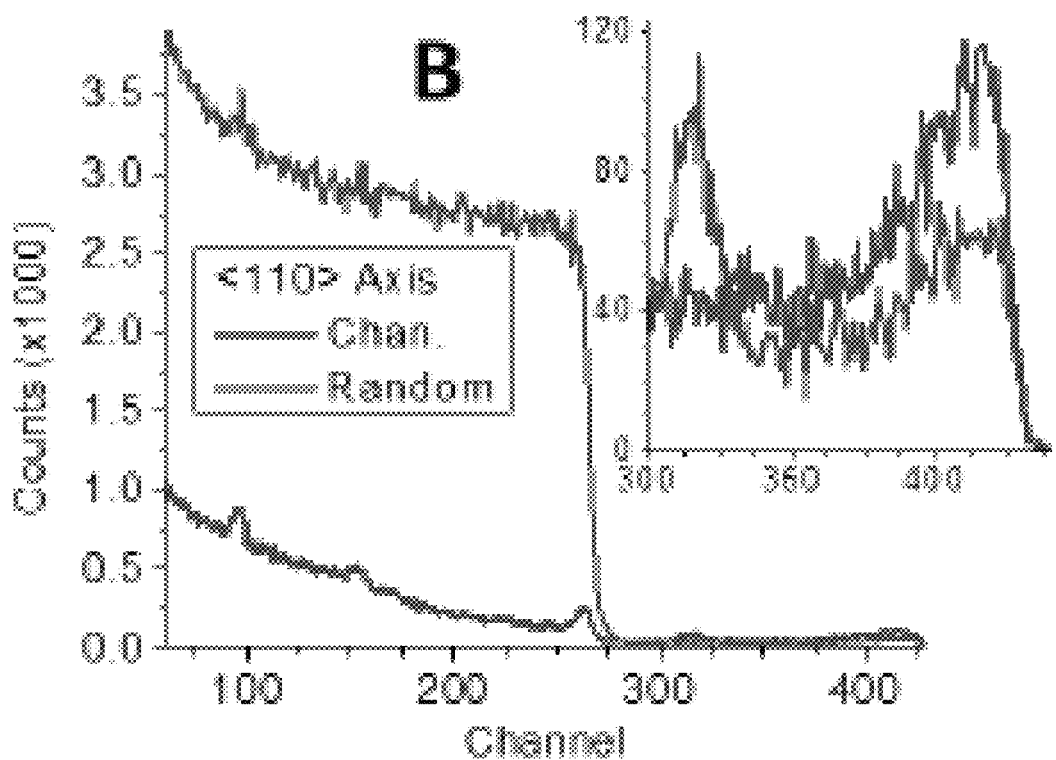

Sample Ag3 is analyzed more to understand the position of silver atomic planes in silver nanoparticles. RBS channeling spectra obtained with the beam aligned with A the surface-normal ⟨100⟩ axis and B the off-normal ⟨100⟩ axis are shown in FIGS. 51A-51B. The beam is aligned with the (100) plane channel as it is scanned across the ⟨110⟩ axis in FIG. 51B. Insets in FIGS. 51A-51B show backscattering counts from Ag atoms in sample Ag3. The backscattering yield from Ag atoms in the ⟨110⟩ axis channeling spectrum is greater than that of the random spectrum, indicating that some Ag atoms are in lattice positions that push into the ⟨110⟩ axis. This could mean that Ag atoms take tetrahedral interstitial positions.

Figure 52A:
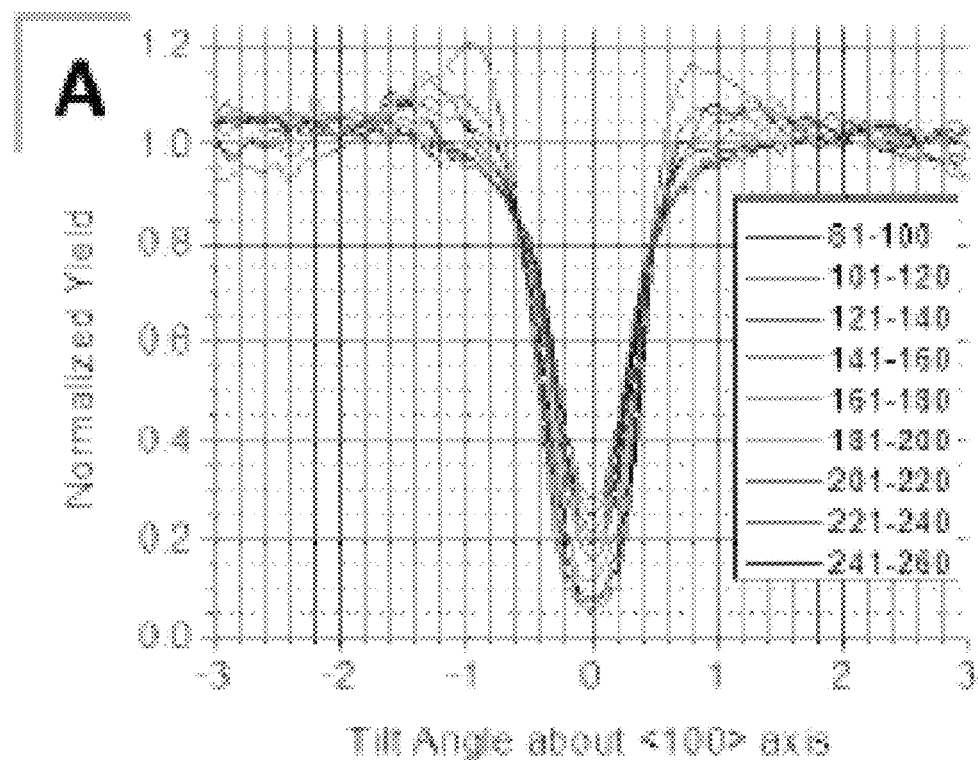
FIGS. 52A-52B are graphs of RBS angular scans from different depths of Si from sample Ag3 with the sample is tilted across [100] axis (FIG. 52A) and [110] axis (FIG. 52B) in (100) plane.
Figure 52B:
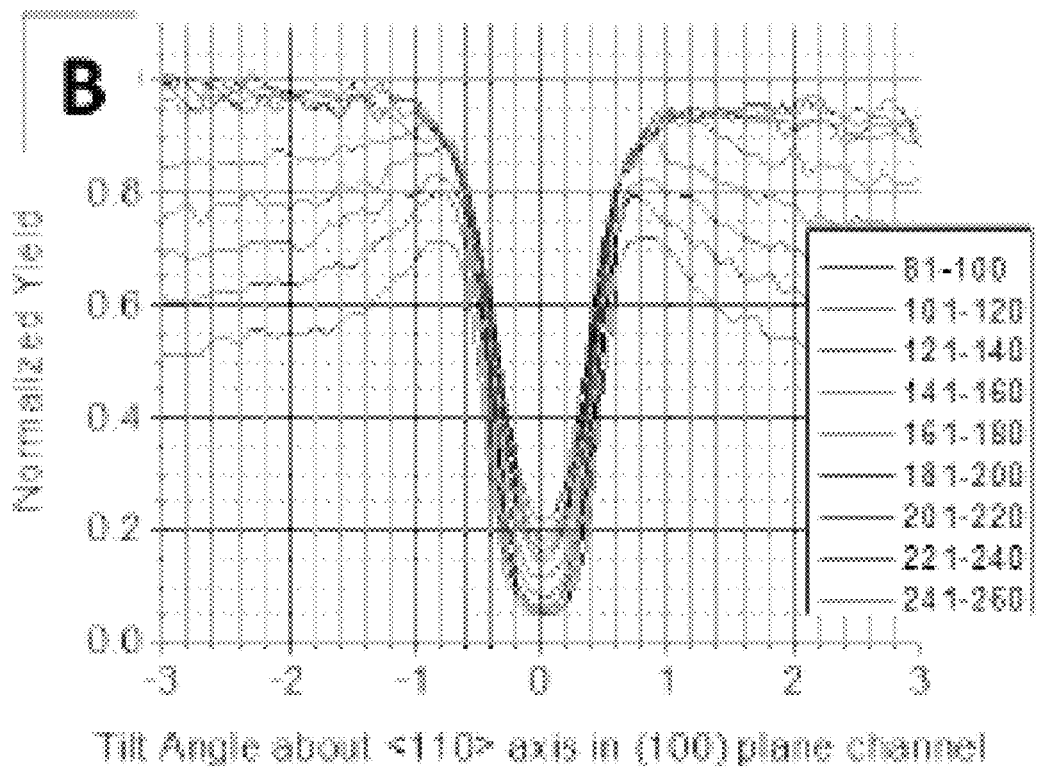

Angular scans across the same channeling axes in FIGS. 51A-51B are obtained for the full energy spectrum and recorded. The scanning data shown in FIGS. 52A-52B are from ⟨100⟩ axis (FIG. 52A) and ⟨110⟩ axis (FIG. 52B) with beam aligned with (100) plane channel, as before. Data is obtained for each channel at each scanning position, and then integrated over intervals twenty channels wide and plotted. The depth and depth interval that each angular scan represents increases as channel (backscattering energy) decreases. Near the surface, in channels 241-260 for both FIGS. 52A and 52B, the minimum yields are 5.9% and 5.1%, respectively. Pure Si with no defects analyzed with same ion beam at same temperature would have minimum yields of 4-4.5%, so sample Ag3 is relatively free of significant crystallographic damage.

FIGS. 53A-53B compare angular scans of Si near the surface and Ag in the nanoparticle region channeling ⟨100⟩ axis (FIG. 53A) and ⟨110⟩ axis (FIG. 53B) with beam aligned with (100) plane channel. The minimum yields from Ag nanoparticles, 27% and 45%, respectively, are significantly higher, but the (100) and (110) atomic planes of Ag and Si are parallel. The minimum yields for Ag from both FIGS. 53A and 53B are located 0.1° from center of Si axis, but this does not change the conclusion.

Angular scans data from Ag atoms in nanoparticles and interstitials closer to the surface are shown in FIG. 54. The inset in FIG. 51B shows that backscattering yield from Ag atoms is higher when beam is channeled along ⟨110⟩ than when the beam is not aligned with a channeling axis or plane. The position of maximum yield in the ⟨110⟩ axis angular scan of interstitial Ag atoms in FIG. 54 is in the center of the channel, at tilt 0°, showing that the interstitials are in the center of the channel. The location of tetrahedral interstice is not the center of the ⟨110⟩ axial channel in the diamond-like unit cell of Si. However, literature has an example of angular scans of He interstitials with tetrahedral coordination occupying center of ⟨110⟩ axial channel [2]. It is possible that measurable portion of Ag atoms between surface and void layer occupy tetrahedral interstices in Si crystal.

The orientation of atomic planes in Ag nanoparticles grown on inner surfaces of voids in Si have been measured by high-resolution TEM, electron diffraction and RBS angular scanning, and have been shown to be parallel with their Si counterparts (e.g. Ag(111) is parallel to Si(111)) with small discrepancies. Electron diffraction shows that Ag(100) and Si(100) are mis-aligned by approximately 3°, and RBS angular scanning shows that tilt angle of minimum yield of Ag (100) and (110) axes are 0.1° from that of Si. However, these small discrepancies do not change the overall conclusion that Ag and Si atomic planes are parallel.

Silver nanoparticles grow on the inner surface of voids in Si heteroepitaxially, using 4:3 Ag:Si relationship on Si(111) surfaces or 2:3 Ag:Si relationship on Si(100) surfaces. Heteroepitaxial growth starts heterogeneously on inner corners of voids in Si, and is maintained until the nanoparticle fully fills the void. Silver nanoparticles form (111) surfaces at the interfaces with vacuum in partially-filled void-nanoparticles. When the nanoparticle partially fills the void, the shape is primarily bound by (111) surfaces. Small areas bound by (100) Si surfaces have been observed, but when the nanoparticle fully fills the void, the only boundaries are with Si(111) surfaces. The shape of a nanoparticle that fully fills a void is octahedral with aspect ratio near unity bound by (111) surfaces. The "base" of the octahedral nanoparticle is close to (100) plane, and apices are bisected by (110).

Silver atoms occupy tetrahedral interstices in Si unit cell between Si surface, where Ag is originally deposited, and Ag nanoparticles. It is assumed that silicon point defects facilitate Ag diffusion from the surface, but Ag atoms in tetrahedral interstitial positions do not require interaction with Si point defects. Analysis of the amount of relative disorder of Si atoms by RBS channeling shows that one condition, Ag5, has peak relative disorder around 3%. Comparison of the measured relative disorders with the amount of Ag trapped in nanoparticles, in FIG. 10E, reveals that relative disorder and amount of Ag trapped in nanoparticles are not related. FIGS. 50A-50B shows that Ag5 and -1 have lowest relative disorder, around 3% and 6%, respectively, but FIG. 10E shows that Ag5 has almost 7 nm of equivalent thickness of bulk Ag film, the second highest, and Ag1 has one of the lowest amounts of Ag atoms trapped in nanoparticles, 2.5 nm. The two highest values of Si relative disorder in FIGS. 50A-50B are similarly separated in FIG. 10E, where Ag6 and -7 have up to 17% relative Si disorder but Ag6 has almost 10 nm of equivalent thickness of bulk Ag film trapped in nanoparticles, the highest amount measured, to Ag7's 2.5 nm, one of the lowest measured. Clearly, Si interstitial point defects or dislocations are not solely responsible for mediating Ag diffusion. The Si point defect that cannot be measured by RBS channeling, the vacancy, could be the defect that mediates Ag diffusion from surface to voids. Rollert et al suggested that Ag could diffuse by the dissociative mechanism, involving Ag interstitials occupying substitutional lattice sites [60]. The lack of a relationship between Si defects measured by RBS channeling and trapped Ag support diffusion of Ag mediated by the dissociative mechanism.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

[1] M. Alatalo, M. J. Puska, and R. M. Nieminen. First-principles study of He in Si. *Physical Review B*, 46:806-809, 1992.

[2] W. R. Allen. Lattice site of helium implanted in Si and diamond. *MRS Proceedings*, 279:433-438, 1992.

[3] Harry A. Atwater, and Albert Polman. Plasmonics for improved photovoltaic devices. *Nature Materials*, 9(3): 205-213, March 2010.

[4] F. J. Beck, S. Mokkapati, and K. R. Catchpole. Plasmonic light-trapping for si solar cells using self-assembled, ag nanoparticles. *Progress in Photovoltaics: Research and Applications*, 18(7):500-504, 2010.

[5] Mark L. Brongersma, and Vladimir M. Shalaev. The case for plasmonics. *Science*, 328(5977):440-441, 2010.

[6] E. Buehler. 50 *Years Progress in Crystal Growth: A Reprint Collection*, chapter The first Czochralski silicon, pages 105-106. Elsevier, Amsterdam, The Netherlands, 2004.

[7] Quark Y. Chen, and Clayton W. Bates. Geometrical factors in enhanced photoyield from small metal particles. *Phys. Rev. Lett.*, 57:2737-2740, November 1986.

[8] W. K. Chu, J. W. Mayer, and M. A. Nicolet. *Backscattering Spectrometry*. Academic Press, New York, 1978.

[9] F. Corni, G. Calzolari, S. Frabboni, C. Nobili, G. Ottaviani, R. Tonini, G. F. Cerofolini, D. Leone, M. Servidori, R. S. Brusa, G. P. Karwasz, N. Tiengo, and A. Zecca. Helium-implanted silicon: A study of bubble precursors. *Journal of Applied Physics*, 85(3):1401, 1999.

[10] W. Deweerd, T. Barancira, S. Bukshpan, S. Demuynck, G. Langouche, K. Milants, R. Moons, J. Verheyden, and H. Pattyn. Mössbauer study of the proximity gettering of cobalt atoms to He-induced nanosized voids in c-Si. *Physical review. B, Condensed matter*, 53(24):16637-16643, June 1996.

[11] W. Deweerd, R. Moons, K. Milants, J. Verheyden, G. Langouche, and H. Pattyn. Trapping of ion-implanted 57Co to cavities in c-Si: a qualitative study. *Nuclear Instruments and Methods in Physics Research Section B: Beam Interactions with Materials and Atoms*, 127/128: 307-310, 1997.

[12] S. E. Donnelly, V. M. Vishnyakov, R. C. Birchter, and G. Carter. The effects of radiation damage and impurities on void dynamics in silicon. *Nuclear Instruments and Methods in Physics Research Section B: Beam Interactions with Materials and Atoms*, 177:132-139, 2001.

[13] D. J. Eaglesham, V. C. Venezia, H. J. Gossmann, and A. Agarwal. Quantitative TEM of point defects in Si. *Journal of Electron Microscopy*, 49(2):293-8, January 2000.

[14] D. J. Eaglesham, A. E. White, L. C. Feldman, N. Moriya, and D. C. Jacobson. Equilibrium shape of Si. *Phys. Rev. Lett.*, 70(11):1643-1647, 1993.

[15] S. K. Estreicher, J. Weber, A. Derecskei-Kovacs, and D. S. Marynick. Noble gas-related defects in Si and the origin of the 1018 meV photoluminescence line. *Physical Review B*, 55(8):5037-5044, February 1997.

[16] J. H. Evans, A. van Veen, and C. C. Griffioen. The annealing of helium-induced cavities in silicon and the inhibiting role of oxygen. *Nuclear Instruments and Methods in Physics Research Section B: Beam Interactions with Materials and Atoms*, 28:360-363, 1987.

[17] ASTM Standard F-723. Standard practice for conversion between resistivity and dopant density for boron-doped, phosphorus-doped, and arsenic-doped silicon, ASTM International, West Conshohocken, Pa., 1999.

[18] G. Faraci, A. R. Pennisi, and G. Margaritondo. Mechanism of photoelectron yield enhancement from ag clusters. *Phys. Rev. B*, 40:4209-4211, August 1989.

[19] G. Faraci, A. R. Pennisi, V. Privitera, H. Burtscher, and A. Schmidt-Ott. Photoemission from small particles of ag and au. *Phys. Rev. B*, 37:10542-10546, June 1988.

[20] L. Fedina, O. I. Lebedev, G. Van Tendeloo, J. Van Landuyt, O. A. Mironov, and E. H. C. Parker. In situ HREM irradiation study of point-defect clustering in MBE-grown strained $Si_{1-x}Ge_x/(001)Si$ structures. *Phys. Rev. B*, 61(15):10336-10345, April 2000.

[21] L. C. Feldman, J. W. Mayer, and S. T. Picraux. *Materials Analysis by Ion Channeling*. Academic Press, New York, 1982.

[22] P. F. P. Fichtner, J. R. Kaschny, R. A. Yankov, A. Muecklich, U. Kreissig, and W. Skorupa. Overpressurized bubbles versus voids formed in helium implanted and annealed silicon. *Applied Physics Lett.*, 70:732-734, 1997.

[23] D. M. Follstaedt. Relative free energies of si surfaces. *Applied Physics Lett.*, 62(10):1116-1118, 1993.

[24] R. H. Fowler. The analysis of photoelectric sensitivity curves for clean metals at various temperatures. *Phys. Rev.*, 38:45-56, July 1931.

[25] B Fultz and J Howe. *Transmission electron microscopy and diffractometry of materials*. Springer, Heidelberg, 3rd edition, 2009.

[26] P. I. Gaiduk, J. Lundsgaard Hansen, A. Nylandsted Larsen, and E. A. Steinman. Nanovoids in MBE-grown SiGe alloys implanted in situ with $Ge^+$ ions. *Phys. Rev. B*, 67(23):235310, June 2003.

[27] J. F. Gibbons. Ion implantation in semiconductors part II: Damage production and annealing. *Proceedings of the IEEE*, 60(9):1062-1096, September 1972.

[28] C. C. Griffioen, J. H. Evans, P. C. de Jong, and A. van Veen. Helium desorption/permeation from bubbles in silicon: a novel method for void production. *Nuclear Instruments and Methods in Physics Research Section B: Beam Interactions with Materials and Atoms*, 27:417-420, 1987.

[29] A. Haarahiltunen, H. Vainola, O. Anttila, M. Yli-Koski, and J. Sinkkonen. Experimental and theoretical study of heterogeneous iron precipitation in silicon. *Journal of Applied Physics*, 101(4):043507, 2007.

[30] P. B. Hirsch, A. Howie, R. B. Nickolson, D. W. Pashley, and M. J. Phelan. *Electron Microscopy of Thin Crystals*. Plenum Press, New York, N.Y., 1965.

[31] E. Holmstrom, A. Kuronen, and K. Nordlund. Threshold defect production in silicon determined by density functional theory molecular dynamics simulations. *Phys. Rev. B*, 78:045202, July 2008.

[32] S. M. Hu. Nonequilibrium point defects and diffusion in silicon. *Mat. Sci. Engr. Reports*, 13:105-192, 1994.

[33] J. H. Hubbell and S. M. Seltzer. Tables of x-ray mass attenuation coefficients and mass energy-absorption coefficients from 1 key to 20 mev for elements z=1 to 92 and 48 additional substances of dosimetric interest. Technical report, 100 Bureau Dr., M/S 8460 Gaithersburg, Md. 20899, May 2004.

[34] Alexander V. Kildishev, Alexandra Boltasseva, and Vladimir M. Shalaev. Planar photonics with metasurfaces. *Science*, 339(6125), 2013.

[35] A. Kinomura, J. S. Williams, N. Tsubouchi, and Y. Horino. Platinum atom location on the internal walls of nanocavities investigated by ion channeling analysis. *Nuclear Instruments and Methods in Physics Research Section B: Beam Interactions with Materials and Atoms*, 190(1-4):606-610, May 2002.

[36] A. Kinomura, J. S. Williams, J. Wong-Leung, and M. Petravic. Microstructural difference between platinum and silver trapped in hydrogen induced cavities in silicon. *Applied Physics Lett.*, 72(21):2713, 1998.

[37] G. F. Knoll. *Radiation Detection and Measurement*. New York: John Wiley and Sons, Inc., 2000.

[38] R. Kogler, A. Peeva, A. Lebedev, M. Posselt, W. Skorupa, G. Ozelt, H. Hutter, and M. Behar. Cu gettering in ion implanted and annealed silicon in regions before and beyond the mean projected ion range. *Journal of Applied Physics*, 94(6):3834, 2003.

[39] E. Kotai. Computer methods for analysis and simulation of RBS and ERDA spectra. *Nuclear Instruments and Methods in Physics Research Section B: Beam Interactions with Materials and Atoms*, 85(1-4):588-596, 1994.

[40] O. Kurnosikov, H. J. M. Swagten, and B. Koopmans. Internal electron diffraction from atomically ordered subsurface nanostructures in metals. *Phys. Rev. Lett.*, 106: 196803, May 2011.

[41] F. K. LeGoues, M. Liehr, M. Renier, and W. Krakow. Microstructure of epitaxial Ag/Si(111) and Ag/Si(100) interfaces. *Philosophical Magazine B*, 57(2):179, 1988.

[42] B. Q. Li and J. M. Zuo. The development of epitaxy of nanoclusters on lattice-mismatched substrates: Ag on H—Si(111) surfaces. *Surface Science*, 520:7, 2002.

[43] Jens Lindhard, M. Scharff, and H. E. Schiott. Range concepts and heavy ion ranges (notes on atomic collisions, ii). *Mat. Fys. Medd. Dan. Vid. Selsk.*, 33(14), 1963.

[44] N. C. Lindquist, P. Nagpal, K. M. McPeak, D. J. Norris, and S. H. Oh. Engineering metallic nanostructures for plasmonics and photonics. *Rep. Prog. Phys.*, 75:036501, 2012.

[45] J. P. McCaffrey and J. Hulse. Transmitted color and interference fringes for tem sample preparation of silicon. *Micron*, 29:139-144, 1998.

[46] S. M. Myers and D. M. Follstaedt. Forces between cavities and dislocations and their influence on semiconductor microstructures. *Journal of Applied Physics*, 86(6): 3048-3063, 1999.

[47] S. M. Myers, M. Seibt, and W. Schroeter. Mechanisms of transition-metal gettering in silicon. *Journal of Applied Physics*, 88(7):3795, 2000.

[48] S. M. Myers, and G. A. Petersen. Transport and reactions of gold in silicon containing cavities. *Phys. Rev. B*, 57(12):7015, 1998.

[49] Michael Nastasi, Tobias Hochbauer, Jung-Kun Lee, Amit Misra, John P. Hirth, Mark Ridgway, and Tamzin Lafford. Nucleation and growth of platelets in hydrogen-ion-implanted silicon. *Applied Physics Lett.*, 86(15): 154102, 2005.

[50] H. Okamoto and T. B. Massalski. Au-si (gold-silicon). In P. Villars, H. Okamoto, and K. Cenzual, editors, *ASM Alloy Phase Diagrams Center*. ASM International, Materials Park, Ohio, USA, 1990.

[51] R. W. Olesinski, and G. J Abbaschian. Ag-si (silver-silicon). In P. Villars, Okamoto, and K. Cenzual, editors, *ASM Alloy Phase Diagrams Center*. ASM International, Materials Park, Ohio, USA, 2006-2012, 1990.

[52] M. H. F. Overwijk, J. Politiek, R. C. M. de Kruiff, and P. C. Zalm. Proximity gettering of transition metals in silicon by ion implantation. *Nuclear Instruments and Methods in Physics Research Section B: Beam Interactions with Materials and Atoms*, 96:257-260, 1995.

[53] K. H. Park, G. A. Smith, K. Rajan, and G. C. Wang. Interface characterization of epitaxial ag films on si(100) and si(111) grown by molecular beam epitaxy. *Metallurgical Transactions A*, 21:2323-2332, 1990.

[54] G. A. Petersen, S. M. Myers, and D. M. Follstaedt. Gettering of transition metals by cavities in silicon formed by helium ion implantation. *Nuclear Instruments and Methods in Physics Research Section B: Beam Interactions with Materials and Atoms*, 127-128:301-306, May 1997.

[55] W. G. Pfann. 50 *Years Progress in Crystal Growth: A Reprint Collection*, chapter How zone melting was invented, pages 107-108. Elsevier, Amsterdam, The Netherlands, 2004.

[56] S. Pillai, and M. A. Green. Plasmonics for photovoltaic applications. *Solar Energy Materials and Solar Cells*, 94(9):1481-1486, 2010.

[57] V. Raineri, A. Battaglia, and E. Rimini. Gettering of metals by He induced voids in silicon. *Nuclear Instruments and Methods in Physics Research Section B: Beam Interactions with Materials and Atoms*, 96:249-252, 1995.

[58] V. Raineri, S. Coffa, E. Szilágyi, J. Gyulai, and E. Rimini. He-vacancy interactions in Si and their influence on bubble formation and evolution. *Phys. Rev. B*, 61(2): 937-945, January 2000.

[59] Vito Raineri. Gettering by voids in silicon: A comparison with other techniques. *Solid State Phenomena*, 57-58: 43-52, 1997.

[60] F. Rollert, N. A. Stolwijk, and H. Mehrer. Solubility, diffusion and thermodynamic properties of silver in silicon. *J. Phys. D: Appl. Phys.*, 20:1148-1155, 1987.

[61] S. Y. Sayed, F. Wang, M. Malac, A. Meldrum, R. F. Egerton, and J. M. Buriak. Heteroepitaxial growth of gold nanostructures on silicon by galvanic displacement. *ACS Nano*, 3(9):2809, 2009.

[62] Francois Schiettekatte, Carl Wintgens, and Sjoerd Roorda. Influence of curvature on impurity gettering by nanocavities in Si. *Applied Physics Lett.*, 74(13):1857, 1999.

[63] A. Schmidt-Ott, P. Schurtenberger, and H. C. Siegmann. Enormous yield of photoelectrons from small particles. *Phys. Rev. Lett.*, 45:1284-1287, October 1980.

[64] Stephen M. Seltzer. Calculation of photon mass energy-transfer and mass energy-absorption coefficients. *Radiation Research*, 136(2):147-170, 1993.

[65] Lin Shao, and Michael Martin. *Boron: Compound, Production and Application*, chapter Boron Doping in Semiconductor Device Fabrication, pages 473-492. Nova Science Publisher, Inc., Hauppauge, N.Y., 2010.

[66] Yugang Sun, Yang Ren, Yuzi Liu, Jianguo Wen, John S Okasinski, and Dean J Miller. Ambient-stable tetragonal phase in silver nanostructures. *Nat Commun*, 3:971, 2012.

[67] J R Tesmer, and M Nastasi, editors. *Handbook of Modern Ion Beam Materials Analysis*. Materials Research Society, Pittsburgh, Pa., 1995.

[68] R. Tonini, F. Corni, S. Frabboni, G. Ottaviani, and G. F. Cerofolini. High-dose helium-implanted single-crystal silicon: Annealing behavior. *Journal of Applied Physics*, 84(9):4802, 1998.

[69] V. C. Venezia, D. J. Eaglesham, T. E. Haynes, Aditya Agarwal, D. C. Jacobson, H. J. Gossmann, and F. H. Baumann. Depth profiling of vacancy clusters in MeV-implanted Si using Au labeling. *Applied Physics Lett.*, 73(20):2980-2982, 1998.

[70] J. S. Williams, M. J. Conway, J. Wong-Leung, P. N. K. Deenapanray, M. Petravic, R. A. Brown, D. J. Eaglesham, and D. C. Jacobson. The role of oxygen on the stability of gettering of metals to cavities in silicon. *Applied Physics Lett.*, 75(16):2424, 1999.

[71] J. Wong-Leung, C. E. Ascheron, M. Petravic, R. G. Elliman, and J. S. Williams. Gettering of copper to hydrogen-induced cavities in silicon. *Applied Physics Lett.*, 66:1231-1233, 1995.

[72] J. Wong-Leung, J. S. Williams, A. Kinomura, Y. Nakano, Y. Hayashi, and D. J. Eaglesham. Diffusion and transient trapping of metals in silicon. *Phys. Rev. B*, 59:7990-7998, 1999.

[73] J Wong-Leung, and J. S. Williams. Rutherford backscattering and channeling study of Au trapped at cavities in silicon. *Nuclear Instruments and Methods in Physics Research Section B: Beam Interactions with Materials and Atoms,* 118(95):34-38, 1996.

[74] J. Wong-Leung, J. S. Williams, and E. Nygren. Diffusion and trapping of Au to cavities induced by H-implantation in Si. *Nuclear Instruments and Methods in Physics Research Section B: Beam Interactions with Materials and Atoms,* 106(1-4):424-428, December 1995.

[75] L, Zhu, J, Chan, S Mccoy, J, Gelpey, B, Guo, K, Shim, N, David Theodore, M, Martin, J, Carter, and M, Hollander. Defect characterization in boron implanted silicon after flash annealing. *Nuclear Instruments and Methods in Physics Research Section B: Beam Interactions with Materials and Atoms,* 266(10):2479-2482, May 2008.

[76] J. F. Ziegler. SRIM-2003. *Nuclear Instruments and Methods in Physics Research Section B: Beam Interactions with Materials and Atoms,* 219-220:1027-1036, 2004.

[77] A. Zur, and T. C. McGill. Lattice match: An application to heteroepitaxy. *Journal of Applied Physics,* 55:378, 1984.

[78] A. S. Kuznetsov, J. J. Velazquez, V. K. Tikhomirov, J. Mendez-Ramos, and V. V. Moschalkov. Quantum yield of luminescence of Ag nanoclusters dispersed within transparent bulk glass vs. glass composition and temperature, *Applied Physics Lett.,* 101:251106, December 2012.

[79] P. R. West, S. Ishii, G. V. Naik, N. K. Emani, V. M. Shalaev, and A. Boltasseva. Searching for better plasmonic materials, *Laser Phot. Rev.,* 4:795, March 2010.

[80] L. Chen, Y. Zeng, P. Nyugen, and T. L. Alford. Silver diffusion and defect formation in Si(111) substrate at elevated temperature, *Mater. Chem. Phys.,* 76:224, September 2002.

[81] T. C. Nason, G. R. Yang, K. H. Park, and T. M. Lu. Study of silver diffusion into Si(111) and $SiO_2$ at moderate temperatures, *J. Appl. Phys.,* 70:1392, August 1991.

[82] O. Guillat, B. Apter, and U. Efron. Light absorption enhancement in thin silicon film by embedded metallic nanoshells, *Optics Lett.,* 35:1139, April 2010.

What is claimed is:

1. A method for forming metal nanoparticle(s) onto an inner surface of one or more open volume defects within a substrate, the method comprising the steps of:
   providing the substrate having the one or more open volume defects disposed therein;
   depositing an immiscible metal on a surface of the substrate with minimal residual crystalline damage in the substrate; and
   forming the metal nanoparticle(s) by diffusing the immiscible metal from the surface onto the inner surface of each open volume defect using a heat treatment.

2. The method as recited in claim 1, the step of providing the substrate having the one or more open volume defects disposed therein comprising the steps of:
   providing the substrate; and
   creating the one or more open volume defects within the substrate.

3. The method as recited in claim 2, the step of creating the one or more open volume defects within the substrate comprises the step of implanting high-energy ions into the substrate where the one or more open volume defects are to be created.

4. The method as recited in claim 3, wherein the high-energy ions comprise helium or hydrogen ions.

5. The method as recited in claim 3, wherein the high-energy ions comprise helium ions having an energy of approximately 100 keV and a fluence of approximately $1 \times 10^{16}$ cm−2.

6. The method as recited in claim 2, the step of creating the one or more open volume defects within the substrate comprises the step of implanting high-energy ions into the substrate where the one or more open volume defects are to be created during defect annealing.

7. The method as recited in claim 2, further comprising the step of growing the one or more open volume defects by defect annealing.

8. The method as recited in claim 7, the step of growing the one or more open volume defects by defect annealing comprises the step of growing the one or more open volume defects by defect annealing at a temperature of approximately 950° C. for approximately one to two hours.

9. The method as recited in claim 1, wherein the step of depositing an immiscible metal on the surface of the substrate is preformed using a low energy ion implantation process or a physical vapor deposition process.

10. The method as recited in claim 1, wherein:
    the substrate comprises a semiconductor or a metal; and
    the immiscible metal comprises gold, silver, platinum, copper, ruthenium, rhodium, palladium, osmium, iridium, mercury, cobalt or a combination thereof.

11. The method as recited in claim 1, the step of forming the metal nanoparticle(s) by diffusing the immiscible metal from the surface onto the inner surface of each open volume defect using a heat treatment comprising the step forming the metal nanoparticle(s) by diffusing the immiscible metal from the surface onto the inner surface of each open volume defect using a heat treatment at a temperature of at least approximately 750° C. for at least approximately 30 minutes.

12. The method as recited in claim 1, wherein the metal nanoparticle partially fills, substantially fills or completely fills the open volume defect.

13. The method as recited in claim 1, wherein the atomic planes of the metal are substantially parallel to the atomic planes of the substrate.

14. The method as recited in claim 1, wherein the method produces minimal residual crystalline damage in the substrate.

15. A method for forming gold or silver nanoparticle(s) onto an inner surface of one or more open volume defects within a monocrystalline silicon substrate, the method comprising the steps of:
    providing the monocrystalline silicon substrate;
    implanting high-energy ions into the monocrystalline silicon substrate where the one or more open volume defects are to be created;
    growing the one or more open volume defects by defect annealing;
    depositing the gold or silver on the surface of the monocrystalline silicon substrate with minimal residual crystalline damage in the substrate; and
    forming the gold or silver nanoparticle(s) by diffusing the gold or silver from the surface onto the inner surface of each open volume defect using a heat treatment.

16. The method as recited in claim 15, wherein the steps of implanting high-energy ions into the monocrystalline silicon substrate where the one or more open volume defects are to be created and growing the one or more open volume defects by defect annealing are preformed simultaneously.

17. The method as recited in claim 15, wherein the high-energy ions comprise helium or hydrogen ions.

18. The method as recited in claim 15, wherein the high-energy ions comprise helium ions having an energy of approximately 100 keV and a fluence of approximately 1×1016 cm−2.

19. The method as recited in claim 15, the step of growing the one or more open volume defects by defect annealing comprises the step of growing the one or more open volume defects by defect annealing at a temperature of approximately 950° C. for approximately one to two hours.

20. The method as recited in claim 15, wherein the step of depositing the gold or silver on the surface of the monocrystalline silicon substrate is preformed using a low energy ion implantation process or a physical vapor deposition process.

21. The method as recited in claim 15, the step of forming the gold or silver nanoparticle(s) by diffusing the gold or silver from the surface onto the inner surface of each open volume defect using a heat treatment comprising the step forming the gold or silver nanoparticle(s) by diffusing the gold or silver from the surface onto the inner surface of each open volume defect using a heat treatment at a temperature of at least approximately 750° C. for at least approximately 30 minutes.

22. The method as recited in claim 15, wherein the metal nanoparticle partially fills, substantially fills or completely fills the open volume defect.

23. The method as recited in claim 15, wherein the atomic planes of the gold or silver are substantially parallel to the atomic planes of the monocrystalline silicon substrate.

24. The method as recited in claim 15, wherein the method produces minimal residual crystalline damage in the monocrystalline silicon substrate.

25. An apparatus comprising:
a substrate containing a open volume defect and having minimal residual crystalline damage; and
a metal nanoparticle formed of an immiscible metal onto an inner surface of the open volume defect and the atomic planes of the immiscible metal are substantially parallel to the atomic planes of the substrate.

26. The apparatus as recited in claim 25, wherein the metal nanoparticle partially fills, substantially fills or completely fills the open volume defect.

27. The apparatus as recited in claim 25, wherein:
the substrate comprises a semiconductor or a metal; and
the immiscible metal comprises gold, silver, platinum, copper, ruthenium, rhodium, palladium, osmium, iridium, mercury, cobalt or a combination thereof.

28. The apparatus as recited in claim 25, wherein the apparatus comprises a solar cell, an optical switch or a radiation detector.

29. A substrate having at least one open volume defect with a metal nanoparticle formed onto an inner surface of the open volume defect fabricated by a process comprising:
providing the substrate having the at least one open volume defect disposed therein;
depositing an immiscible metal on a surface of the substrate with minimal residual crystalline damage in the substrate; and
forming the metal nanoparticle by diffusing the immiscible metal from the surface onto the inner surface of the open volume defect using a heat treatment.

30. An apparatus fabricated by a process comprising:
providing a substrate having at least one open volume defect disposed therein;
depositing an immiscible metal on a surface of the substrate with minimal residual crystalline damage in the substrate; and
forming a metal nanoparticle by diffusing the immiscible metal from the surface onto an inner surface of the open volume defect using a heat treatment.

31. The apparatus as recited in claim 30, wherein the apparatus comprises a solar cell, an optical switch or a radiation detector.

* * * * *